(12) United States Patent
Seki et al.

(10) Patent No.: US 8,541,778 B2
(45) Date of Patent: Sep. 24, 2013

(54) DIFFRACTION GRATING, ORGANIC EL ELEMENT USING THE SAME, AND MANUFACTURING METHODS THEREOF

(75) Inventors: Takashi Seki, Yokohama (JP); Suzushi Nishimura, Yokohama (JP); Maki Fukuda, Yokohama (JP); Madoka Fukushima, Yokohama (JP); Satoshi Masuyama, Yokohama (JP); Soon Moon Jeong, Yokohama (JP); Hideo Takezoe, Tokyo (JP); Won Hoe Koo, Tokyo (JP)

(73) Assignee: JX Nippon Oil & Energy Corporation, Tokyo (JP)

( * ) Notice: Subject to any disclaimer, the term of this patent is extended or adjusted under 35 U.S.C. 154(b) by 0 days.

(21) Appl. No.: 13/384,551

(22) PCT Filed: Jul. 16, 2010

(86) PCT No.: PCT/JP2010/062110
§ 371 (c)(1),
(2), (4) Date: Feb. 15, 2012

(87) PCT Pub. No.: WO2011/007878
PCT Pub. Date: Jan. 20, 2011

(65) Prior Publication Data
US 2012/0132897 A1    May 31, 2012

(30) Foreign Application Priority Data

Jul. 16, 2009  (JP) ................................. 2009-168056
Aug. 31, 2009  (JP) ................................. 2009-200436
Dec. 28, 2009  (JP) ................................. 2009-297868

(51) Int. Cl.
*H01L 51/52*    (2006.01)

(52) U.S. Cl.
USPC ......................................................... 257/40

(58) Field of Classification Search
USPC .............. 257/E51.018, 40, E51.001; 438/32; 427/164
See application file for complete search history.

(56) References Cited

U.S. PATENT DOCUMENTS

| 8,026,021 B2 * | 9/2011 | Stumpe et al. ................... 430/1 |
| 2003/0180563 A1 * | 9/2003 | Ukuda et al. .................. 428/515 |
| 2009/0236962 A1 * | 9/2009 | Fujimoto et al. .............. 313/348 |

FOREIGN PATENT DOCUMENTS

| CN | 1440869 A | 9/2003 |
| EP | 1094103 A1 | 4/2001 |

(Continued)

OTHER PUBLICATIONS

International Search Report dated Oct. 26, 2010, corresponding with International Application PCT/JP2010/062110.

*Primary Examiner* — Thao P. Le
(74) *Attorney, Agent, or Firm* — Fitch, Even, Tabin & Flannery, LLP

(57) ABSTRACT

A diffraction grating having a transparent supporting substrate; and a cured resin layer which is stacked on the transparent supporting substrate and which has concavities and convexities formed on a surface thereof, wherein when a Fourier-transformed image is obtained by performing two-dimensional fast Fourier transform processing on a concavity and convexity analysis image obtained by analyzing a shape of the concavities and convexities formed on the surface of the cured resin layer by use of an atomic force microscope, the Fourier-transformed image shows a circular or annular pattern substantially centered at an origin at which an absolute value of wavenumber is 0 $\mu m^{-1}$, and the circular or annular pattern is present within a region where an absolute value of wavenumber is within a range of 10 $\mu m^{-1}$ or less.

18 Claims, 51 Drawing Sheets

(56) References Cited

FOREIGN PATENT DOCUMENTS

| EP | 1342557 A1 | 9/2003 |
| JP | 2004-126499 A | 4/2004 |
| JP | 2005-007244 A | 1/2005 |
| JP | 2006-093019 A | 4/2006 |
| JP | 2009-009861 A | 1/2009 |
| KR | 2003-0071565 A | 9/2003 |

* cited by examiner

3μm

SHORTEST DISTANCE  nm

SHORTEST DISTANCE nm

SHORTEST DISTANCE  nm

DIFFRACTION GRATING, ORGANIC EL ELEMENT USING THE SAME, AND MANUFACTURING METHODS THEREOF

CROSS-REFERENCE TO RELATED APPLICATIONS

This is a U.S. National Phase of International Application PCT/JP2010/062110, filed Jul. 16, 2010, and claims the benefit of foreign priority from Japanese Patent Application 2009-168056, filed Jul. 16, 2009; Japanese Patent Application 2009-200436, filed Aug. 31, 2009; and Japanese Patent Application 2009-297868, filed Dec. 28, 2009, the entire disclosures of which applications are hereby incorporated herein by reference.

TECHNICAL FIELD

The present invention relates to a diffraction grating, an organic EL element using the same, and manufacturing methods thereof.

BACKGROUND ART

Organic electroluminescence elements (organic EL elements) have been used as self-luminous elements for image display devices, such displays, and for surface light sources. Such an organic EL element (organic light-emitting diode (OLED)) is generally prepared by stacking a transparent electrode serving as an anode, an organic layer, and a metal electrode serving as a cathode in this order on a transparent supporting substrate such as a glass substrate or a transparent plastic film. Thus, upon application of a voltage between the transparent electrode and the metal electrode, electron supplied from the cathode and holes supplied from the anode are recombined at the organic layer. Then, when an exciton generated by the recombination changes from an excited state to a ground state, EL emission occurs. Light of the EL emission goes through the transparent electrode, and then is extracted to the outside on the transparent supporting substrate side.

However, such an organic EL element has a problem that light generated at the organic layer cannot be extracted to the outside sufficiently. Specifically, there is a problem that a large proportion of light generated at the organic layer disappears as heat during repartition of multiple reflection in the element, or propagates inside the element and exits from end portions of the element, so that a sufficient external extraction efficiency cannot be achieved. To solve these problems, for example, Japanese Unexamined Patent Application Publication No. 2009-9861 (Patent Literature 1) discloses an organic EL element having a corrugated structure, the organic EL element comprising: a transparent supporting substrate; a cured resin layer which is stacked on the transparent supporting substrate and which has concavities and convexities formed on a surface thereof in a periodic arrangement; and a transparent electrode, an organic layer, and a metal electrode which are stacked in this order on the cured resin layer and formed into such shapes that a shape of the concavities and convexities formed on the surface of the cured resin layer is maintained.

CITATION LIST

Patent Literature

[PTL 1] Japanese Unexamined Patent Application Publication No. 2009-9861

SUMMARY OF INVENTION

Although having been improved in terms of the problem of the external extraction efficiency, the organic EL element as described in Patent Literature 1 still has problems that white light emission is difficult because of its high wavelength-dependence of light emission, and that the directivity of light emission (a characteristic of emitting light strongly in a certain direction) is high. Hence, the performances of the organic EL element are not necessarily sufficient. Note that the present inventors presume that the organic EL element as described in Patent Literature 1 has a high wavelength-dependence and a high directivity of light emission, because of high periodicity in arrangement of the concavities and convexities (diffraction grating) formed on the surface of the cured resin layer stacked on the transparent supporting substrate.

The present invention has been made in view of the above-described problems of the conventional technologies, and an object of the present invention is to provide a method for manufacturing a diffraction grating, the method being capable of manufacturing a diffraction grating having a sufficiently low wavelength-dependence and a sufficiently low directivity, and also to provide a method for manufacturing an organic EL element using the method for manufacturing a diffraction grating.

The present inventors have conducted earnest study to achieve the above object. As a result, the present inventors have found the following fact. Specifically, in a diffraction grating comprising a transparent supporting substrate, and a cured resin layer which is stacked on the transparent supporting substrate and which has concavities and convexities formed on a surface thereof, a shape of the concavities and convexities is formed on the surface of the cured resin layer under a condition that a Fourier-transformed image obtained by performing two-dimensional fast Fourier transform processing on a concavity and convexity analysis image obtained by analyzing the shape of the concavities and convexities on the surface shows an annular pattern. In such a case, a diffraction grating having a sufficiently low wavelength-dependence and a sufficiently low directivity can be obtained. This finding has led to the completion of the present invention.

Specifically, a diffraction grating of the present invention is a diffraction grating comprising:
a transparent supporting substrate; and
a cured resin layer which is stacked on the transparent supporting substrate and which has concavities and convexities formed on a surface thereof, wherein
when a Fourier-transformed image is obtained by performing two-dimensional fast Fourier transform processing on a concavity and convexity analysis image obtained by analyzing a shape of the concavities and convexities formed on the surface of the cured resin layer by use of an atomic force microscope, the Fourier-transformed image shows a circular or annular pattern substantially centered at an origin at which an absolute value of wavenumber is $0\ \mu m^{-1}$, and the circular or annular pattern is present within a region where an absolute value of wavenumber is within a range of $10\ \mu m^{-1}$ or less.

Meanwhile, an organic EL element of the present invention is an organic EL element comprising:
a transparent supporting substrate;
a cured resin layer which is stacked on the transparent supporting substrate and which has concavities and convexities formed on a surface thereof; and
a transparent electrode, an organic layer, and a metal electrode, which are stacked in this order on the cured resin layer and formed into such shapes that a shape of the concavities and convexities formed on the surface of the cured resin layer is maintained, wherein a constituent portion formed by the transparent supporting substrate and the cured resin layer in the organic EL element comprises the above-described diffraction grating of the present invention. Specifically, the organic EL element of the present invention is an organic EL element comprising:

a transparent supporting substrate;

a cured resin layer which is stacked on the transparent supporting substrate and which has concavities and convexities formed on a surface thereof; and a transparent electrode, an organic layer, and a metal electrode, which are stacked in this order on the cured resin layer and formed into such shapes that a shape of the concavities and convexities formed on the surface of the cured resin layer is maintained, wherein when a Fourier-transformed image is obtained by performing two-dimensional fast Fourier transform processing on a concavity and convexity analysis image obtained by analyzing a shape of the concavities and convexities formed on the surface of the cured resin layer by use of an atomic force microscope, the Fourier-transformed image shows a circular or annular pattern substantially centered at an origin at which an absolute value of wavenumber is 0 $\mu m^{-1}$, and the circular or annular pattern is present within a region where an absolute value of wavenumber is within a range of 10 $\mu m^{-1}$ or less.

In the diffraction grating and the organic EL element of the present invention, the pattern is preferably an annular pattern, and the annular pattern is preferably present within a region where the absolute value of wavenumber is within a range from 1.25 to 5 $\mu m^{-1}$.

Moreover, in the diffraction grating and the organic EL element of the present invention, an average height of the concavities and convexities formed on the surface of the cured resin layer is preferably within a range from 20 to 200 nm.

Moreover, in the diffraction grating and the organic EL element of the present invention, an average pitch of the concavities and convexities formed on the surface of the cured resin layer is preferably within a range from 100 to 600 nm.

Furthermore, in the diffraction grating and the organic EL element of the present invention, an average value and a median of a depth distribution of the concavities and convexities formed on the surface of the cured resin layer preferably satisfy a condition represented by the following inequality (1):

$$0.95 \times Y \leq M \leq 1.05 \times Y \quad (1)$$

[in the inequality (1), Y represents a value obtained by calculation according to a formula: Y=1.062 m−2.2533 (in the formula, m represents the average value of the depth distribution of the concavities and convexities), and M represents the median of the depth distribution of the concavities and convexities].

In addition, in the diffraction grating and the organic EL element of the present invention, a kurtosis of the concavities and convexities formed on the surface of the cured resin layer preferably has a value of −1.2 or greater, and more preferably a value within a range from −1.2 to 1.2.

A method for manufacturing a diffraction grating of the present invention is a method for manufacturing a diffraction grating, comprising:

a step of applying a curable resin onto a transparent supporting substrate, then curing the curable resin with a master block being pressed thereto, and thereafter detaching the master block, thereby stacking, on the transparent supporting substrate, a cured resin layer having concavities and convexities formed thereon, wherein the master block is obtained by any of the following methods (A) and (B) for manufacturing a master block:

[the method (A) for manufacturing a master block]

a method comprising the steps of:

applying a block copolymer solution comprising a block copolymer and a solvent onto a base member, the block copolymer having a first polymer segment made of a first homopolymer and a second polymer segment made of a second homopolymer having a solubility parameter which is higher than a solubility parameter of the first homopolymer by 0.1 to 10 $(cal/cm^3)^{1/2}$, and satisfying all the following conditions (i) to (iii):

(i) a number average molecular weight is 500000 or more, (ii) a molecular weight distribution (Mw/Mn) is 1.5 or less, and (iii) a volume ratio between the first polymer segment and the second polymer segment (the first polymer segment: the second polymer segment) is 3:7 to 7:3; and forming a micro phase separation structure of the block copolymer by drying a coating film on the base member, thereby obtaining a first master block having concavities and convexities formed on a surface thereof;

[the method (B) for manufacturing a master block]

a method comprising the steps of:

forming a vapor-deposition film under a temperature condition of 70° C. or above on a surface of a polymer film made of a polymer whose volume changes by heat, and then cooling the polymer film and the vapor-deposition film, thereby forming concavities and convexities of wrinkles on a surface of the vapor-deposition film; and attaching a master block material onto the vapor-deposition film, then curing the master block material, and thereafter detaching the cured master block material from the vapor-deposition film, thereby obtaining a master block.

Meanwhile, a method for manufacturing an organic EL element of the present invention is a method for manufacturing an organic EL element, the organic EL element comprising a transparent supporting substrate, a transparent electrode, an organic layer, and a metal electrode, the method comprising:

a diffraction grating formation step comprising a step of applying a curable resin onto a transparent supporting substrate, then curing the curable resin with a master block being pressed thereto, and thereafter detaching the master block, thereby stacking, on the transparent supporting substrate, a cured resin layer having concavities and convexities formed thereon; and a step of stacking, on the cured resin layer, each of the transparent electrode, the organic layer, and the metal electrode formed into such a shape that a shape of the concavities and convexities formed on the surface of the cured resin layer is maintained, thereby obtaining an organic EL element, wherein the diffraction grating formation step is the above-described method for manufacturing a diffraction grating of the present invention.

As described above, in the method for manufacturing an organic EL element of the present invention, the master block used in the diffraction grating formation step is obtained by any of the above-described methods (A) and (B) for manufacturing a master block.

In addition, in the method for manufacturing a diffraction grating and the method for manufacturing an organic EL element of the present invention, the dried coating film is preferably heated at a temperature higher than a glass transition temperature of the block copolymer in the step of obtaining the first master block in the method (A) for manufacturing a master block.

Moreover, in the method for manufacturing a diffraction grating and the method for manufacturing an organic EL element of the present invention, the dried coating film is preferably subjected to an etching treatment in the step of obtaining the first master block in the method (A) for manufacturing a master block.

Furthermore, in the method for manufacturing a diffraction grating and the method for manufacturing an organic EL element of the present invention, the method (A) for manufacturing a master block preferably further comprises a step of attaching a transfer material onto the first master block, then curing the transfer material, and thereafter detaching the transfer material from the first master block, thereby obtaining a second master block having concavities and convexities formed on a surface thereof.

In addition, in the method for manufacturing a diffraction grating and the method for manufacturing an organic EL element of the present invention, a combination of the first homopolymer and the second homopolymer in the block copolymer used in the method (A) for manufacturing a master block is preferably any of a combination of a styrene-based polymer and a polyalkyl methacrylate, a combination of a styrene-based polymer and polyethylene oxide, a combination of a styrene-based polymer and polyisoprene, and a combination of a styrene-based polymer and polybutadiene.

Furthermore, in the method for manufacturing a diffraction grating and the method for manufacturing an organic EL element of the present invention, the block copolymer solution used in the method (A) for manufacturing a master block preferably further comprises a different homopolymer from the first homopolymer and the second homopolymer in the block copolymer. In this case, it is more preferable that the combination of the first homopolymer and the second homopolymer in the block copolymer be a combination of polystyrene and polymethyl methacrylate, and the different homopolymer be a polyalkylene oxide.

In addition, in the method for manufacturing a diffraction grating and the method for manufacturing an organic EL element of the present invention, the polymer whose volume changes by heat used in the method (B) for manufacturing a master block is preferably a silicone-based polymer.

Furthermore, in the method for manufacturing a diffraction grating and the method for manufacturing an organic EL element of the present invention, an average pitch of the concavities and convexities formed on the surface of the cured resin layer is preferably within a range from 100 to 600 nm.

According to the present invention, it is possible to provide a diffraction grating having a sufficiently low wavelength-dependence and a sufficiently low directivity, an organic EL element using the diffraction grating, and methods for manufacturing the diffraction grating and the organic EL element.

DESCRIPTION OF EMBODIMENTS

Figure 1:
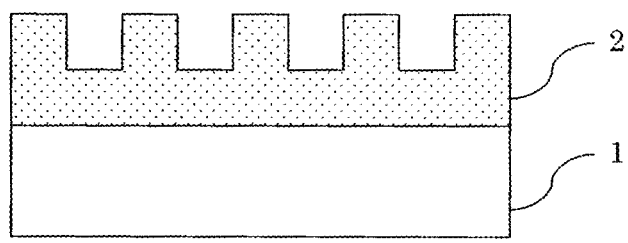
FIG. 1 is a schematic lateral cross-sectional view showing a preferred embodiment of a diffraction grating of the present invention.

Hereinafter, preferred embodiments of the present invention will be described in detail with reference to the drawings. Note that, in the following description and drawings, the same or corresponding components are denoted by the same reference numerals, and overlapping description thereof is omitted.

(Diffraction Grating)

First, a diffraction grating of the present invention will be described. The diffraction grating of the present invention is a diffraction grating comprising:

a transparent supporting substrate; and a cured resin layer which is stacked on the transparent supporting substrate and which has concavities and convexities formed on a surface thereof, wherein when a Fourier-transformed image is obtained by performing two-dimensional fast Fourier transform processing on a concavity and convexity analysis image obtained by analyzing a shape of the concavities and convexities formed on the surface of the cured resin layer by use of an atomic force microscope, the Fourier-transformed image shows a circular or annular pattern substantially centered at an origin at which an absolute value of wavenumber is 0 $\mu m^{-1}$, and the circular or annular pattern is present within a region where an absolute value of wavenumber is within a range of 10 $\mu m^{-1}$ or less.

FIG. 1 is a cross-sectional view schematically showing a preferred embodiment of the diffraction grating of the present invention. The diffraction grating shown in FIG. 1 comprises a transparent supporting substrate 1, and a cured resin layer 2 which is stacked on the transparent supporting substrate 1 and which has concavities and convexities formed on a surface thereof.

Examples of the transparent supporting substrate 1 include base members made of a transparent inorganic substance such as glass; base members made of a resin such as polyethylene terephthalate (PET), polyethylene terenaphthalate (PEN), polycarbonate (PC), cycloolefin polymer (COP), polymethyl methacrylate (PMMA), or polystyrene (PS); stacked base members having a gas barrier layer made of an inorganic substance such as SiN, $SiO_2$, SiC, $SiO_xN_y$, $TiO_2$, or $Al_2O_3$ formed on a surface of a base member made of any of the above-described resins; and stacked base members having base members made of any of the above-described resins and gas barrier layers made of any of the above-described inorganic substances stacked alternately on each other. In addition, the thickness of the transparent supporting substrate 1 is preferably within a range from 1 to 500 μm.

Examples of a curable resin for forming the cured resin layer 2 include epoxy resins, acrylic resins, urethane resins, melamine resins, urea resins, polyester resins, phenol resins, and cross-linking type liquid crystal resins. In addition, the thickness of the cured resin layer 2 is preferably within a range from 0.5 to 500 μm. If the thickness is less than the lower limit, heights of the concavities and convexities formed on the surface of the cured resin layer tend to be insufficient. Meanwhile, if the thickness exceeds the upper limit, an effect of volume change of the resin which occurs during upon curing tends to be so large that the formation of the shape of the concavities and convexities tends to be poor.

In the diffraction grating of the present invention, when a Fourier-transformed image is obtained by performing two-dimensional fast Fourier transform processing on a concavity and convexity analysis image obtained by analyzing a shape of the concavities and convexities formed on the surface of the cured resin layer by use of an atomic force microscope, the Fourier-transformed image needs to show a circular or annular pattern substantially centered at an origin at which an absolute value of wavenumber is 0 $\mu m^{-1}$, and the circular or annular pattern needs to be present within a region where an absolute value of wavenumber is within a range of 10 $\mu m^{-1}$ or less. By forming the shape of the concavities and convexities on the surface of the cured resin layer under the condition that the Fourier-transformed image can satisfy the above-described requirements, a diffraction grating having a sufficiently low wavelength-dependence and a sufficiently low directivity can be obtained.

In addition, the pattern of the Fourier-transformed image is more preferably annular, from the viewpoint that more advanced effects on wavelength-dependence and directivity can be obtained. In addition, similarly from the viewpoint that more advanced effects on wavelength-dependence and directivity can be obtained, the circular or annular pattern of the Fourier-transformed image is preferably present within a region where an absolute value of wavenumber is within a range from 1.25 to 10 $\mu m^{-1}$ (further preferably from 1.25 to 5 $\mu m^{-1}$). Such a diffraction grating of the present invention can be used not only as an optical element placed on the light extraction port side of an organic EL element, but also, for example, as an optical element for providing a light confinement effect in a solar cell by being placed on the photoelectric conversion surface side of a solar cell.

In addition, "the circular or annular pattern of the Fourier-transformed image" herein is a pattern observed when bright spots in a Fourier-transformed image gather. Hence, the term "circular" herein means that the pattern of the gathering of the bright spots looks like a substantially circular shape, and is a concept also including a case where part of a contour looks like a convex shape or a concave shape. Meanwhile, the term "annular" means that the pattern of the gathering of the bright spots looks like a substantially annular shape, and is a concept also including a case where a shape of an outer circle or inner circle of the ring looks like a substantially circular shape and further including a case where a part of the contours of the outer circle and/or the inner circle of the ring looks like a convex shape or a concave shape. Meanwhile, the phrase "the circular or annular pattern is present within a region where an absolute value of wavenumber is within a range of 10 $\mu m^{-1}$ or less (more preferably from 1.25 to 10 $\mu m^{-1}$, further preferably from 1.25 to 5 $\mu m^{-1}$)" means that 30% or more (more preferably 50% or more, further more preferably 80% or more, and particularly preferably 90% or more) of bright spots forming the Fourier-transformed image are present within a region where an absolute value of wavenumber is within a range of 10 $\mu m^{-1}$ or less (more preferably from 1.25 to 10 $\mu m^{-1}$, and further preferably from 1.25 to 5 $\mu m^{-1}$). Such a shape of the concavities and convexities on the surface of the cured resin layer can be formed efficiently by employing a method using a master block according to the present invention to be described later.

The Fourier-transformed image can be obtained by analyzing the shape of the concavities and convexities formed on the surface of the cured resin layer by use of an atomic force microscope, thereby obtaining a concavity and convexity analysis image, and then performing two-dimensional fast Fourier transform processing on the concavity and convexity analysis image.

The concavity and convexity analysis image can be obtained by analysis using an atomic force microscope under the following analysis conditions:
Measurement mode: cantilever intermittent contact mode,
Material of cantilever: silicon,
Lever width of cantilever: 40 µm, and
Diameter of tip of cantilever chip: 10 nm.

As the atomic force microscope, commercially available ones can be used as appropriate. For example, a scanning probe microscope equipped with an environment control unit "Nanonavi II Station/E-sweep" manufactured by SII Nano-Technology Inc. can be used. In addition, it is preferable to employ a cantilever intermittent contact mode as the measurement mode of the atomic force microscope. In this respect, when the scanning probe microscope equipped with an environment control unit manufactured by SII NanoTechnology Inc. is used, the dynamic force mode (the DMF mode) can be used. Moreover, as the cantilever, one whose material is silicon, lever width is 40 µm, and diameter of a tip of a cantilever chip is 10 nm is preferably used, and SI-DF40 can be used, for example. In addition, when the analysis is conducted by use of the above-described atomic force microscope, it is preferable to observe the shape of the concavities and convexities formed on the surface of the cured resin layer in the air and at a temperature of 25° C.

The two-dimensional fast Fourier transform processing on the concavity and convexity analysis image can be easily performed by electronic image processing using a computer equipped with software for two-dimensional fast Fourier trans form processing. In the two-dimensional fast Fourier transform processing, a flattening process including primary inclination correction is preferably performed on the concavity and convexity analysis image. Note that a concavity and convexity analysis image displaying an area of 3 µm square (length: 3 µm, width: 3 µm) can be used as the concavity and convexity analysis image on which the two-dimensional fast Fourier transform processing is performed.

In addition, in the diffraction grating of the present invention, an average height of the concavities and convexities formed on the surface of the cured resin layer 2 is preferably within a range from 5 to 200 nm, more preferably within a range from 20 to 200 nm, and further preferably within a range from 50 to 150 nm. If the average height of the concavities and convexities is less than the lower limit, the height is so small relative to the wavelengths of the visible light that necessary diffraction tends not to occur. Meanwhile, suppose a case where the average height exceeds the upper limit. In such a case, when the obtained diffraction grating is used as an optical element on the light extraction port side of an organic EL element, not only destruction and life-shortening of the element tend to occur because of heat generation which occurs when the electric field distribution in the EL layer becomes nonuniform, and hence electric fields concentrate on a certain position, but also duplication of the shape of the concavities and convexities by nanoimprinting tends to be difficult. Note that, the average height of the concavities and convexities refers to an average value of heights of concavities and convexities, the heights of concavities and convexities being obtained when the heights of concavities and convexities (distances between concave portions and convex portions in the depth direction) on the surface of the cured resin layer are measured. In addition, a value calculated as follows is employed as the average value of the heights of the concavities and convexities. Specifically, a concavity and convexity analysis image is obtained by measuring the shape of the concavities and convexities on the surface in a randomly selected measuring region (preferably a randomly selected measuring region of 3 µm square) by use of a scanning probe microscope (for example, one manufactured by SII NanoTechnology Inc., under the product name of "E-sweep", or the like), then distances between randomly selected concave portions and convex portions in the depth direction are measured at 100 points or more in the concavity and convexity analysis image, and the average of the distances is determined. Moreover, the heights (depths) of the concavities and convexities can easily achieved by use of a master block according to the present invention to be described later.

An average pitch of the concavities and convexities formed on the surface of the cured resin layer 2 is preferably within a range from 100 to 600 nm, and is more preferably within a range from 200 to 600 nm. If the average pitch of the concavities and convexities is less than the lower limit, the pitch is so small relative to relative to wavelengths of the visible light that necessary diffraction tends not to occur. Meanwhile, if the average pitch exceeds the upper limit, the diffraction angle becomes so small that the functions as a diffraction grating tend to be lost. Note that the average pitch of the concavities and convexities refers to an average value of pitches of the concavities and convexities obtained when pitches of the concavities and convexities on the surface of the cured resin layer (distances between adjacent convex portions or between adjacent concave portions) are measured. In addition, a value which can be calculated as follows is employed as the average value of pitches of the concavities and convexities. Specifically, a concavity and convexity analysis image is obtained by analyzing the concavities and convexities on the surface by using a scanning probe microscope (for example, one manufactured by SII NanoTechnology Inc., under the product name of "E-sweep", or the like) under the above-described analysis conditions, then the distances between randomly selected adjacent convex portions or between randomly selected adjacent concave portions are measured at 100 points or more in the concavity and convexity analysis image, and then an average of these distances is determined. Moreover, the pitches of the concavities and convexities can easily achieved by use of a master block according to the present invention to be described later.

In addition, in the cured resin layer 2, an average value and a median of a depth distribution of the concavities and convexities formed on the surface thereof preferably satisfy a condition represented by the following inequality (1):

$$0.95 \times Y \leq M \leq 1.05 \times Y \quad (1)$$

[in the inequality (1), Y represents a value obtained by calculation according to a formula: Y=1.062 m−2.2533 (in the formula, m represents the average value of the depth distribution of the concavities and convexities), and M represents the median of the depth distribution of the concavities and convexities]. When the median (M) and the average value (m) satisfy the above-described condition, generation of leakage current can be suppressed sufficiently in the use for an organic EL element or the like. For this reason, a diffraction grating comprising the cured resin layer 2 whose median (M) and average value (m) satisfy the above-described condition can be used more suitably for an organic EL element.

The following method is employed as a method for measuring the median (M) of the depth distribution and the average value (m) of the depth distribution. Specifically, first, a concavity and convexity analysis image of the shape of the concavities and convexities on the surface of the cured resin layer 2 is obtained by use of a scanning probe microscope (for example, one manufactured by SII NanoTechnology Inc., under the product name of "E-sweep", or the like). In analyzing the concavities and convexities, a concavity and convexity analysis image is obtained by measurement in a randomly selected measuring region of 3 μm square (length: 3 μm, width: 3 μm) under the aforementioned analysis conditions. Here, data of each of the heights of the concavities and convexities are determined at 16384 (128 columns×128 rows) or more measuring points in the measuring region on the nanometer scale. Note that, although the number of measuring points varies depending on the kind and settings of the measuring apparatus used, a measurement at 65536 points (256 columns×256 rows) (a measurement with a resolution of 256 pixels×256 pixels) can be conducted in a measuring region of 3 μm square, for example, when the above-described measuring apparatus manufactured by SII NanoTechnology Inc., under the product name of "E-sweep" is used. Then, regarding the thus measured heights (unit: nm) of the concavities and convexities, first, of all the measuring points, a measuring point P is determined which has the largest height from the surface of the transparent supporting substrate 1. Then, while a plane which includes the measuring point P and is parallel to the surface of the transparent supporting substrate 1 is taken as a reference plane (horizontal plane), values of depths from the reference plane (the differences each obtained by subtracting the height from the transparent supporting substrate 1 at one of the measuring points from the value of the height from the transparent supporting substrate 1 at the measuring point P) are determined as concavity and convexity depth data. Note that some of measuring apparatuses (for example, one manufactured by SII NanoTechnology Inc., under the product name of "E-sweep") are capable of determining the concavity and convexity depth data by automatic calculation with software provided in the measuring apparatuses. The values determined by automatic calculation can be used as the concavity and convexity depth data. After the concavity and convexity depth data are determined at each measuring point as described above, the average value (m) of the depth distribution of the concavities and convexities can be determined by calculation according to the following formula (I):

[Math. 1]

$$m = \frac{1}{N}\sum_{i=1}^{N} x_i \qquad (I)$$

[in the formula (I), N represents a total number of measuring points (the number of all the pixels), i represents any integer of 1 to N, $x_i$ represents the concavity and convexity depth data at the i-th measuring point, and m represents the average value of the depth distribution of the concavities and convexities].

Meanwhile, the median (M) of the depth distribution of the concavities and convexities can be determined as follows. Specifically, the concavity and convexity depth data $x_i$ at all the 1- to N-th measuring points are rearranged in ascending order, and expressed as $x_{(i)}$ (in this case, the order of the heights is as follows: $x_{(1)} < x_{(2)} < x_{(3)} < \ldots < x_{(N)}$). Then, the median (M) can be determined by calculation according to one of the following formulae (II) depending on whether N is an odd number or an even number:

[Math. 2]

$$\left.\begin{array}{l}\text{(when } N \text{ is an odd number)}\\ M = x_{((N+1)/2)} \\ \text{(when } N \text{ is an even number)} \\ M = \dfrac{x_{(N/2)} + x_{((N/2)+1)}}{2}\end{array}\right\} \qquad (II)$$

[in the formula (II), N represents the total number of measuring points (the number of all the pixels), and M represents the median of the depth distribution of the concavities and convexities].

In addition, the cured resin layer 2 is preferably one having an average value (m) of the depth distribution of 15 to 200 nm, and preferably 20 to 100 nm. If the average value (m) of the depth distribution is less than 15 nm, the depths of the concavities and convexities are so shallow that a sufficient diffraction effect cannot be obtained, leading to a tendency that the light emission efficiency is difficult to improve sufficiently. Meanwhile, if the average value (m) of the depth distribution is greater than 200 nm, the aspect ratio of the concavities and convexities is too large. Hence, in the use for an organic EL element, not only cracks are easily formed in an electrode, but also a leakage current is more easily generated during use, so that a case where the light emission efficiency decreases, or a case where light emission does not occur at all is caused, and the life of the organic EL element tends to be shortened.

Moreover, in the diffraction grating of the present invention, a kurtosis of the concavities and convexities formed on the surface of the cured resin layer 2 is preferably −1.2 or more, more preferably −1.2 to 1.2, further preferably −1.2 to 1, and particularly preferably −1.1 to 0.0. If the kurtosis is less than the lower limit, it tends to be difficult to sufficiently suppress the generation of a leakage current in the use for an organic EL element. Meanwhile, if the kurtosis exceeds the upper limit, almost no concavities and convexities exist in a sectional shape of the cured resin layer 2, resulting in a state where sparse projections or dents exist. Hence, not only the light-extraction efficiency, which is an advantage of the concavity and convexity structure, cannot be improved sufficiently (the diffraction effect cannot be obtained sufficiently), but also the electric field is more likely to be concentrated on the portions of the projections, so that leakage currents tend to be generated.

As a method for measuring the kurtosis, the following method is employed. Specifically, first, as in the case with the above-described method for measuring the median (M) of the depth distribution and the average value (m) of the depth distribution, concavity and convexity depth data are determined at 16384 (128 columns×128 rows) or more measuring points (65536 points in a case where, for example, an apparatus manufactured by SII NanoTechnology Inc., under the product name of "E-sweep" is used as the measuring apparatus) in a measuring region of 3 μm square. Then, the average value (m) of the depth distribution of the concavities and convexities and the standard deviation (σ) of the depth distribution of the concavities and convexities are calculated on the basis of the concavity and convexity depth data for the measuring points. Note that, the average value (m) can be determined by calculation according to the above-described formula (I) as described above. Meanwhile, the standard deviation (σ) of the depth distribution can be determined by calculation according to the following formula (III):

[Math. 3]

$$\sigma = \sqrt{\frac{1}{N}\sum_{i=1}^{N}(x_i - m)^2} \quad \text{(III)}$$

[in the formula (III), N represents a total number of measuring points (the number of all the pixels), $x_i$ represents the concavity and convexity depth data at the i-th measuring point, and m represents the average value of the depth distribution of the concavities and convexities].

Subsequently, on the basis of the thus determined values of the average value (m) and the standard deviation (σ), the kurtosis (k) can be determined by calculation according to the following formula (IV):

[Math. 4]

$$k = \frac{\frac{1}{N}\sum_{i=1}^{N}(x_i - m)^4}{\sigma^4} - 3 \quad \text{(IV)}$$

[in formula (IV), N represents the total number of measuring points (the number of all the pixels), $x_i$ represents the concavity and convexity depth data at the i-th measuring point, m represents the average value of the depth distribution of the concavities and convexities, and σ represents a value of the standard deviation].

Note that, it is not exactly clear why generation of a leakage current can be suppressed at a sufficiently high level, when the average value (m) and the median (M) of the depth distribution in the cured resin layer 2 satisfy the condition represented by the inequality (1), or when the kurtosis (k) satisfies a condition of being −1.2 or more. However, the present inventors speculate as follows. Specifically, first, when the concavity and convexity structure is such that the average value (m) and the median (M) of the depth distribution satisfy the condition represented by the inequality (1), or such that the kurtosis (k) is −1.2 or more, no extreme cusps exist in a sectional shape of the structure, regardless of whether the heights or pitches of the concavities and convexities of the waveform and the surface shape of the waveform are regular or irregular. Hence, when an organic layer is vapor deposited onto the surface of the concavities and convexities by use of this structure for manufacturing an organic EL element, the thickness of the organic layer can be prevented sufficiently from being partially extremely small, and the organic layer can be stacked in a sufficiently uniform film thickness. As a result, the inter-electrode distance can be sufficiently uniform, so that concentration of an electric field can be suppressed sufficiently. In addition, when the condition represented by the inequality (1) or the condition that the kurtosis (k) is −1.2 or more is satisfied, the gradient of the potential distribution in inclined portions of the waveform of the concavity and convexity structure is gentle in the organic EL element. The present inventors speculate that, for this reason, the generation of a leakage current can be suppressed further sufficiently, when the diffraction grating comprising the cured resin layer satisfying the condition represented by the inequality (1) or the condition that the kurtosis (k) is −1.2 or more is used for an organic EL element. Moreover, the present inventors speculate that since the generation of a leakage current can be suppressed further sufficiently as described above, the light emission efficiency is sufficiently improved, and also the life-extension of the organic EL element can be achieved. In addition, the diffraction grating comprising the cured resin layer 2 satisfying such a condition can be formed efficiently by utilizing of a method for manufacturing a diffraction grating of the present invention to be described later.

Note that the diffraction grating of the present invention can be manufactured, for example, by suitably employing a method for manufacturing a diffraction grating of the present invention described below.

(Method for Manufacturing Diffraction Grating)

The method for manufacturing a diffraction grating of the present invention is a method for manufacturing a diffraction grating, comprising:

a step of applying a curable resin onto a transparent supporting substrate, then curing the curable resin with a master block being pressed thereto, and thereafter detaching the master block, thereby stacking, on the transparent supporting substrate, a cured resin layer having concavities and convexities formed thereon, wherein the master block is obtained by any of the following methods (A) and (B) for manufacturing a master block:

[The Method (A) for Manufacturing a Master Block]

a method comprising the steps of:

applying a block copolymer solution comprising a block copolymer and a solvent onto a base member, the block copolymer having a first polymer segment made of a first homopolymer and a second polymer segment made of a second homopolymer having a solubility parameter which is higher than a solubility parameter of the first homopolymer by 0.1 to 10 $(cal/cm^3)^{1/2}$, and satisfying all the following conditions (i) to (iii):

(i) a number average molecular weight is 500000 or more, (ii) a molecular weight distribution (Mw/Mn) is 1.5 or less, and (iii) a volume ratio between the first polymer segment and the second polymer segment (the first polymer segment: the second polymer segment) is 3:7 to 7:3; and forming a micro phase separation structure of the block copolymer by drying a coating film on the base member, thereby obtaining a first master block having concavities and convexities formed on a surface thereof;

[the method (B) for manufacturing a master block]

a method comprising the steps of:

forming a vapor-deposition film under a temperature condition of 70° C. or above on a surface of a polymer film made of a polymer whose volume changes by heat, and then cooling the polymer film and the vapor-deposition film, thereby forming concavities and convexities of wrinkles on a surface of the vapor-deposition film; and attaching a master block material onto the vapor-deposition film, then curing the master block material, and thereafter detaching the cured master block material from the vapor-deposition film, thereby obtaining a master block.

Figure 2:
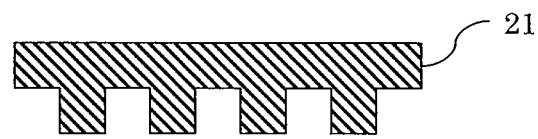
FIG. 2 is a schematic lateral cross-sectional view showing a state where a curable resin is applied onto a transparent supporting substrate in a method for manufacturing a diffraction grating of the present invention.
Figure 2:
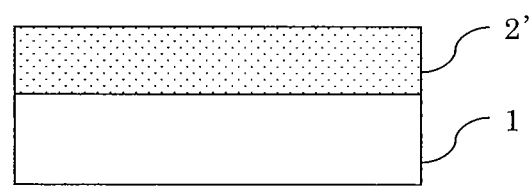
Figure 3:
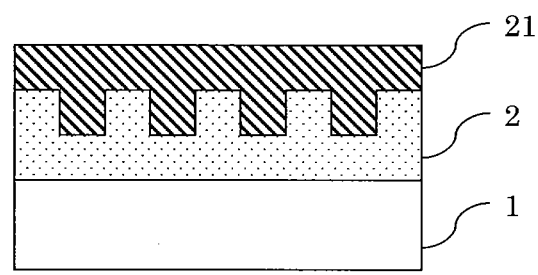
FIG. 3 is a schematic lateral cross-sectional view showing a state where the curable resin is cured with a master block being pressed thereto in the method for manufacturing a diffraction grating of the present invention.
Figure 4:
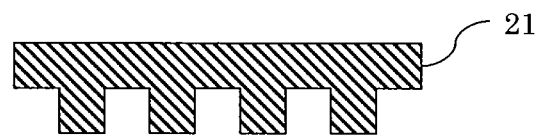
FIG. 4 is a schematic lateral cross-sectional view showing a state where concavities and convexities are formed on a surface of the cured resin layer by detaching the master block in the method for manufacturing a diffraction grating of the present invention.
Figure 4:
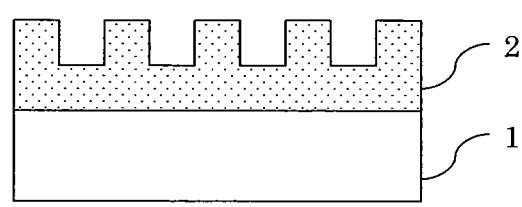

FIGS. 2 to 4 are schematic diagrams for describing a preferred embodiment of the method for manufacturing a diffraction grating of the present invention, where FIG. 2 is a cross-sectional view schematically showing a state where a curable resin is applied onto a transparent supporting substrate, FIG. 3 is a cross-sectional view schematically showing a state where the curable resin is cured with a master block being pressed thereto, and FIG. 4 is a cross-sectional view schematically showing a state where concavities and convexities are formed on a surface of the cured resin layer by detaching the master block.

In the method for manufacturing a diffraction grating of the present invention, first, a curable resin 2' is applied onto a transparent supporting substrate 1 as shown in FIG. 2, and then the curable resin 2' is cured with a master block 21 being pressed thereto as shown in FIG. 3. The transparent supporting substrate 1 is the same as that described for the diffraction grating of the present invention. Any of the same curable resins as those described as the curable resins for forming the cured resin layer 2 of the diffraction grating of the present invention can be used as the curable resin 2'. In addition, the thickness of the curable resin 2' applied is preferably within a range where the resulting thickness of the cured resin layer 2 becomes 0.5 to 500 µm. If the thickness of the curable resin 2' applied is less than the lower limit, the heights of the concavities and convexities formed on the surface of the cured resin layer tend to be insufficient. Meanwhile, if the applied thickness exceeds the upper limit, an effect of volume change of the resin which occurs upon curing tends to be so large that the formation of the shape of the concavities and convexities tends to be poor. In addition, as a method for applying the curable resin 2', employable are various coating methods such as a spin coating method, a spray coating method, a dip coating method, a dropping method, a gravure printing method, a screen printing method, a relief printing method, a die coating method, a curtain coating method, an inkjet method, and a sputtering method, for example. Moreover, the conditions for curing the curable resin 2' vary depending on the kind of the resin used, and it is preferable to set a curing temperature within a range from room temperature to 250° C., and a curing time within a range from 0.5 minutes to 3 hours, for example. Alternatively, a method may be employed in which the curable resin 2' is cured by irradiation with energy rays such as ultraviolet rays or electron beams. In such a case, the amount of the irradiation is preferably within a range from 20 mJ/cm$^2$ to 5 J/cm$^2$.

In the method for manufacturing a diffraction grating of the present invention, subsequently, the master block 21 is detached from a cured resin layer 2, as shown in FIG. 4. A method for detaching the master block 21 from the cured resin layer 2 as described above is not particularly limited, and a known method can be employed as appropriate. Thus, a cured resin layer 2 having concavities and convexities formed thereon can be stacked on the transparent supporting substrate 1 (see FIG. 4). Consequently, the diffraction grating obtained through the steps is the same as the above-described diffraction grating of the present invention. Specifically, the steps make it possible to stack the cured resin layer 2 having a specific concavity and convexity structure on the transparent supporting substrate 1 as described for the above-described diffraction grating of the present invention.

Next, the methods (A) and (B) for manufacturing a master block are described separately.

[Method (A) for Manufacturing Master Block]

The method (A) for manufacturing a master block is a method comprising the steps of:

applying a block copolymer solution comprising the block copolymer and a solvent onto a base member (a block copolymer solution application step); and forming a micro phase separation structure of the block copolymer by drying a coating film on the base member, thereby obtaining a first master block having concavities and convexities formed on a surface thereof (a first master block formation step).

Figure 5:
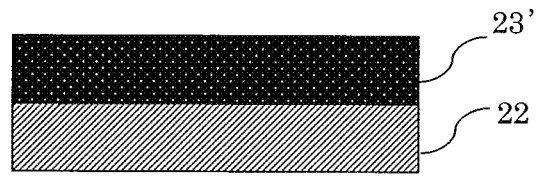
FIG. 5 is a schematic lateral cross-sectional view showing a state where a block copolymer solution is applied onto a base member in a method for manufacturing a master block according to the present invention.
Figure 6:
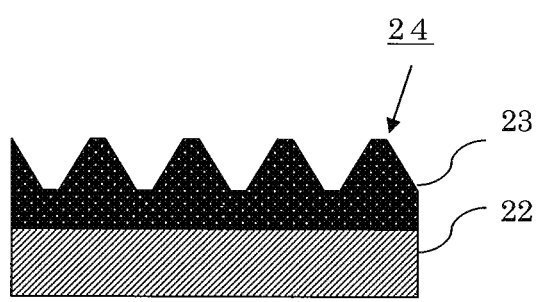
FIG. 6 is a schematic lateral cross-sectional view showing a state where concavities and convexities are formed on a surface of a coating film by forming a micro phase separation structure of the block copolymer in the method for manufacturing a master block according to the present invention.

FIGS. 5 and 6 are schematic diagrams for describing a preferred embodiment of the method (A) for manufacturing a master block in the method for manufacturing a diffraction grating of the present invention, where FIG. 5 is a cross-sectional view schematically showing a state where the block copolymer solution is applied onto the base member in the method (A) for manufacturing a master block, and FIG. 6 is a cross-sectional view schematically showing a state where the concavities and convexities are formed on the surface of the coating film by forming the micro phase separation structure of the block copolymer.

In the block copolymer solution application step, the block copolymer solution is applied onto the base member 22 as shown in FIG. 5.

The base member 22 is not particularly limited, and examples thereof include substrates of resins such as polyimide, polyphenylene sulfide, polyphenylene oxide, polyether ketone, polyethylene naphthalate, polyethylene terephthalate, polyarylate, triacetyl cellulose, and polycycloolefin; inorganic substrates such as glass and silicon substrates; and substrates of metals such as aluminum, iron, and copper. In addition, the base member 22 may be subjected to surface treatments such as an orientation treatment.

The block copolymer used in the present invention has a first polymer segment made of a first homopolymer and a second polymer segment made of a second homopolymer having a solubility parameter which is higher than a solubility parameter of the first homopolymer by 0.1 to 10 (cal/cm$^3$)$^{1/2}$. If the difference between the solubility parameters of the first and second homopolymers is less than 0.1 (cal/cm$^3$)$^{1/2}$, a regular micro phase separation structure of the block copolymer cannot be formed. Meanwhile, if the difference exceeds 10 (cal/cm$^3$)$^{1/2}$, a uniform solution of the block copolymer is difficult to prepare, so that a regular micro phase separation structure of the block copolymer is difficult to form.

Examples of monomers serving as raw materials of homopolymers usable as the first homopolymer or the second homopolymer include styrene, methylstyrene, propylstyrene, butylstyrene, hexylstyrene, octylstyrene, methoxystyrene, ethylene, propylene, butene, hexene, acrylonitrile, acrylamide, methyl methacrylate, ethyl methacrylate, propyl methacrylate, butyl methacrylate, hexyl methacrylate, octyl methacrylate, methyl acrylate, ethyl acrylate, propyl acrylate, butyl acrylate, hexyl acrylate, octyl acrylate, methacrylic acid, acrylic acid, hydroxyethyl methacrylate, hydroxyethyl acrylate, ethylene oxide, propylene oxide, dimethylsiloxane, lactic acid, vinylpyridine, hydroxystyrene, styrenesulfonate, isoprene, butadiene, ε-caprolactone, isopropylacrylamide, vinyl chloride, ethylene terephthalate, tetrafluoroethylene, and vinyl alcohol. Of these monomers, styrene, methyl methacrylate, ethylene oxide, butadiene, isoprene, vinylpyridine, and lactic acid are preferably used from the viewpoints that the formation of separated phases easily occurs, and that the concavities and convexities are easily formed by etching.

In addition, examples of the combination of the first homopolymer and the second homopolymer include combinations of two selected from the group consisting of a styrene-based polymer (more preferably polystyrene), a polyalkyl methacrylate (more preferably polymethyl methacrylate), polyethylene oxide, polybutadiene, polyisoprene, polyvinylpyridine, and polylactic acid. Of these combinations, combinations of a styrene-based polymer and a polyalkyl methacrylate, combinations of a styrene-based polymer and polyethylene oxide, combination of a styrene-based polymer and polyisoprene, combinations of a styrene-based polymer and polybutadiene are more preferable, and combinations of a styrene-based polymer and polymethyl methacrylate, combinations of a styrene-based polymer and polyisoprene, combinations of a styrene-based polymer and polybutadiene are particularly preferable, from the viewpoint that the depths of the concavities and convexities formed on the block copolymer can be further increased by preferentially removing one of the homopolymers by an etching treatment.

The number average molecular weight (Mn) of the block copolymer needs to be 500000 or more, and is more preferably 1000000 or more, and particularly preferably 1000000 to 5000000. If the number average molecular weight is less than 500000, the average pitch of the concavities and convexities formed by the micro phase separation structure of the block copolymer is so small that the average pitch of the concavities and convexities of the obtained diffraction grating becomes insufficient.

The molecular weight distribution (Mw/Mn) of the block copolymer needs to be 1.5 or less, and is more preferably 1.0 to 1.35. If the molecular weight distribution exceeds 1.5, a regular micro phase separation structure of the block copolymer cannot be formed.

Note that the number average molecular weight (Mn) and the weight average molecular weight (Mw) of the block copolymer are values measured by gel permeation chromatography (GPC) and converted to molecular weights of standard polystyrene.

In the block copolymer, a volume ratio between the first polymer segment and the second polymer segment (the first polymer segment:the second polymer segment) needs to be 3:7 to 7:3, and is more preferably 4:6 to 6:4. If the volume ratio is out of the above-described range, a concavity and convexity pattern owing to a lamellar structure is difficult to form.

The block copolymer solution used in the present invention comprises the block copolymer and a solvent. Examples of the solvent include aliphatic hydrocarbons such as hexane, heptane, octane, decane, and cyclohexane; aromatic hydrocarbons such as benzene, toluene, xylene, and mesitylene; ethers such as diethyl ether, tetrahydrofuran, and dioxane; ketones such as acetone, methyl ethyl ketone, isophorone, and cyclohexanone; ether alcohols such as butoxyethyl ether, hexyloxyethyl alcohol, methoxy-2-propanol, and benzyloxyethanol; glycol ethers such as ethylene glycol dimethyl ether, diethylene glycol dimethyl ether, triglyme, propylene glycol monomethyl ether, and propylene glycol monomethyl ether acetate; esters such as ethyl acetate, ethyl lactate, and γ-butyrolactone; phenols such as phenol and chlorophenol; amides such as N,N-dimethylformamide, N,N-dimethylacetamide, and N-methylpyrrolidone; halogen-containing solvents such as chloroform, methylene chloride, tetrachloroethane, monochlorobenzene, and dichlorobenzene; heteroelement containing compounds such as carbon disulfide; and mixture solvents thereof. A percentage content of the block copolymer in the block copolymer solution is preferably 0.1 to 15% by mass, and more preferably 0.3 to 5% by mass, relative to 100% by mass of the block copolymer solution.

In addition, the block copolymer solution may further comprise a different homopolymer (a homopolymer other than the first homopolymer and the second homopolymer in the block copolymer contained in the solution: for example, when the combination of the first homopolymer and the second homopolymer in the block copolymer is a combination of polystyrene and polymethyl methacrylate, the different homopolymer may be any kind of homopolymer other than polystyrene and polymethyl methacrylate), a surfactant, an ionic compound, an anti-foaming agent, a leveling agent, and the like. When the block copolymer solution further comprises the different homopolymer, the concavities and convexities formed by micro phase separation of the block copolymer tend to be deeper.

In addition, a polyalkylene oxide is preferably used as the different homopolymer, because an effect (an effect of making the concavities and convexities deeper) is further advanced. Moreover, as the polyalkylene oxide, polyethylene oxide or polypropylene oxide is more preferable, and polyethylene oxide is particularly preferable. In addition, as the polyethylene oxide, one represented by the following formula is preferable:

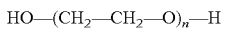

[in the formula, n represents an integer of 10 to 5000 (more preferably an integer of 50 to 1000, and further preferably an integer of 50 to 500)]. If the value of n is less than the lower limit, the molecular weight is so low that the effect tends to disappear because the polyethylene oxide is lost due to volatilization, vaporization, or the like during a heat treatment at a high-temperature. Meanwhile, if the value exceeds the upper limit, the molecular weight it so high that the molecular mobility is low. Hence, the speed of the phase separation is lowered so that the formation of the micro phase separation structure tends to be insufficient.

In addition, the number average molecular weight (Mn) of the different homopolymer is preferably 460 to 220000, and is more preferably 2200 to 46000. If the number average molecular weight is less than the lower limit, the molecular weight is so low that the effect tends to disappear because the different homopolymer is lost due to volatilization, vaporization, or the like during a heat treatment at a high-temperature. Meanwhile, if number average molecular weight (Mn) exceeds the upper limit, the molecular weight is so high that the molecular mobility is low. Hence, the speed of the phase separation is lowered so that the formation of the separated micro phases tends to be insufficient.

The molecular weight distribution (Mw/Mn) of the different homopolymer is preferably 1.5 or less, and more preferably 1.0 to 1.3. If the molecular weight distribution exceeds the upper limit, the uniformity of the shape of the micro phase separation tends not to be maintained. Note that the number average molecular weight (Mn) and the weight average molecular weight (Mw) are values measured by gel permeation chromatography (GPC) and converted to molecular weights of standard polystyrene.

In addition, when the different homopolymer is used in the present invention, it is preferable that the combination of the first homopolymer and the second homopolymer in the block copolymer be a combination of polystyrene and polymethyl methacrylate (polystyrene-polymethyl methacrylate), and the different homopolymer be a polyalkylene oxide. The use of a polystyrene-polymethyl methacrylate block copolymer and a polyalkylene oxide in combination as described above leads to tendencies that the orientation in the vertical direction is further improved, making it possible to further increase the depths of the concavities and convexities on the surface, and that the heat treatment time during manufacturing can be shortened.

When the different homopolymer is used, the content thereof is preferably 100 parts by mass or less, and more preferably 5 parts by mass to 100 parts by mass, relative to 100 parts by mass of the block copolymer. If the content of the different homopolymer is less than the lower limit, the effect obtained by the different homopolymer contained tends to be insufficient.

In addition, when the surfactant is used, the content thereof is preferably 10 parts by mass or less relative to 100 parts by mass of the block copolymer. Moreover, when the ionic compound is used, the content thereof is preferably 10 parts by mass or less relative to 100 parts by mass of the block copolymer.

In addition, when the block copolymer solution comprises the different homopolymer, the total percentage content of the block copolymer and the different homopolymer is preferably 0.1 to 15% by mass, and more preferably 0.3 to 5% by mass, in the block copolymer solution. If the total percentage content is less than the lower limit, it tends to be impossible to uniformly apply the solution in a wet film thickness sufficient to obtain a necessary film thickness. Meanwhile, if the total percentage content exceeds the upper limit, it tends to be difficult to prepare a solution in which the block copolymer and the different homopolymer are uniformly dissolved in the solvent.

The method for applying the block copolymer solution is not particularly limited, and, for example, a spin coating method, a spray coating method, a dip coating method, a dropping method, a gravure printing method, a screen printing method, a relief printing method, a die coating method, a curtain coating method, or an inkjet method can be employed as the method.

The thickness of a coating film 23' of the block copolymer is preferably within a range which allows the thickness of the dried coating film 23 to be 10 to 3000 nm, and more preferably within a range which allows the thickness of the dried coating film 23 to be 50 to 500 nm. In addition, the thickness of the dried coating film 23 is preferably close to an integral multiple of a lamellar period of the block copolymer.

In the first master block formation step, concavities and convexities are formed on the surface of the dried coating film 23 by drying the coating film 23' on the base member 22, thereby forming a micro phase separation structure of the block copolymer as shown in FIG. 6. The temperature for drying the coating film 23' is not particularly limited, as long as the solvent can be removed from the coating film 23'. For example, the temperature is preferably 30 to 200° C., and more preferably 40 to 100° C. Thus, a first master block 24 comprising the base member 22 and the dried coating film 23, and having the concavities and convexities formed on the surface thereof can be obtained.

In the step of obtaining the first master block, the dried coating film 23 is preferably heated at a temperature higher than the glass transition temperature (Tg) of the block copolymer. If the heating temperature is lower than the lower limit, the molecular mobility is so low that the time required for the formation of the micro phase separation structure tends to be long. In addition, the upper limit of the heating temperature is not particularly limited, unless the block copolymer is pyrolyzed at the temperature.

Note that, to further improve the regularity of the concavities and convexities formed by the micro phase separation structure, the dried coating film 23 may be subjected appropriately to, for example, any of a step of improving the regularity of the concavities and convexities, in which a treatment with an organic solvent is conducted on the dried coating film 23 by allowing the dried coating film 23 to stand still at a saturated vapor pressure of a specific organic solvent (for example, chloroform) for about 3 to 240 hours; a step of improving the regularity of the concavities and convexities by utilizing an electric field; a step of improving the regularity of the concavities and convexities by utilizing a shearing force; a step of improving the regularity of the concavities and convexities by utilizing a supercritical fluid, and the like, instead of the above-described step of heating the dried coating film 23 at a temperature higher than the glass transition temperature (Tg) thereof. Note that, of these steps, a preferred step may be selected as appropriate depending on the kind of the block copolymer, the kind of the solvent, the kind of the different homopolymer, and the like. For example, when a polystyrene-polymethyl methacrylate block copolymer and a polyalkylene oxide (the different polymer) are used in combination for the block copolymer solution, it is particularly preferable to employ the step of heating the dried coating film 23 at a temperature higher than the glass transition temperature (Tg) of the block copolymer.

In the step of obtaining a first master block, the dried coating film 23 is preferably subjected to an etching treatment. As a result of the etching treatment, the concavities and convexities formed by the micro phase separation of the block copolymer tend to be deeper. For example, an etching method using a reactive ion etching method, an ozone oxidation method, a hydrolysis method, a metal ion staining method, an ultraviolet-ray etching method, or the like can be employed as the etching treatment. Moreover, as the etching treatment, a method may be employed in which covalent bonds in the block copolymer are cleaved by treating the covalent bonds with at least one selected from the group consisting of acids, bases, and reducing agents, and then the coating film in which the micro phase separation structure is formed is washed with a solvent which dissolves only one of the polymer segments, or the like, thereby removing only the one of the polymer segments, while keeping the micro phase separation structure.

Thus, the first master block has concavities and convexities of the micro phase separation structure formed on the surface thereof. The average pitch of the concavities and convexities formed on the surface of the first master block is preferably within a range from 100 to 600 nm, and more preferably 200 to 600 nm. If the average pitch of the concavities and convexities is less than the lower limit, the pitches are so small relative to wavelengths of the visible light that necessary diffraction tends not to occur in the diffraction grating obtained by use of such a master block. Meanwhile, if the average pitch exceeds the upper limit, the diffraction angle of the diffraction grating obtained by use of such a master block is so small that the functions of a diffraction grating tend to be lost. Note that the average pitch of the concavities and convexities refers to an average value of pitches of the concavities and convexities obtained when pitches of the concavities and convexities on the surface of the cured resin layer (distances between adjacent concave portions or between adjacent convex portions) are measured. In addition, a value which can be calculated as follows is employed as the average value of the pitches of the concavities and convexities. Specifically, a concavity and convexity analysis image is obtained by measuring the shape of the concavities and convexities on the surface by use of a scanning probe microscope (for example, one manufactured by SII NanoTechnology Inc., under the product name of "E-sweep", or the like), then the distances between randomly selected adjacent convex portions or between randomly selected adjacent concave portions are measured at 100 points or more in the concavity and convexity analysis image, and then an average of these distances is determined.

In addition, in the first master block, the average height of the concavities and convexities formed on the surface is preferably within a range from 5 to 200 nm, more preferably within a range from 20 to 200 nm, and further preferably within a range from 50 to 150 nm. If the average height of the concavities and convexities is less than the lower limit, the height is so small relative to the wavelengths of the visible light that necessary diffraction tends not to occur. Meanwhile, if the average height exceeds the upper limit, the following tendency is found. Specifically, when the obtained diffraction grating is used as an optical element on the light extraction port side of an organic EL element, the element tends to be easily destructed and the life thereof tends to be shortened because of heat generation which occurs when the electric field distribution in the EL layer becomes nonuniform, and hence electric fields concentrate on a certain position. Note that the average height of the concavities and convexities refers to an average value of the heights of the concavities and convexities obtained when heights of the concavities and convexities (the distances between concave portions and convex portions in the depth direction) on the surface of the cured resin layer are measured. In addition, a value calculated as follows is employed as the average value of the heights of the concavities and convexities. Specifically, a concavity and convexity analysis image is obtained by measuring the shape of the concavities and convexities on the surface by use of a scanning probe microscope (for example, one manufactured by SII NanoTechnology Inc., under the product name of "E-sweep", or the like), then the distances between randomly selected concave portions and convex portions in the depth direction are measured at 100 points or more in the concavity and convexity analysis image, and then the average of the distances is determined.

In addition, the first master block is preferably such that a Fourier-transformed image shows a circular or annular pattern, the Fourier-transformed image being obtained by performing two-dimensional fast Fourier transform processing on an concavity and convexity analysis image obtained by analyzing the shape of the concavities and convexities formed on the surface by use of an atomic force microscope. Specifically, the Fourier-transformed image preferably shows a circular or annular pattern substantially centered at an origin at which an absolute value of wavenumber is 0 $\mu m^{-1}$. In addition, the circular or annular pattern is present preferably within a region where an absolute value of wavenumber is within a range of 10 $\mu m^{-1}$ or less, particularly preferably within a region where an absolute value of wavenumber is within a range from 1.25 to 10 $\mu m^{-1}$, and further preferably within a region where an absolute value of wavenumber is within a range from 1.25 to 5 $\mu m^{-1}$. In addition, the phrase "the circular or annular pattern is present within a region where an absolute value of wavenumber is within a range of 10 $\mu m^{-1}$ or less" means that 30% or more (more preferably 50% or more, furthermore preferably 80% or more, and particularly preferably 90% or more) of bright spots forming the Fourier-transformed image are pre sent within a region where an absolute value of wavenumber is within a range of 10 $\mu m^{-1}$ or less.

The method for manufacturing a diffraction grating of the present invention preferably further comprises a step (a second master block formation step) of attaching a transfer material 25' onto a first master block 24, then curing the transfer material 25', and thereafter, detaching the transfer material 25' from the first master block, thereby obtaining a second master block having concavities and convexities formed on a surface thereof.

Figure 7:
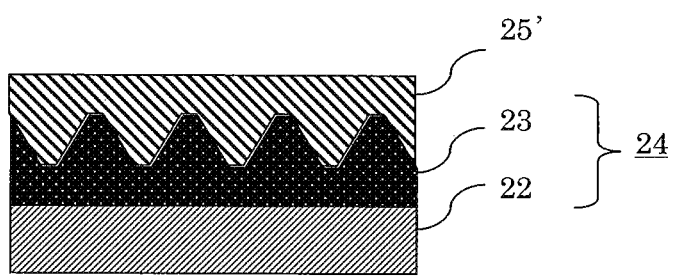
FIG. 7 is a schematic lateral cross-sectional view showing a state where a transfer material is attached onto a first master block in the method for manufacturing a master block according to the present invention.
Figure 8:
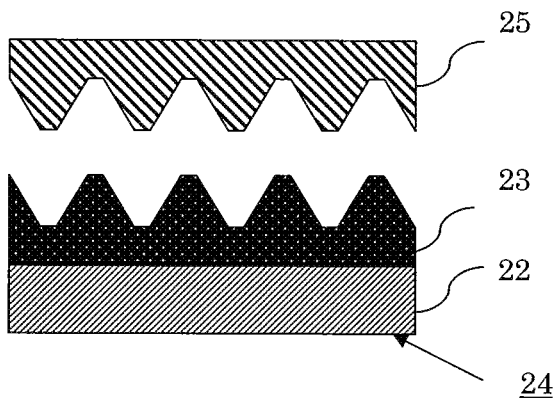
FIG. 8 is a schematic lateral cross-sectional view showing a state where a cured second master block is detached from the first master block in the method for manufacturing a master block according to the present invention.

FIG. 7 is a cross-sectional view schematically showing a state where the transfer material is attached onto the first master block in the method for manufacturing a master block according to the present invention, and FIG. 8 is a cross-sectional view schematically showing a state where the cured second master block is detached from the first master block.

In the second master block formation step, first, the transfer material 25' is attached onto the first master block 24 and cured, as shown in FIG. 7. The transfer material 25' is not particularly limited, and examples thereof include inorganic substances such as nickel, silicon, silicon carbide, tantalum, glassy carbon, silica glass, and silica; and resin compositions such as silicone-based polymers (silicone rubbers), urethane rubbers, norbornene resins, polycarbonate, polyethylene terephthalate, polystyrene, polymethyl methacrylate, acrylic resins, liquid crystal polymers, and epoxy resins. Of these transfer materials, silicone-based polymers, nickel, silicon, silicon carbide, tantalum, glassy carbon, silica glass, silica, and acrylic resins are more preferable, silicone-based polymers and acrylic resins are further more preferable, and silicone-based polymers containing polydimethylsiloxane and fluorine-based acrylic resins are particularly preferable, from the viewpoints of formability, followability to a fine pattern, and mold releasability. In addition, to enhance the mold releasability of the transfer material, a metal such as Pt, Al, Au, or Ni may be vapor deposited in a small thickness onto the master block 24. Alternatively, a treatment with a fluorine-based mold release agent or other surface treatments may be conducted in a small thickness. In addition, a method for attaching the transfer material 25' as described above is not particularly limited, and examples of employable method include a vacuum vapor deposition method; and various coating methods such as a spin coating method, a spray coating method, a dip coating method, a dropping method, a gravure printing method, a screen printing method, a relief printing method, a die coating method, a curtain coating method, an inkjet method, and a sputtering method. In addition, although the conditions for curing the transfer material 25' vary depending on the kind of the transfer material used, the conditions are preferably such that the curing temperature is within a range from room temperature to 250° C., and the curing time is within a range from 0.5 minutes to 3 hours, for example. In addition, a method may be employed in which the transfer material 25' is cured by irradiation with energy rays such as ultraviolet rays or electron beams. In such a case, the amount of the irradiation is preferably within a range from 20 mJ/cm$^2$ to 10 J/cm$^2$.

In the second master block formation step, subsequently, a second master block 25 is obtained by detaching the cured transfer material 25 from the first master block 24 as shown in FIG. 8. A method for detaching the second master block 25 from the first master block 24 as described above is not particularly limited, and a known method can be employed as appropriate. In addition, the second master block 25 may be manufactured directly from the first master block 24 as described above, or the second master block 25 may be manufactured from the first master block 24 through one or more intermediate master blocks. The intermediate master blocks can be formed by the same step as the second master block formation step, and, for example, the second master block 25 may be manufactured through an intermediate master block to invert the concavity and convexity structure. As a transfer material for manufacturing the intermediate master blocks, the same transfer materials as those for the transfer material 25'can be used. A final master block may be manufactured from a master block by repeating inversion and/or transfer of the concavities and convexities through one or more intermediate master blocks.

In addition, as the master block or the intermediate master block, it is also possible to use one obtained by stacking a vapor-deposition film on the first master block, the second master block, or an intermediate master block used for manufacturing the second master block by a vapor deposition method (for example, an Ar sputtering method). The stacking of the vapor-deposition film as described above leads to a tendency that when transfer or the like is conducted by applying a resin onto a surface of the vapor-deposition film, or the like, the adhesion with the resin (for example, an UV curable resin) can be lowered, so that the master block tends to be easily peeled. In addition, the material of the vapor-deposition film is not particularly limited, and examples thereof include metals such as aluminum, gold, silver, platinum, and nickel; metal oxides such as aluminum oxide. In addition, the thickness of the vapor-deposition film is preferably 5 to 500 nm. If the thickness is less than the lower limit, a uniform film is difficult to obtain, so that a sufficient effect of lowering the adhesion tends not to be obtained. Meanwhile, if the thickness exceeds the upper limit, the shape of the master block tends to be dull. In addition, the master blocks (including the intermediate master blocks) may be converted into metal master blocks by performing a plating treatment on the master blocks by use of a known method. Moreover, when an intermediate master block is made of an UV curable resin, postcure may be conducted as appropriate by irradiation again with ultraviolet light or the like, after the intermediate master block is obtained by irradiation with ultraviolet light, during the manufacturing thereof.

In addition, it is also possible to employ, as a master block, one obtained in such a manner that a resin (the curable resin 2', a master block material 29' to be described later, the transfer material 25', or the like) is applied onto the surface of the first master block, the second master block, or moreover an intermediate master block used for manufacturing the second master block, and then the resin is cured, and thereafter detached. Moreover, it is also possible to employ, as a master block, a concavity and convexity film of a cured resin obtained by pressing the master block onto a coating film of a resin, and curing the resin, instead of applying the resin onto a surface of the obtained master block. A resin film in which the concavities and convexities are inverted as described above can also be used as the master block.

In the present invention, the master block (the first master block 24, the second master block 25, or the like) thus obtained by conducting the method (A) for manufacturing a master block can be used as the master block 21 for forming the diffraction grating.

[Method (B) for Manufacturing Master Block]

The method (B) for manufacturing a master block is a method comprising the steps of:

forming a vapor-deposition film under a temperature condition of 70° C. or above on a surface of a polymer film made of a polymer whose volume changes by heat, and then cooling the polymer film and the vapor-deposition film, thereby forming concavities and convexities of wrinkles on a surface of the vapor-deposition film (a concave- and convex-shape formation step); and attaching a master block material onto the vapor-deposition film, then curing the master block material, and thereafter detaching the cured master block material from the vapor-deposition film, thereby obtaining a master block (a master block formation step).

Figure 9:
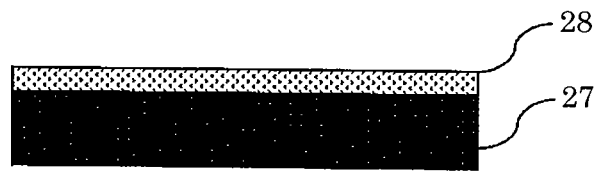
FIG. 9 is a schematic lateral cross-sectional view showing a state where a vapor-deposition film is formed on a surface of a polymer film in the method for manufacturing a master block according to the present invention.
Figure 10:
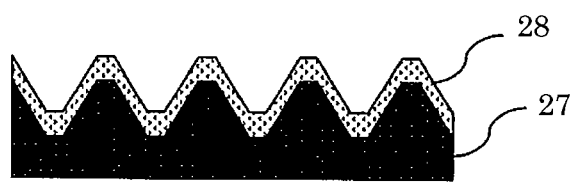
FIG. 10 is a schematic lateral cross-sectional view showing a state where concavities and convexities of wrinkles are formed on a surface of the vapor-deposition film by cooling the polymer film and the vapor-deposition film in the method for manufacturing a master block according to the present invention.
Figure 11:
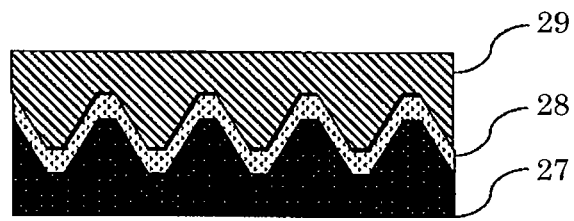
FIG. 11 is a schematic lateral cross-sectional view showing a state where a master block material is attached onto the vapor-deposition film having concavities and convexities formed on a surface thereof, and cured in the method for manufacturing a master block according to the present invention.
Figure 12:
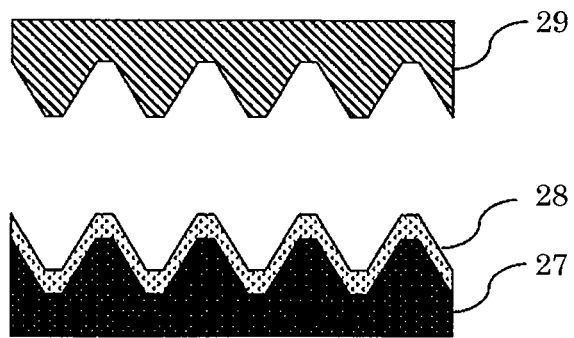
FIG. 12 is a schematic lateral cross-sectional view showing a state where a cured master block is detached from the vapor-deposition film in the method for manufacturing a master block according to the present invention.

FIGS. 9 to 12 are schematic diagrams for describing a preferred embodiment of the method for manufacturing a master block in the method for manufacturing a diffraction grating of the present invention, where FIG. 9 is a cross-sectional view schematically showing a state where a vapor-deposition film is formed on a surface of a polymer film in the method for manufacturing a master block according to the present invention; FIG. 10 is a cross-sectional view schematically showing a state where concavities and convexities of wrinkles are formed on the surface of the vapor-deposition film by cooling the polymer film and the vapor-deposition film; FIG. 11 is a cross-sectional view schematically showing a state where a master block material is attached onto the vapor-deposition film having the concavities and convexities formed thereon, and then cured; and FIG. 12 is a cross-sectional view schematically showing a state where a cured master block is detached from the vapor-deposition film.

In the concave- and convex-shape formation step, first, a polymer film made of a polymer whose volume changes by heat is prepared. As the polymer whose volume changes by heat, one whose volume changes by heating or cooling (for example, one having a coefficient of thermal expansion of 50 ppm/K or more) can be used as appropriate. As the polymer, a silicone-based polymer is more preferable, and a silicone-based polymer containing polydimethylsiloxane is particularly preferable, from the viewpoint that the concavities and convexities of wrinkles are easily formed on the surface of the vapor-deposition film, because the difference between the coefficient of thermal expansion of the polymer and the coefficient of thermal expansion of the vapor-deposition film is large, and because the polymer has a high flexibility. As a method for forming the polymer film as described above, for example, a spin coating method, a dip coating method, a dropping method, a gravure printing method, a screen printing method, a relief printing method, a die coating method, a curtain coating method, an inkjet method, a spray coating method, a sputtering method, a vacuum vapor deposition method, or the like can be employed. Moreover, the thickness of the polymer film is preferably within a range from 10 to 5000 μm, and is more preferably within a range from 10 to 2000 μm.

In the concave- and convex-shape formation step, next, a vapor-deposition film 28 is formed on a surface of a polymer film 27 under a temperature condition of 70° C. or above (see FIG. 9). The temperature at which the vapor-deposition film 28 is formed needs to be 70° C. or above, and is more preferably 90° C. or above. If the temperature is lower than 70° C., the concavities and convexities of wrinkles cannot be formed sufficiently on the surface of the vapor-deposition film. As the method for forming the vapor-deposition film 28, a known method such as a vapor deposition method or a sputtering method can be employed as appropriate. Of these methods, a vapor deposition method is preferably employed, from the viewpoint of maintaining the shape of the concavities and convexities formed on the surface of the polymer film. Meanwhile, a material of the vapor-deposition film 28 is not particularly limited, and examples thereof include metals such as aluminum, gold, silver, platinum, and nickel; and metal oxides such as aluminum oxide.

In the concave- and convex-shape formation step, subsequently, concavities and convexities of wrinkles are formed on the surface of the vapor-deposition film 28 by cooling the polymer film 27 and the vapor-deposition film 28 (see FIG. 10). Since there is a difference between the coefficient of thermal expansion of the polymer film 27 and the coefficient of thermal expansion of the vapor-deposition film 28, the concavities and convexities (the so-called bucking pattern, or the so-called Turing pattern) of wrinkles can be formed on the surface of the vapor-deposition film 28 as shown in FIG. 10, when the volume of each of the polymer film 27 and the vapor-deposition film 28 as shown in FIG. 9 changes by heat. In addition, the temperatures of the polymer film 27 and the vapor-deposition film 28 after the cooling are preferably 40° C. or below. If the temperatures of the polymer film 27 and the vapor-deposition film 28 after the cooling exceed the upper limit, it tends to be difficult to form the concavities and convexities of wrinkles on the surface of the vapor-deposition film. Moreover, the rate of temperature drop in cooling the polymer film 27 and the vapor-deposition film 28 is preferably within a range from 1 to 80° C./minute. If the rate of temperature drop is less than the lower limit, the concavities and convexities tend to be relaxed. Meanwhile, if the rate of temperature drop exceeds the upper limit, scars such as cracks tend to be easily formed on the surfaces of the polymer film and the vapor-deposition film.

In the master block formation step, first, a master block material 29' is attached onto the vapor-deposition film 28, and cured, as shown in FIG. 11. The master block material 29' is not particularly limited, and examples thereof include inorganic substances such as nickel, silicon, silicon carbide, tantalum, glassy carbon, silica glass, and silica; and resin compositions such as silicone-based polymers (silicone rubbers), urethane rubbers, norbornene resins, polycarbonate, polyethylene terephthalate, polystyrene, polymethyl methacrylate, acrylic, and liquid crystal polymers. Of these master block materials 29', silicone-based polymers, nickel, silicon, silicon carbide, tantalum, glassy carbon, silica glass, and silica are more preferable, silicone-based polymers are furthermore preferable, and silicone-based polymers containing polydimethylsiloxane are particularly preferable, from the viewpoint of formability, followability to a fine pattern, and mold releasability. In addition, a method for attaching the master block material 29' as described above is not particularly limited, and, examples of employable method include a vacuum vapor deposition method; and various coating methods such as a spin coating method, a spray coating method, a dip coating method, a dropping method, a gravure printing method, a screen printing method, a relief printing method, a die coating method, a curtain coating method, an inkjet method, and a sputtering method. In addition, although conditions for curing the master block material 29' vary depending on the kind of the master block material used, it is preferable to set a curing temperature within a range from room temperature to 250° C., and a curing time within a range from 0.5 minutes to 3 hours, for example. In addition, a method may be employed in which the master block material 29' is cured by irradiation with energy rays such as ultraviolet rays and electron beams. In such a case, the amount of the irradiation is preferably within a range from 20 mJ/cm$^2$ to 10 J/cm$^2$.

In the master block formation step, subsequently, a master block 29 is obtained by detaching the cured master block material 29 from the vapor-deposition film 28 as shown in FIG. 12. A method for detaching the master block 29 from the vapor-deposition film 28 as described above is not particularly limited, and a known method can be employed as appropriate.

When a polymer whose volume changes by heat is used as the master block material in the method for manufacturing a master block of the method for manufacturing a diffraction grating of the present invention, the concave- and convex-shape formation step and the master block formation step may be repeated by use of the master block 29 obtained as the polymer film. This method makes it possible to deepen the winkles formed on the surface of the master block, and to increase the average height of the concavities and convexities formed on the surface of the master block.

In addition, it is also possible to employ, as the master block, one obtained in such a manner that a resin (a material as described for the master block material 29' or the curable resin 2') is applied onto the surface of the obtained master block 29, then the resin is cured, and thereafter detached. Moreover, it is also possible to employ, as the master block, a concavity and convexity film of a cured resin obtained by pressing the master block 29 onto a coating film of a resin, and curing the resin, instead of applying the resin onto the surface of the obtained master block 29. A resin film in which the concavities and convexities are inverted as described above can also be used as a master block.

A final master block may be manufactured from the master block 29 by repeating inversion and/or transfer of the concavities and convexities through one or more intermediate master blocks. As the intermediate master blocks, those obtained by appropriately inverting and/or transferring the concavity and convexity structure as described above can be used. In addition, when a master block is manufactured by repeating the inversion and/or the transfer of the concavities and convexities as described above, it is possible to conduct temporal transfer to a flexible material (for example, a plastic film or a silicone rubber) during the transfer of the concavities and convexities of a master block, in order to facilitate the transfer of the concavity and convexity structure even in a case where a non-flexible substrate (for example, glass) for which the resin film or the like is difficult to peel is used. Hence, the same concavity and convexity structure as that of the master block used tends to be easily obtained (the same even-odd property is obtained). In addition, it is also possible to further repeat the concave- and convex-shape formation step and the master block formation step by use of, as the master block 29, polymer films obtained by applying the polymer whose volume changes by heat onto the intermediate master blocks, and curing the polymer. In addition, when the intermediate master block is made of an UV curable resin, postcure may be conducted by irradiation again with ultraviolet light, after the intermediate master block is obtained by irradiation with ultraviolet light, during the manufacturing thereof. The postcure conducted by irradiating again a master block made of an UV curable resin with ultraviolet light as described above leads to a tendency that the degree of the cross-linking in the master block is improved, and the mechanical strength and the chemical resistance are improved.

In addition, the master blocks (including the intermediate master blocks) may be converted to metal master blocks by performing a plating treatment by use of a known method. The formation of metal master blocks by plating as described above leads to a tendency that master blocks which are excellent in mechanical strength and which can be used repeatedly can be obtained. In addition, examples of materials usable for the plating include nickel, copper, iron, nickel-cobalt alloys, nickel-iron alloys, and the like. Note that the thickness of the plating layer is preferably 50 μm to 1 mm, from the viewpoints of mechanical strength, time required for the formation of the metal master block, and the like.

Then, in the present invention, a master block obtained by conducting the method (B) for manufacturing a master block as described above (a master block obtained by repeating the concave- and convex-shape formation step and the master block formation step by use of the master block 29 or the master block 29 obtained as a polymer film, or the like) can be used as the master block 21 for forming the diffraction grating.

In addition, in the method for manufacturing a diffraction grating of the present invention, a master block which is obtained by conducting the method (A) or (B) for manufacturing a master block and which is heated under the atmospheric pressure and under a temperature condition of about 80 to 200° C. for about 1 to 48 hours may be used as the master block 21 used for manufacturing the diffraction grating. By hearing the master block as described above, a master block tends to be obtained which is capable of more efficiently manufacturing a diffraction grating comprising the cured resin layer 2 satisfying the condition represented by the above-described inequality (1) and the above-described condition of the kurtosis.

(Organic EL Element)

An organic EL element of the present invention is an organic EL element comprising:

a transparent supporting substrate;

a cured resin layer which is stacked on the transparent supporting substrate and which has concavities and convexities formed on a surface thereof; and a transparent electrode, an organic layer, and a metal electrode, which are stacked in this order on the cured resin layer and formed into such a shape that a shape of the concavities and convexities formed on the surface of the cured resin layer is maintained, wherein a constituent portion formed by the transparent supporting substrate and the cured resin layer in the organic EL element comprises the above-described diffraction grating of the present invention.

Figure 13:
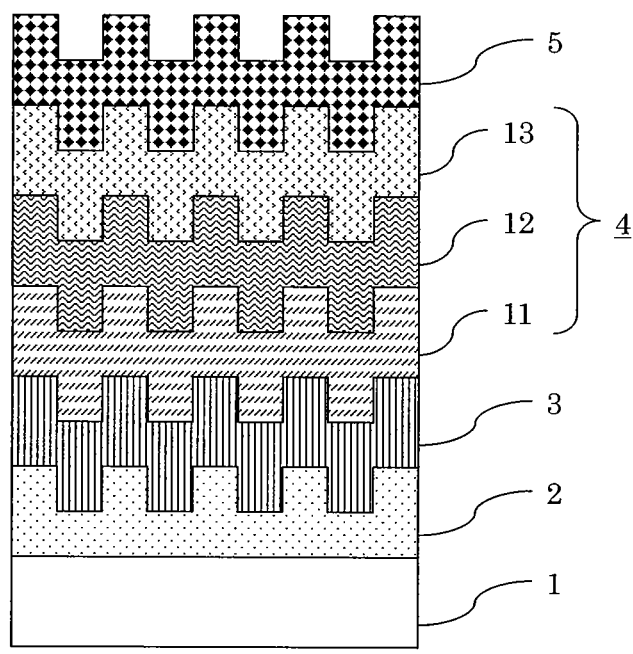
FIG. 13 is a schematic lateral cross-sectional view showing a preferred embodiment of an organic EL element of the present invention.

FIG. 13 is a cross-sectional view schematically showing a preferred embodiment of the organic EL element of the present invention. The organic EL element shown in FIG. 13 comprises: a transparent supporting substrate 1; a cured resin layer 2 which is stacked on the transparent supporting substrate 1 and which has concavities and convexities formed on a surface thereof; and a transparent electrode 3, an organic layer 4, and a metal electrode 5, which are stacked in this order on the cured resin layer 2 and formed into such a shape that the shape of the concavities and convexities formed on the surface of the cured resin layer 2 is maintained.

The transparent supporting substrate 1 and the cured resin layer 2 are the same as those described for the diffraction grating of the present invention. As described above, in the present invention, the constituent portion formed by the transparent supporting substrate 1 and the cured resin layer 2 in the organic EL element comprises the above-described diffraction grating of the present invention. The above-described diffraction grating of the present invention is used as the constituent portion comprising the transparent supporting substrate 1 and the cured resin layer 2 as described above. Hence, the wavelength-dependence and the directivity of light emission are sufficiently low in the organic EL element of the present invention. In addition, since the diffraction grating of the present invention is used as described above, a sufficiently high level of light-extraction efficiency can be achieved.

As a material for the transparent electrode 3, for example, indium oxide, zinc oxide, tin oxide, indium-tin oxide (ITO), which is a composite material thereof, gold, platinum, silver, or copper is used. Of these materials, ITO is preferable from the viewpoint of the balance between the transparency and the electrical conductivity. In addition, the thickness of the transparent electrode 3 is preferably within a range from 20 to 500 nm. If the thickness is less than the lower limit, the electrical conductivity tends to be insufficient. Meanwhile, if the thickness exceeds the upper limit, the transparency tends to be so insufficient that the emitted EL light cannot be extracted to the outside sufficiently.

The organic layer 4 is not particularly limited, as long as the organic layer 4 is one usable as an organic layer of an organic EL element. As the organic layer 4, a known organic layer can be used as appropriate. In addition, the organic layer 4 may be a stacked body of various organic thin films, and, for example, may be a stacked body of an anode buffer layer 11, a hole transporting layer 12, and an electron transporting layer 13 as shown in FIG. 13. Here, exampels of materials for the anode buffer layer 11 include copper phthalocyanine, PEDOT, and the like. Meanwhile, examples of material for the hole transporting layer 12 include derivatives of triphenylamine, triphenyldiamine derivatives (TPD), benzidine, pyrazoline, styrylamine, hydrazone, triphenylmethane, carbazole, and the like. In addition, examples of materials for the electron transporting layer 13 include aluminum-quinolinol complex (Alq), phenanthroline derivatives, oxadiazole derivatives, triazole derivatives, phenylquinoxaline derivatives, silole derivatives, and the like. Moreover, the organic layer 4 may be, for example, a stacked body of a hole injecting layer made of a triphenylamine derivative or the like, and a light emitting layer made of a fluorescent organic solid such as anthracene, a stacked body of the light emitting layer and an electron injecting layer made of a perylene derivative or the like, or a stacked body of these hole injecting layer, light emitting layer, and electron injecting layer. Moreover, from the viewpoint of facilitating charge injection or hole injection into the organic layer 4, a layer made of a metal fluoride such as lithium fluoride (LiF) or $Li_2O_3$, a highly active alkaline earth metal such as Ca, Ba, or Cs, an organic insulating material, or the like may be provided on the transparent electrode 3 or the organic layer 4.

In addition, when the organic layer 4 is a stacked body comprising the anode buffer layer 11, the hole transporting layer 12, and the electron transporting layer 13, the thicknesses of the anode buffer layer 11, the hole transporting layer 12, and the electron transporting layer 13 are preferably within a range from 1 to 50 nm, a range from 5 to 200 nm, and a range from 5 to 200 nm, respectively, from the viewpoint of maintaining the shape of the concavities and convexities formed on the surface of the cured resin layer.

A material of the metal electrode 5 is not particularly limited, and a substance having a small work function can be used as appropriate. Examples of the material include aluminum, MgAg, MgIn, and AlLi. In addition, the thickness of the metal electrode 5 is preferably within a range from 50 to 500 nm. If the thickness is less than the lower limit, the electrical conductivity tends to be decreased. Meanwhile, if the thickness exceeds the upper limit, the concave- and convex-shape tends to be difficult to maintain.

Moreover, in the organic EL element of the present invention, the transparent electrode, the organic layer, and the metal electrode are each stacked on the surface of the cured resin layer of the diffraction grating, and formed into such a shape that the shape of the concavities and convexities formed on the surface of the cured resin layer of the diffraction grating is maintained. Hence, stress generated when the organic EL element is bent can be relaxed by the shape of the concavities and convexities formed. For this reason, the organic EL element of the present invention can be suitably used as an organic EL element for flexible displays, flexible lighting apparatuses, and the like, for which flexibility is required.

Figure 14:
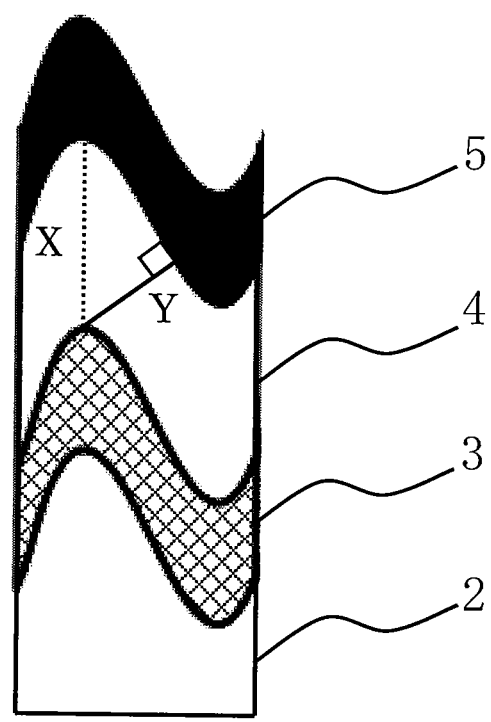
FIG. 14 is a schematic diagram conceptually showing the relationship between the shortest distance and the standard distance between a transparent electrode and a metal electrode.

In addition, in the organic EL element of the present invention, a part of the constituent portion of the organic EL element comprises the above-described diffraction grating of the present invention as described above. Of the above-described diffraction gratings of the present invention, a diffraction grating in which the cured resin layer 2 satisfies the condition represented by the inequality (1) and/or the condition that the kurtosis (k) is −1.2 or more (more preferably −1.2 to 1.2) is more preferably used in the organic EL element, from the viewpoint of more sufficiently suppressing the generation of the leakage current. When a diffraction grating comprising the cured resin layer 2 satisfying the condition (s) is used, the following thing is made possible. Specifically, suppose a case where the transparent electrode 3, the organic layer 4, and the metal electrode 5 maintain the shape of the concavities and convexities formed on the surface of the cured resin layer 2, as it is, as shown in FIG. 14 in the organic EL element (suppose a case where each layer has a thickness uniform in the direction perpendicular to the surface of the transparent electrode substrate). In such a case, regarding an inter-electrode distance between the transparent electrode 3 and the metal electrode 5 in the direction perpendicular to the surface of the transparent electrode substrate (standard distance: the distance represented by X in FIG. 14) and a distance at which an inter-electrode distance between the transparent electrode 3 and the metal electrode 5 is the shortest (the shortest distance: the distance represented by Y in FIG. 14), which are determined on the basis of the concavity and convexity analysis image of the cured resin layer 2, the ratio of measuring points at which the magnitude of the shortest distance Y is a half or less of the standard distance X can be made 0 to 2% relative to all the measuring points for the concavity and convexity analysis. Note that the present inventors have found that such regions where the magnitude of the shortest distance Y is a half or less of the standard distance X are prone to generation of a leakage current. The present inventors have found on the basis of the knowledge that, by making the ratio of the regions in which the magnitude of the shortest distance Y is a half or less of the standard distance X 0 to 2%, the generation of the leakage current can be suppressed sufficiently. Note that, in DESCRIPTION, the ratio of the regions (measuring points) in which the magnitude of the shortest distance Y is a half or less of the standard distance X relative to all the regions (all the measuring points) is referred to as "the ratio of the presence of leakage-current prone regions."

As described above, in the organic EL element of the present invention, the ratio of measuring points at which the magnitude of the shortest distance Y is a half or less of the standard distance X (the ratio of the presence of leakage-current prone regions) relative to all the measuring points in the concavity and convexity analysis image is preferably 0 to 2%, from the viewpoint of sufficiently suppressing the leakage current. Here, the ratio is determined from distribution of the inter-electrode distance, and the distribution of the inter-electrode distance is determined on the basis of a concavity and convexity analysis image obtained by measuring the cured resin layer 2 by employing the same method as the method for measuring the median (M) and the average value (m) of the depth distribution, on the assumption that the transparent electrode 3, the organic layer 4, and the metal electrode 5 maintain the shape of the concavities and convexities formed on the surface of the cured resin layer 2, as it is. Specifically, in the organic EL element of the present invention, the ratio of the presence of the leakage-current prone regions determined from the distribution of the inter-electrode distance between the transparent electrode and the metal electrode is preferably 0 to 2%. Note that, in the measurement of the distribution of the inter-electrode distance, the standard distance X is preferably set (assumed) to be within a range from 30 to 500 nm to meet the actual design, and, for example, the standard distance X is assumed to be 70 nm for an organic EL element in which the thickness of the organic layer in the direction perpendicular to the transparent supporting substrate is 70 nm. Then, the distribution of the shortest distance is calculated on the basis of the concavity and convexity analysis image (SPM image), and the ratio of the regions (leakage-current prone regions) where the shortest distance Y of the inter-electrode distance is a half or less of the standard distance X relative to all the measuring points of the measurement for the concavity and convexity analysis image (SPM image) is calculated. Thus, the ratio of the presence of the leakage-current prone regions can be determined. Note that the calculation of the shortest distance and the ratio of the presence of the leakage-current prone regions can be determined by calculation with a computer on the basis of analysis results of the concavity and convexity analysis image of the cured resin layer 2.

In addition, since each of the transparent electrode, the organic layer, and the metal electrode is stacked in the organic EL element of the present invention, and formed into such a shape that the shape of the concavities and convexities formed on the surface of the cured resin layer is maintained, it is possible to suppress the repetition of multiple reflection of light generated in an organic layer in the element due to total reflection at each interface. In addition, it is also possible to re-emit light which has been totally reflected at an interface between the transparent supporting substrate and the air by a diffraction effect. Moreover, since each of the transparent electrode, the organic layer, and the metal electrode is stacked and formed into such a shape that the shape of the concavities and convexities formed on the surface of the cured resin layer is maintained, the inter-electrode distance between the transparent electrode and the metal electrode is partially short as described above. For this reason, in comparison with those in which the inter-electrode distance between the transparent electrode and the metal electrode is uniform, an increase in electric field intensity can be expected in application of a voltage, and also the light emission efficiency of the organic EL element can be improved. In addition, if a control is made so that the leakage-current prone regions can be 0 to 2%, the leakage current can also be sufficiently prevented, and also the light emission efficiency of the organic EL element can be further improved. As described above, according to the organic EL element of the present invention, it is possible to achieve a sufficient external extraction efficiency. Note that the organic EL element of the present invention can be manufactured by, for example, a method for manufacturing an organic EL element of the present invention described below.

(Method for Manufacturing Organic EL Element)

A method for manufacturing an organic EL element of the present invention is a method for manufacturing an organic EL element, the organic EL element comprising a transparent supporting substrate, a transparent electrode, an organic layer, and a metal electrode, the method comprising:

a diffraction grating formation step comprising a step of applying a curable resin onto a transparent supporting substrate, then curing the curable resin with a master block being pressed thereto, and thereafter detaching the master block, thereby stacking, on the transparent supporting substrate, a cured resin layer having concavities and convexities formed thereon; and a step (organic EL element formation step) of stacking, on the cured resin layer, each of the transparent electrode, the organic layer, and the metal electrode formed into such a shape that a shape of the concavities and convexities formed on the surface of the cured resin layer is maintained, thereby obtaining an organic EL element, wherein the diffraction grating formation step is the above-described method for manufacturing a diffraction grating of the present invention.

The diffraction grating formation step is the above-described method for manufacturing a diffraction grating of the present invention. By this step, a cured resin layer 2 having concavities and convexities formed thereon and having the above-described characteristics is stacked on a transparent supporting substrate 1. In addition, since the diffraction grating formation step is the method for manufacturing a diffraction grating of the present invention, the master block used in the diffraction grating formation step in the method for manufacturing an organic EL element of the present invention is the same as the master block used in the above-described method for manufacturing a diffraction grating of the present invention, and is obtained by any of the above-described methods (A) and (B) for manufacturing a master block.

In the subsequent organic EL element formation step, first, a transparent electrode 3 is stacked on the cured resin layer 2, and formed into such a shape that the shape of the concavities and convexities formed on the surface of the cured resin layer 2 is maintained, as shown in FIG. 13. As a material for the transparent electrode 3, the same materials as those described as the materials for the transparent electrode 3 in the organic EL element of the present invention can be used. In addition, as a method for stacking the transparent electrode 3, a known method such as a vapor deposition method or a sputtering method can be employed as appropriate. Of these methods, a vapor deposition method is preferably employed from the viewpoint of maintaining the shape of the concavities and convexities formed on the surface of the cured resin layer.

In addition, in the organic EL element formation step, next, an organic layer 4 is stacked on the transparent electrode 3, and formed into such a shape that the shape of the concavities and convexities formed on the surface of the cured resin layer 2 is maintained, as shown in FIG. 13. As the kind and material of the organic layer 4, the same kind and material as those described for the organic layer in the organic EL element of the present invention can be used. For example, the organic layer 4 may be a stacked body of an anode buffer layer 11, a hole transporting layer 12, and an electron transporting layer 13, as shown in FIG. 13. Meanwhile, as a method for stacking the organic layer 4, a known method such as a vapor deposition method or a sputtering method can be employed as appropriate. Of these methods, a vapor deposition method is preferably employed from the viewpoint of maintaining the shape of the concavities and convexities formed on the surface of the cured resin layer.

In the organic EL element formation step, subsequently, a metal electrode 5 is stacked on the organic layer 4 and formed into such a shape that the shape of the concavities and convexities formed on the surface of the cured resin layer 2 is maintained, as shown in FIG. 13. As a material for the metal electrode 5, the same materials as those described as the materials for the metal electrode 5 in the organic EL element of the present invention can be used. In addition, as a method for stacking the metal electrode 5, a known method such as a vapor deposition method or a sputtering method can be employed as appropriate. Of these methods, a vapor deposition method is preferably employed from the viewpoint of maintaining the shape of the concavities and convexities formed on the surface of the cured resin layer.

According to the method for manufacturing an organic EL element of the present invention as described above, it is possible to manufacture an organic EL element having a sufficiently low wavelength-dependence and a sufficiently low directivity. In addition, each of the transparent electrode 3, the organic layer 4, and the metal electrode 5 is stacked in the organic EL element obtained by the method for manufacturing an organic EL element of the present invention, and formed into such a shape that the shape of the concavities and convexities formed on the surface of the cured resin layer 2 is maintained. Hence, it is possible to sufficiently suppress the repetition of multiple reflection of light generated in the organic layer 4 in the element due to total reflection at each interface. In addition, it is also possible to re-emit light which has been totally reflected at an interface between the transparent supporting substrate and the air by a diffraction effect. Moreover, since each of the transparent electrode 3, the organic layer 4, and the metal electrode 5 is stacked while having such a shape that the shape of the concavities and convexities formed on the surface of the cured resin layer 2 is maintained, the inter-electrode distance between the transparent electrode 3 and the metal electrode 5 is partially short. For this reason, in comparison with those in which the inter-electrode distance between the transparent electrode 3 and the metal electrode 5 is uniform, an increase in electric field intensity can be expected in application of a voltage, and also the light emission efficiency of the organic EL element can be improved. In addition, when the leakage-current prone regions determined on the basis of the distribution of the shortest inter-electrode distance between the transparent electrode 3 and the metal electrode 5 are 0 to 2%, the leakage current can be prevented sufficiently, and also the light emission efficiency of the organic EL element can further be improved. As described above, according to the method for manufacturing an organic EL element of the present invention, it is also possible to achieve a sufficient external extraction efficiency.

EXAMPLES

Hereinafter, the present invention will be described more specifically on the basis of Examples and Comparative Examples. However, the present invention is not limited to Examples below.

Note that, in the following Examples and Comparative Examples, for obtaining concavity and convexity analysis images of concave- and convex-shapes formed on surfaces of cured resin layers, master blocks, and the like, the concave- and convex-shapes were analyzed by use e of an atomic force micros cope (a scanning probe micros cope equipped with an environment control unit "Nanonavi II Station/E-sweep" manufactured by SII NanoTechnology Inc.) under the following analysis conditions.
<Analysis Conditions>
Measurement mode: dynamic force mode
Cantilever: SI-DF40 (material: Si, lever width: 40 μm, diameter of tip of chip: 10 nm)
Measurement atmosphere: in air
Measurement temperature: 25° C.

In addition, in some Examples and Comparative Examples, resins described below were used as the resins for the block copolymers or the like. Note that the volume ratio of the first and second polymer segments (the first polymer segment:the second polymer segment) in each block copolymer was calculated on the assumption that the density of polystyrene (PS) was 1.05 g/cm$^3$, the density of polymethyl methacrylate (PMMA) was 1.19 g/cm$^3$, and the density of polyisoprene (PIP) was 0.913 g/cm$^3$. Moreover, the number average molecular weights (Mn) and the weight average molecular weights (Mw) of polymer segments and polymers were measured by gel permeation chromatography (Model No: "GPC-8020" manufactured by Tosoh Corporation, in which TSK-GEL SuperH1000, SuperH2000, SuperH3000, and SuperH4000 were connected in series). Meanwhile, the glass transition temperatures (Tg) of polymer segments were measured by use of a differential scanning calorimeter (manufactured by Perkin-Elmer under the product name of "DSC7"), while the temperature was raised at a rate of temperature rise of 20° C./min over a temperature range from 0 to 200° C. In addition, the solubility parameters of PS, PMMA, and PIPare 9.0, 9.3, and 8.1, respectively (see Kagaku Binran Ouyou Hen (Handbook of Chemistry, Applied Chemistry), 2nd edition).

<Block Copolymer (P-1)>

A block copolymer of PS and PMMA manufactured by Polymer Source Inc, Mn of the PS segment=1,600,000, Mn of the PMMA segment=1,300,000, Mn of the block copolymer of PS and PMMA=2900000, the volume ratio between the PS segment and the PMMA segment (PS:PMMA)=58:42, the molecular weight distribution (Mw/Mn)=1.20, Tg of the PS segment=98° C., and Tg of the PMMA segment=110° C.

<Block Copolymer (P-2)>

A block copolymer of PS and PMMA manufactured by Polymer Source Inc, Mn of the PS segment=868,000, Mn of the PMMA segment=857,000, Mn of the block copolymer of PS and PMMA=1720000, the volume ratio between the PS segment and the PMMA segment (PS:PMMA)=53:47, the molecular weight distribution (Mw/Mn)=1.30, Tg of the PS segment=96° C., and Tg of the PMMA segment=110° C.

<Block Copolymer (P-3)>

A block copolymer of PS and PMMA manufactured by Polymer Source Inc, Mn of the PS segment=328,000, Mn of the PMMA segment=173,000, Mn of the block copolymer of PS and PMMA=501000, the volume ratio between the PS segment and the PMMA segment (PS:PMMA)=68:32, the molecular weight distribution (Mw/Mn)=1.09, Tg of the PS segment=97° C., and Tg of the PMMA segment=108° C.

<Block Copolymer (P-4)>

A block copolymer of PS and PIP manufactured by Polymer Source Inc, Mn of the PS segment=700,000, Mn of the PIP segment=850,000, Mn of the block copolymer of PS and PIP=1550000, the volume ratio between the PS segment and the PIP segment (PS:PIP)=42:58, the molecular weight distribution (Mw/Mn)=1.15, Tg of the PS segment=100° C., and Tg of the PIP segment was immeasurable because the Tg was 0° C. or below (−60 to −70° C. according to literature).

<Random Copolymer>

A random copolymer of PS and PMMA manufactured by Polymer Source Inc, Mn of the random copolymer=3,500, the molecular weight distribution (Mw/Mn)=1.56, and the styrene content=57% by mol.

<Block Copolymer (P-5)>

A block copolymer of PS and PMMA manufactured by Polymer Source Inc, Mn of the PS segment=650,000, Mn of the PMMA segment=572,000, Mn of the block copolymer of PS and PMMA=1220000, the volume ratio between the PS segment and the PMMA segment (PS:PMMA)=56:44, the molecular weight distribution (Mw/Mn)=1.25, Tg of the PS segment=107° C., and Tg of the PMMA segment=125° C.

<Block Copolymer (P-6)>

A block copolymer of PS and PMMA manufactured by Polymer Source Inc, Mn of the PS segment-400,000, Mn of the PMMA segment=380,000, Mn of the block copolymer of PS and PMMA=780000, the volume ratio between the PS segment and the PMMA segment (PS:PMMA)=54:46, the molecular weight distribution (Mw/Mn)=1.35, Tg of the PS segment=108° C., and Tg of the PMMA segment=125° C.

<Block Copolymer (P-7)>

A block copolymer of PS and PMMA manufactured by Polymer Source Inc, Mn of the PS segment=270,000, Mn of the PMMA segment=287,000, Mn of the block copolymer of PS and PMMA=557000, the volume ratio between the PS segment and the PMMA segment (PS:PMMA)=52:48, the molecular weight distribution (Mw/Mn)=1.18, Tg of the PS segment=110° C., and Tg of the PMMA segment=124° C.

<Comparative Block Copolymer (CP-1)>

A block copolymer of PS and PMMA manufactured by Polymer Source Inc, Mn of the PS segment=133,000, Mn of the PMMA segment=130,000, Mn of the block copolymer of PS and PMMA=263000, the volume ratio between the PS segment and the PMMA segment (PS:PMMA)=54:46, the molecular weight distribution (Mw/Mn)=1.15, Tg of the PS segment=110° C., and Tg of the PMMA segment=124° C.

<Comparative Block Copolymer (CP-2)>

A block copolymer of PS and PMMA manufactured by Polymer Source Inc, Mn of the PS segment=50,700, Mn of the PMMA segment=47,600, Mn of the block copolymer of PS and PMMA=98300, the volume ratio between the PS segment and the PMMA segment (PS:PMMA)=55:45, the molecular weight distribution (Mw/Mn)=1.13, Tg of the PS segment=110° C., and Tg of the PMMA segment=120° C.

<Homopolymer (A)>

A PMMA homopolymer manufactured by Polymer Source Inc, Mn of the homopolymer=46,000, and the molecular weight distribution (Mw/Mn)=1.80.

<Homopolymer (B)>

Polyethylene oxide (PEO) manufactured by Tokyo Chemical Industry Co., Ltd. under the trade name of "Polyethylene Glycol 4000", Mw of the homopolymer=3000, and the molecular weight distribution (Mw/Mn)=1.10.

Fabrication Example 1

First, a silicone-based polymer [a resin composition of a mixture of 90% by mass of a silicone rubber (manufactured by Wacker Chemie AG under the product name of "Elastosil RT601") and 10% by mass of a curing agent] was applied onto a base member (material: glass, size: 20 mm×12 mm) by a spin coating method, and cured by being heated at 100° C. for 1 hour. Thus, a silicone-based polymer film was formed.

Next, an aluminum vapor-deposition film (thickness: 10 nm) was formed on the silicone-based polymer film by a vapor deposition method under conditions of a temperature of 100° C. and a pressure of $1\times10^{-3}$ Pa. Then, after cooling to room temperature (25° C.) over a period of 30 minutes, the pressure was returned to the atmospheric pressure ($1.013\times10^5$ Pa). Consequently, concavities and convexities were formed on a surface of the aluminum vapor-deposition film formed on the silicone-based polymer film. Subsequently, a silicone-based polymer [a resin composition of a mixture of 90% by mass of a silicone rubber (manufactured by Wacker Chemie AG under the product name of "Elastosil RT601") and 10% by mass of a curing agent] was applied onto the aluminum vapor-deposition film by a dropping method, then cured by being heated at 100° C. for hour, and thereafter detached from the aluminum vapor-deposition film. Thus, Master Block (M-1B) was obtained.

Then, an aluminum vapor-deposition film (thickness: 10 nm) was formed on Master Block (M-1B) having concavities and convexities formed on the surface thereof, by a vapor deposition method under conditions of a temperature of 100° C. and a pressure of $1\times10^{-3}$ Pa. Then, after cooling to room temperature (25° C.) over a period of 30 minutes, the pressure was returned to the atmospheric pressure ($1.013\times10^5$ Pa). Consequently, concavities and convexities were formed on a surface of the aluminum vapor-deposition film formed on Master Block (M-1B). Subsequently, a silicone-based polymer [a resin composition of a mixture of 90% by mass of a silicone rubber (manufactured by Wacker Chemie AG under the product name of "Elastosil RT601") and 10% by mass of a curing agent] was applied onto the aluminum vapor-deposition film by a dropping method, then cured by being heated at 100° C. for hour, and thereafter detached from the aluminum vapor-deposition film. Thus, Master Block (M-2B) was obtained. Moreover, an aluminum vapor-deposition film (thickness: 10 nm) was formed on Master Block (M-2B) having concavities and convexities formed on a surface thereof by a vapor deposition method under conditions of a temperature of 100° C. and a pressure of 1×10$^{-3}$ Pa. Then, after cooling to room temperature (25° C.) over a period of 30 minutes, the pressure was returned to the atmospheric pressure (1.013×10$^5$ Pa). Consequently, concavities and convexities were formed on a surface of the aluminum vapor-deposition film formed on Master Block (M-2B). Subsequently, a silicone-based polymer [a resin composition of a mixture of 90% by mass of a silicone rubber (manufactured by Wacker Chemie AG under the product name of "Elastosil RT601") and 10% by mass of a curing agent] was applied onto the aluminum vapor-deposition film by a dropping method, then cured by being heated at 100° C. for hour, and thereafter detached from the aluminum vapor-deposition film. Thus, Master Block (M-3B) was obtained.

Fabrication Example 2

First, an azobenzene polymer was applied in a film thickness of 0.8 μm onto a base member (material: glass, size: 15 mm×12 mm) by a spin coating method. Thus, an azobenzene polymer film was formed. Then, argon laser light was diffracted with a surface relief-type diffraction grating, and the surface of the azobenzene polymer film was irradiated with the diffracted light. Next, the diffraction grating was rotated by 120°, then laser light was diffracted, and the azobenzene polymer film was irradiated with the diffracted light. Subsequently, the diffraction grating was further rotated by 120°, then laser light was diffracted, and the azobenzene polymer film was irradiated with the diffracted light. Thus, concavities and convexities were formed on the surface of the azobenzene polymer film in a periodic arrangement.

Next, a silicone rubber (manufactured by Wacker Chemie AG under the product name of "Elastosil RT601") was applied onto the azobenzene polymer film by a dropping method, then cured by being heated at 50° C. for 1 hour, and thereafter detached from the azobenzene polymer film. Thus, Master Block (M-4B) was obtained.

Example 1

(i) Fabrication of Diffraction Grating

A glass substrate 1 (manufactured by Matsunami Glass Ind., Ltd. under the product name of "Micro slide glass") and a curable resin 2' (manufactured by Norland Optical Adhesive under the product name of "NOA 61") were prepared. Then, the curable resin 2' was applied onto the glass substrate 1. Thereafter, the curable resin 2' was cured by irradiation with ultraviolet rays for 1 hour, with Master Block (M-3B) obtained in Fabrication Example 1 being pressed thereto (see FIGS. 2 and 3). Then, Master Block (M-3B) was detached from the cured resin layer 2, and thereby the cured resin layer 2 having concavities and convexities formed thereon was formed on the glass substrate 1. Thus, a diffraction grating was obtained (see FIG. 4).

Figure 15:
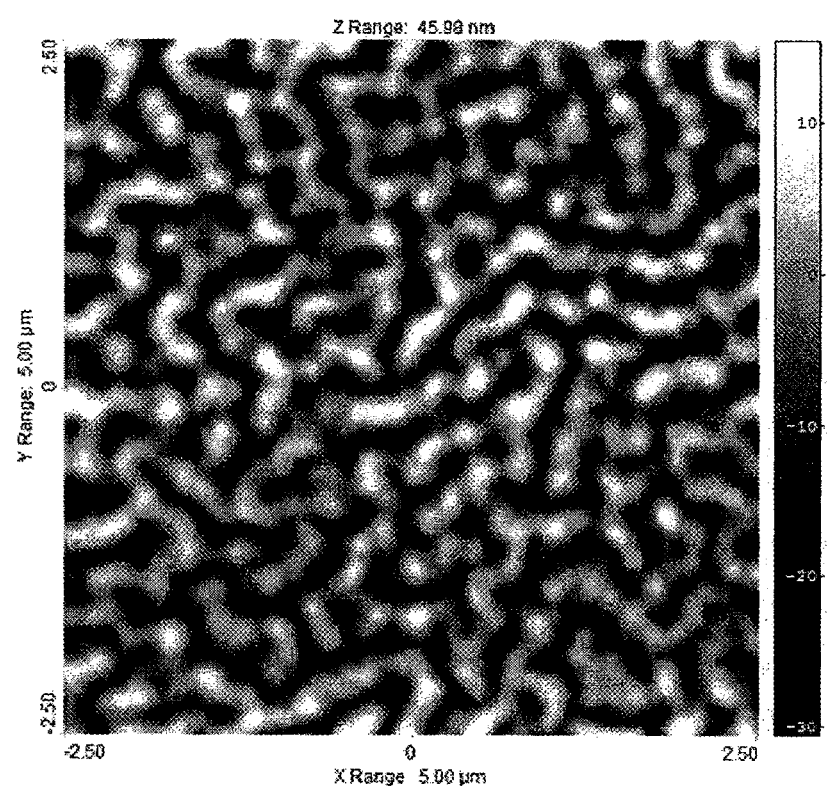
FIG. 15 is a photograph showing a concavity and convexity analysis image, in which a result of analysis conducted on a surface of a diffraction grating obtained in Example 1 by use of an atomic force microscope is displayed on a display.

A concavity and convexity analysis image was obtained by analyzing the shape of the concavities and convexities formed on the surface of the cured resin layer in the obtained diffraction grating by use of an atomic force microscope (a scanning probe microscope equipped with an environment control unit "Nanonavi II Station/E-sweep" manufactured by SII Nano-Technology Inc.). FIG. 15 shows the obtained concavity and convexity analysis image. Note that, when the average height was calculated by determining heights at randomly selected 100 points on the basis of a concavity and convexity analysis image measured from the concavity and convexity analysis image, the average height of the concavities and convexities formed on the surface of the cured resin layer 2 was 75 nm. Note that, in the following Examples and the like, a value calculated by determining the heights or the distances at randomly selected 100 points on the basis of a concavity and convexity analysis image is employed as the average height or the average pitch of the concavities and convexities.

Figure 16:
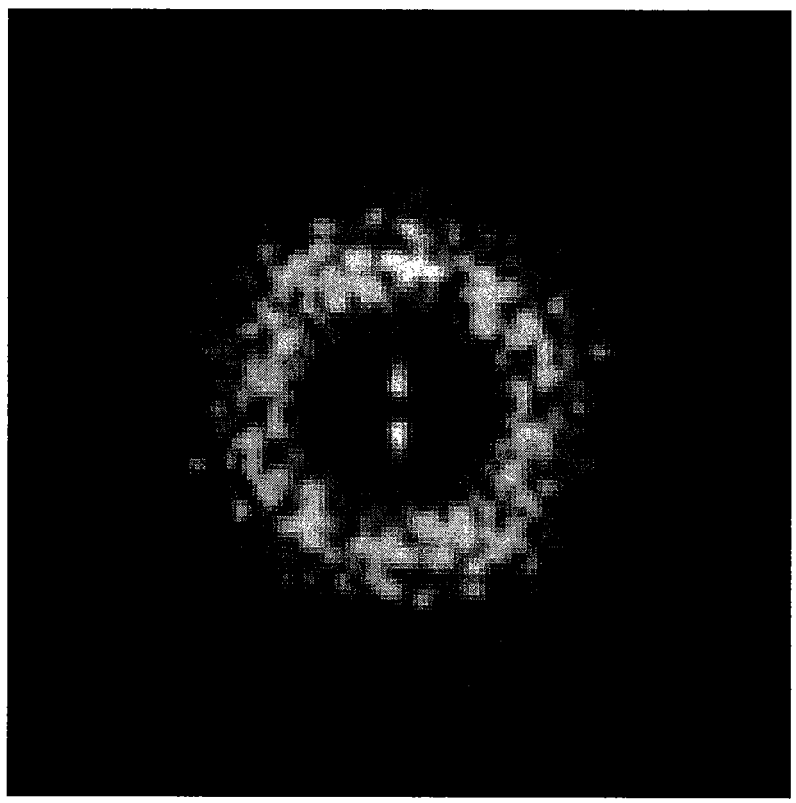
FIG. 16 is a photograph showing a Fourier-transformed image, in which a result of two-dimensional fast Fourier transform processing conducted on the concavity and convexity analysis image, which was obtained by use of the atomic force microscope, of the surface of the diffraction grating obtained in Example 1 is displayed on a display.

In addition, the obtained concavity and convexity analysis image was subjected to a flattening process including primary inclination correction, and then to two-dimensional fast Fourier trans form processing. Thus, a Fourier-transformed image was obtained. FIG. 16 shows the obtained Fourier-transformed image. Note that the length and the width of the Fourier-transformed image shown in FIG. 16 are each 25.6 μm$^{-1}$. As is apparent from the result shown in FIG. 16, it was shown that the Fourier-transformed image showed an annular pattern substantially centered at an origin at which an absolute value of wavenumber was 0 μm$^{-1}$, and that the annular pattern was present within a region where an absolute value of wavenumber was within a range from 1.25 to 5 μm$^{-1}$.

(ii) Fabrication of Organic EL Element

On the cured resin layer 2 of the obtained diffraction grating, a transparent electrode 3 (ITO, thickness: 120 nm), a hole transporting layer 12 [N,N'-diphenyl-N,N'-bis(3-methylphenyl)-1,1'-diphenyl-4,4'-diamine, thickness: 40 nm], an electron transporting layer 13 (8-hydroxyquinoline aluminum, thickness: 30 nm), a lithium fluoride layer (thickness: 1.5 nm), and a metal electrode 5 (aluminum, thickness: 150 nm) were each stacked by a vapor deposition method, and formed into such a shape that the shape of the concavities and convexities formed on the surface of the cured resin layer 2 was maintained. Thus, an organic EL element was obtained (see FIG. 13).

Comparative Example 1

An organic EL element for comparison was obtained in the same manner as in Example 1, except that Master Block (M-3B) obtained in Fabrication Example 1 was not used, and hence no concavities and convexities were formed on the cured resin layer.

Comparative Example 2

A diffraction grating for comparison was obtained in the same manner as in Example 1, except that Master Block (M-4B) obtained in Fabrication Example 2 was used instead of Master Block (M-3B) obtained in Fabrication Example 1. Note that the concavities and convexities formed on the surface of the cured resin layer 2 were arranged two-dimensionally periodically. The pitch of the concavities and convexities was 500 nm, and the average height of the concavities and convexities was 50 nm. In addition, on the cured resin layer 2 of the obtained diffraction grating, a transparent electrode 3 (gold, thickness: 30 nm), an anode buffer layer 11 (copper phthalocyanine, thickness: 10 nm), a hole transporting layer 12 [N,N'-diphenyl-N,N'-bis(3-methylphenyl)-1,1'-diphenyl-4,4'-diamine, thickness: 40 nm], an electron transporting layer 13 (8-hydroxyquinoline aluminum, thickness: 60 nm), a lithium fluoride layer (thickness: 1 nm), and a metal electrode 5 (aluminum, thickness: 150 nm) were each stacked by a vapor deposition method, and formed into such a shape that the shape of the concavities and convexities formed on the surface of the cured resin layer 2 was maintained. Thus, an organic EL element for comparison was obtained.

Comparative Example 3

An organic EL element for comparison was obtained in the same manner as in Comparative Example 2, except that Master Block (M-4B) obtained in Fabrication Example 2 was not used, and hence no concavities and convexities were formed on the cured resin layer.

Comparative Example 4

A diffraction grating for comparison was obtained in the same manner as in Example 1, except that a one-dimensional diffraction grating (the pitch of the concavities and convexities: 380 nm, the average height of the concavities and convexities: 65 nm) was used as the master block instead of Master Block (M-3B) obtained in Fabrication Example 1. Note that the concavities and convexities formed on the surface of the cured resin layer 2 were arranged one-dimensionally periodically, the pitch of the concavities and convexities was 380 nm, and the average height of the concavities and convexities was 60 nm. In addition, on the cured resin layer 2 of the obtained diffraction grating, a transparent electrode 3 (ITO, thickness: 200 nm), a hole transporting layer 12 [poly (3,4-ethylenedioxythiophene)/poly(4-styrenesulfon ate)), thickness: 20 nm], an electron transporting layer 13[poly[2-methoxy-5-(2'-ethylhexyloxy)-1,4-(1-cyanovin ylene)phenylene], thickness: 100 nm], a lithium fluoride layer (thickness: 1 nm), and a metal electrode 5 (aluminum, thickness: 150 nm) were each stacked by a vapor deposition method, and formed into such a shape that the shape of the concavities and convexities formed on the surface of the cured resin layer 2 was maintained. Thus, an organic EL element for comparison was obtained.

Comparative Example 5

An organic EL element for comparison was obtained in the same manner as in Comparative Example 4, except that the one-dimensional diffraction grating was not used as the master block, and hence no concavities and convexities were formed on the cured resin layer.

Figure 17:
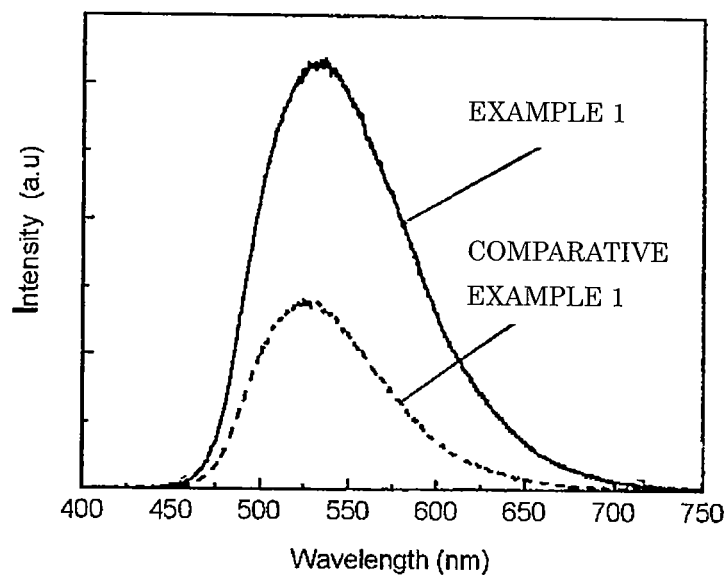
FIG. 17 is a graph showing emission spectra of organic EL elements obtained in Example 1 and Comparative Example 1.
Figure 18:
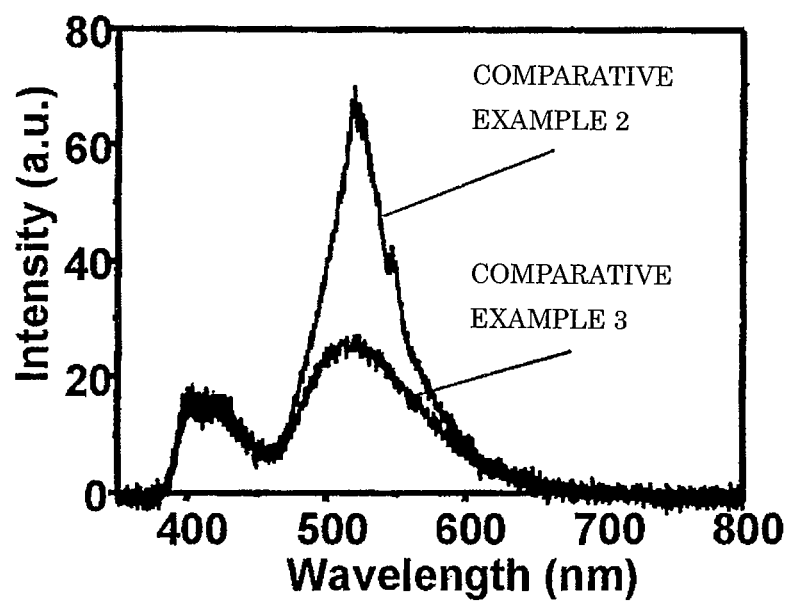
FIG. 18 is a graph showing emission spectra of organic EL elements obtained in Comparative Example 2 and Comparative Example 3.
Figure 19:
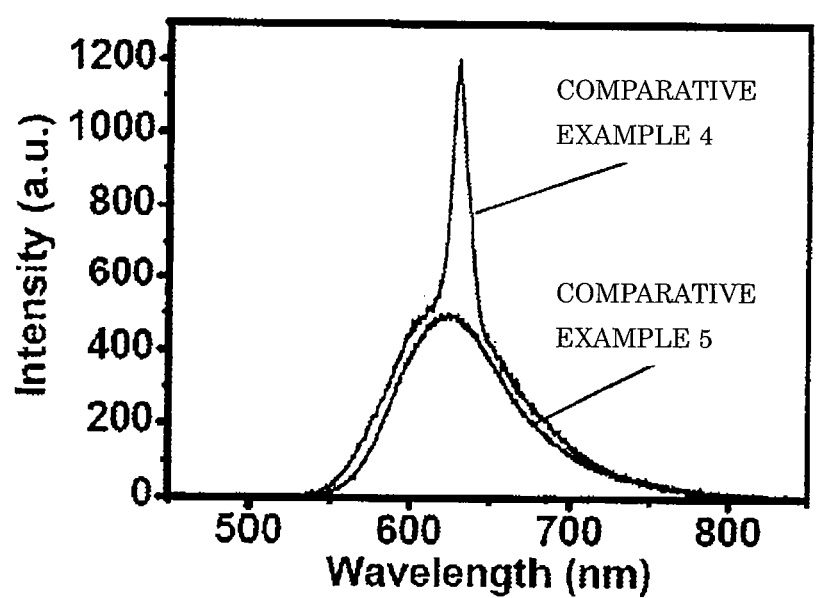
FIG. 19 is a graph showing emission spectra of organic EL elements obtained in Comparative Example 4 and Comparative Example 5.

<Evaluation of Characteristics of Organic EL Elements Obtained in Example 1 and Comparative Examples 1 to 5>
(i) Evaluation of Wavelength-Dependence Emission spectra of the organic EL elements obtained in Example 1 and Comparative Examples 1 to 5 were measured. Note that the emission spectra were measured as follows. Specifically, while a voltage of 10 V was applied to the organic EL element obtained in each of Example 1 and Comparative Examples 1 to 5, an emission spectrum analysis was conducted with a spectrometer (manufactured by Ocean Optics, Inc., under the product name of "USB-2000") placed at a distance 7 cm away from the element. FIG. 17 shows the results obtained for Example 1 and Comparative Example 1. Meanwhile, FIG. 18 shows the results obtained for Comparative Examples 2 and 3. Moreover, FIG. 19 shows the results obtained for Comparative Examples 4 and 5. As is apparent from the results shown in FIGS. 17 to 19, it was shown that the organic EL element (Example 1) of the present invention had almost the same emission wavelength region as that of the organic EL element (Comparative Example 1) having no concavities and convexities, and the wavelength-dependence of light emission of the organic EL element (Example 1) of the present invention was sufficiently low. In contrast, it was shown that the emission wavelength region was narrower in the cases (Comparative Examples 2 and 4) where the concavities and convexities were formed on the surface of the cured resin layer in a periodic arrangement than in the cases of the organic EL elements (Comparative Examples 3 and 5) having no concavities and convexities.

(ii) Evaluation of Directivity

The directivity of each of the organic EL elements obtained in Example 1 and Comparative Examples 2 and 4 was evaluated by the following method. Specifically, the organic EL element was visually observed in all the directions (directions of all around 360°). Neither particularly bright sites nor particularly dark sites were observed when the organic EL element obtained in Example 1 was observed in any of the directions all around 360°, and the brightness was uniform in all the directions. In this way, it was shown that the directivity of light emission of the organic EL element (Example 1) of the present invention was sufficiently low. In contrast, it was shown that the organic EL element obtained in Comparative Example 4 tended to be particularly bright when observed in a specific direction, and tended to be particularly dark when observed in a direction perpendicular to the specific direction. In addition, observation of the organic EL element obtained in Comparative Example 2 in the directions all around 360° showed that the brightness and the darkness were switched six times in total.

(iii) Evaluation of Light Emission Efficiency

A light emission efficiency of the organic EL element obtained in each of Example 1 and Comparative Example 1 was measured by the following method. Specifically, a voltage was applied to the organic EL element, and then the applied voltage (V) and a current (I) flowing through the organic EL element were measured with a measuring instrument (manufactured by Keithley Instruments Inc., model No: 2400), and a light emission luminance (L) was measured with a luminance meter (manufactured by Konica Minolta Sensing, Inc., under the product name of "LS-100"). From the thus obtained measurements of the applied voltage (V), the current (I), and the light emission luminance (L), a current efficiency and a power efficiency were calculated. Here, for the current efficiency, the following calculation formula (F1) was used:

$$(\text{Current efficiency}) = \{L \div (L/I)\} \quad (F1)$$

and, for the power efficiency, the following calculation formula (F2) was used:

$$(\text{power efficiency}) = \{L \div (L/I/V)\} \quad (F2).$$

Figure 20:
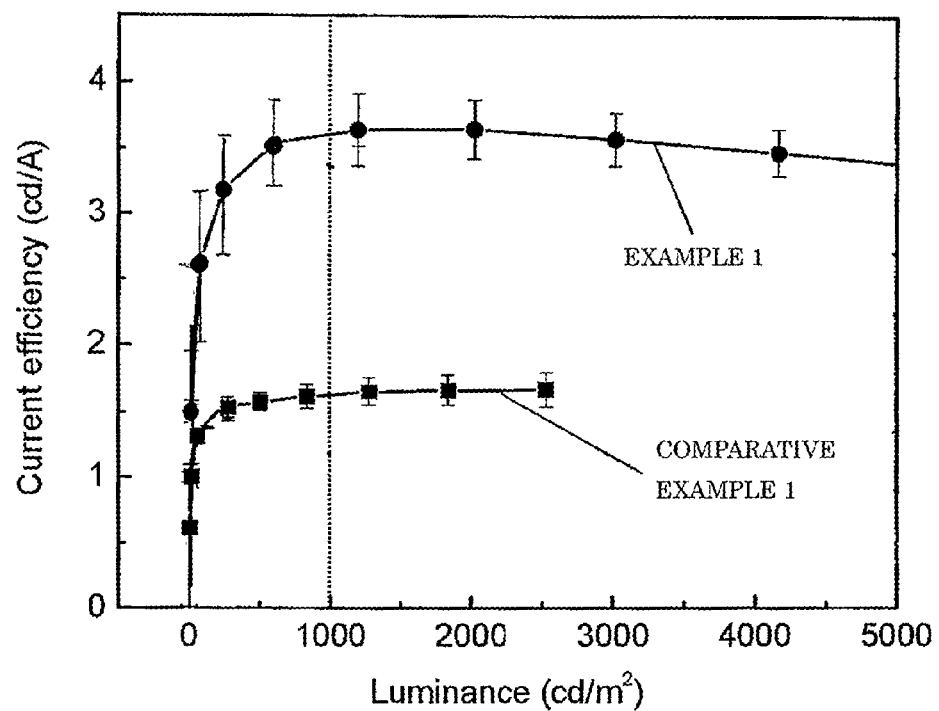
FIG. 20 is a graph showing the relationship between the current efficiency and the luminance of the organic EL elements obtained in Example 1 and Comparative Example 1.
Figure 21:
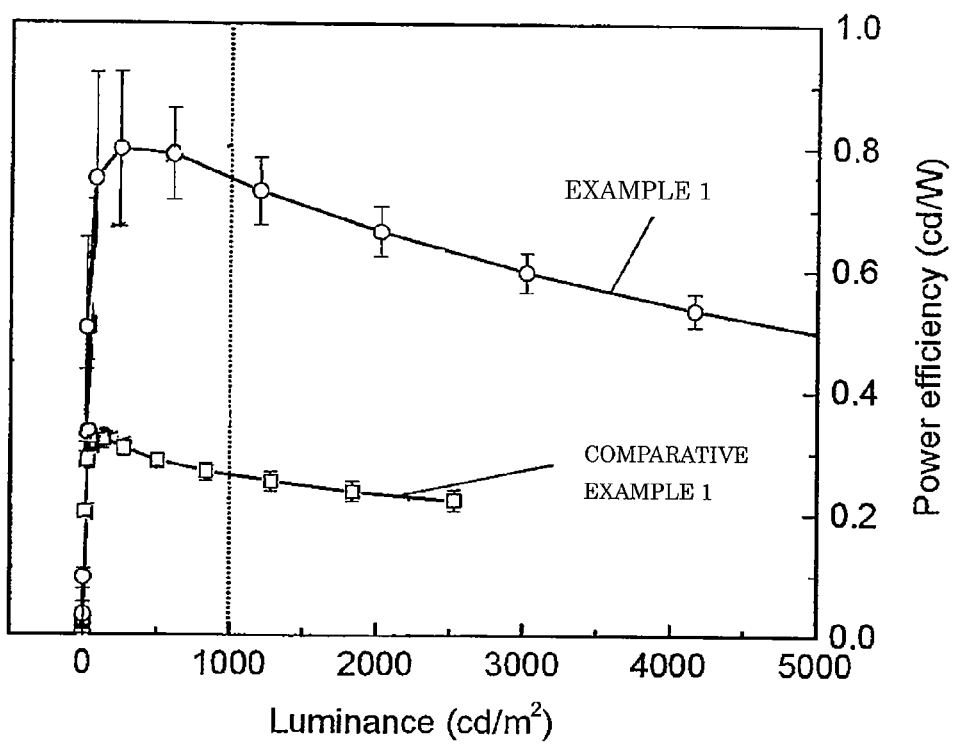
FIG. 21 is a graph showing the relationship between the voltage efficiency and the luminance of the organic EL elements obtained in Example 1 and Comparative Example 1.

FIG. 20 shows the relationship between the current efficiency and the luminance. In addition, FIG. 21 shows the relationship between the voltage efficiency and the luminance. As is apparent from the results shown in FIGS. 20 and 21, it was shown that the current efficiency and the voltage efficiency at an luminance of 1000 cd/m² of the organic EL element (Example 1) of the present invention were 2.2 times and 2.9 times greater than those of the organic EL element (Comparative Example 1) having no concavities and convexities, respectively, indicating that the organic EL element (Example 1) of the present invention had a sufficient external extraction efficiency.

Example 2

A block copolymer solution was obtained by dissolving 99 mg of Block Copolymer (P-2) in 10 g of toluene, followed by filtration through a membrane filter having a pore diameter of 0.45 μm. The obtained block copolymer solution was spin coated onto a polyethylene naphthalate film (manufactured by Tejin DuPont Films Japan Limited) serving as a base member at a spin speed of 800 rpm. Then, the coating film was dried on a hot plate of 55° C. for 10 minutes, and subsequently subjected to an annealing treatment in a vacuum oven of 130° C. for 24 hours. Thus, First Master Block (M-1A) having concavities and convexities formed on a surface thereof due to micro phase separation was obtained.

Figure 22:
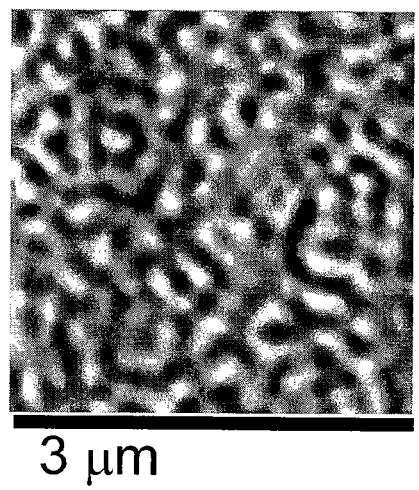
FIG. 22 is a photograph showing a concavity and convexity analysis image, in which a result of analysis conducted on a surface of a first master block obtained in Example 1 by use of a scanning probe microscope is displayed on a display.
Figure 23:
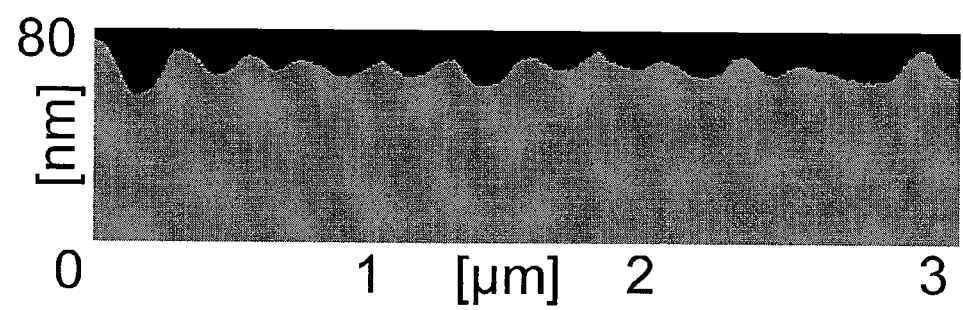
FIG. 23 is a photograph showing a sectional concavity and convexity analysis image, in which a result of analysis conducted on a section of the first master block obtained in Example 2 by use of the scanning probe microscope is displayed on a display.
Figure 24:
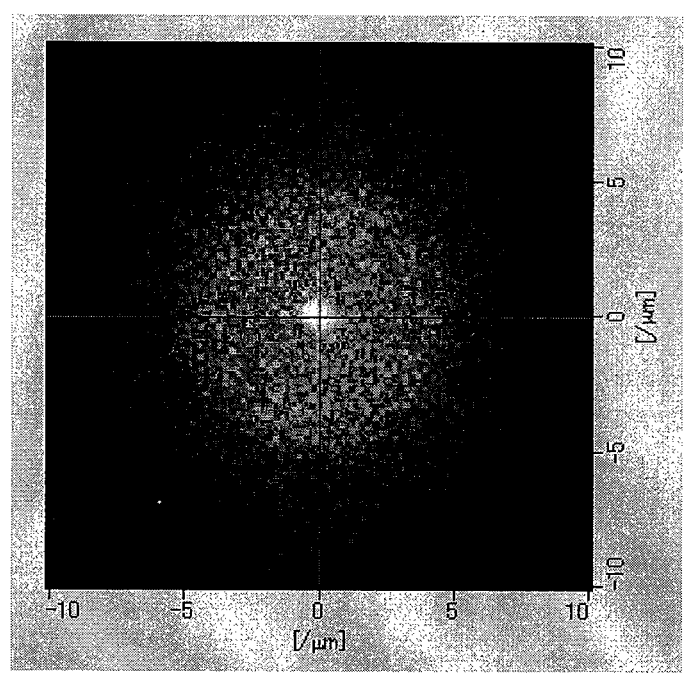
FIG. 24 is a photograph showing a Fourier-transformed image, in which a result of two-dimensional fast Fourier transform processing conducted on the concavity and convexity analysis image, which was obtained by use of the atomic force microscope, of a surface of a diffraction grating obtained in Example 2 is displayed on a display.

A concavity and convexity analysis image of the obtained master block was obtained by analyzing the shape of the concavities and convexities formed on the surface by use of an atomic force microscope (a scanning probe microscope equipped with an environment control unit "Nanonavi II Station/E-sweep" manufactured by SII NanoTechnology Inc.). FIG. 22 shows the obtained concavity and convexity analysis image. In addition, FIG. 23 shows an obtained sectional concavity and convexity analysis image. In addition, the obtained concavity and convexity analysis image was subjected to a flattening process including primary inclination correction, and then to two-dimensional fast Fourier transform processing. Thus, a Fourier-transformed image was obtained. FIG. 24 shows the obtained Fourier-transformed image. As is apparent from the result shown in FIG. 24, it was shown that the Fourier-transformed image showed a circular pattern substantially centered at an origin at which an absolute value of wavenumber was 0 $\mu m^{-1}$, and that the circular pattern was present within a region where an absolute value of wavenumber was within a range of 10 $\mu m^{-1}$ or less. In addition, Master Block (M-1A) had an average pitch of the concavities and convexities of 280 nm, and an average height of the concavities and convexities of 5 nm.

Moreover, the thickness of the coating film made of Block Copolymer (P-2) in the obtained master block was measured by use of a step measuring instrument (manufactured by Kosaka Seisakusho under the product name of "SURF-COATER ET-4000A"). As a result, the thickness of the coating film was 104 nm.

Figure 25:
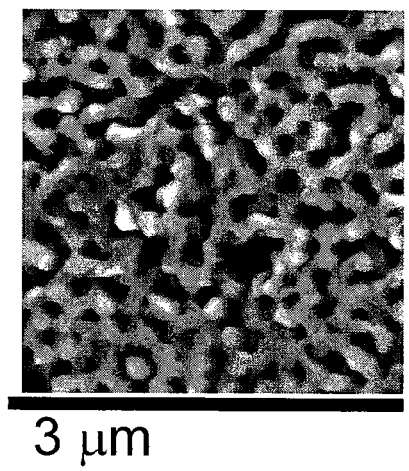
FIG. 25 is a photograph showing a concavity and convexity analysis image, in which a result of analysis conducted on a surface of a first master block obtained in Example 2 after an etching treatment by use of a scanning probe microscope is displayed on a display.
Figure 26:
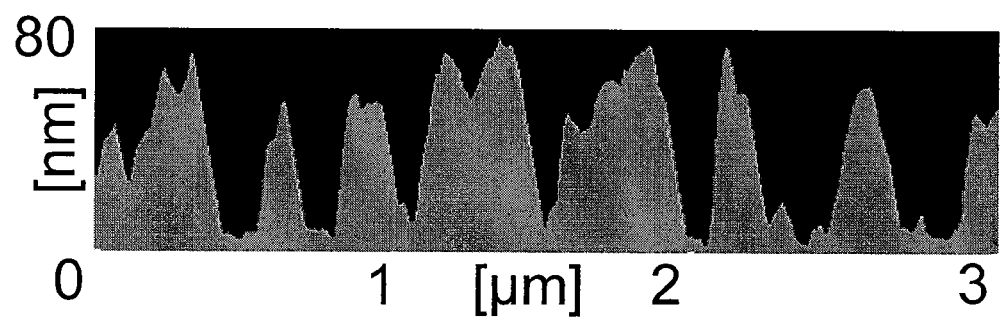
FIG. 26 is a photograph showing a sectional concavity and convexity analysis image, in which a result of analysis conducted on a section of the first master block obtained in Example 2 after the etching treatment by use of the scanning probe microscope is displayed on a display.

The coating film of the obtained Master Block (M-1A) was irradiated with ultraviolet rays at an irradiation intensity of 12 $J/cm^2$ by use of a high pressure mercury lamp, and then subjected to ultrasonic cleaning in acetic acid. Thus, First Master Block (M-2A) subjected to an etching treatment by which PMMA was selectively removed was obtained. A concavity and convexity analysis image of the obtained master block was obtained by analyzing the shape of the concavities and convexities formed on the surface by use of a scanning probe microscope (manufactured by SII NanoTechnology Inc., under the product name of "E-sweep"). FIG. 25 shows the obtained concavity and convexity analysis image. In addition, FIG. 26 shows an obtained sectional concavity and convexity analysis image. As is apparent from the result shown in FIGS. 22, 23, 25 and 26, it was shown that the etching treatment deepened the shape of the concavities and convexities formed on the surface. Note that Master Block (M-2A) had an average pitch of the concavities and convexities of 280 nm and an average height of the concavities and convexities of 55 nm.

Figure 27:
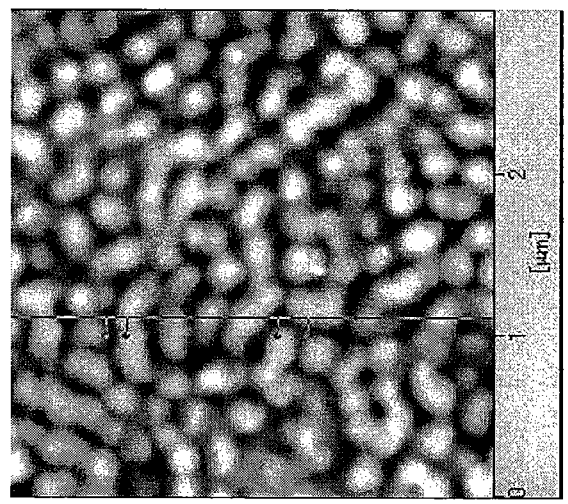
FIG. 27 is a photograph showing a concavity and convexity analysis image, in which a result of analysis conducted on a surface of a second master block obtained in Example 2 by use of a scanning probe microscope is displayed on a display.
Figure 28:
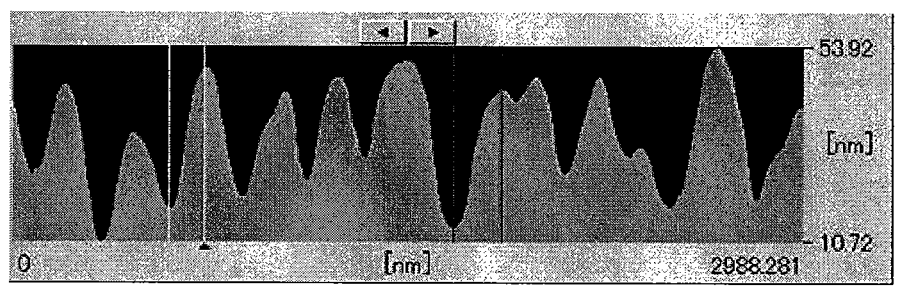
FIG. 28 is a photograph showing a sectional concavity and convexity analysis image, in which a result of analysis conducted on a section of the second master block obtained in Example 2 by use of the scanning probe microscope is displayed on a display.

A silicone-based polymer [a resin composition of a mixture of 90% by mass of a silicone rubber (manufactured by Wacker Chemie AG under the product name of "Elastosil RT601") and 10% by mass of a curing agent] was applied onto the obtained Master Block (M-2A) by a dropping method, then cured by being heated at 50° C. for 1 hour, and thereafter detached from Master Block (M-2A). Thus, Second Master Block (M-3A) was obtained. A concavity and convexity analysis image of the obtained master block was obtained by analyzing the shape of the concavities and convexities formed on the surface by use of a scanning probe microscope (manufactured by SII NanoTechnology Inc., under the product name of "E-sweep"). FIG. 27 shows the obtained concavity and convexity analysis image. In addition, FIG. 28 shows an obtained sectional concavity and convexity analysis image. Note that Second Master Block (M-3A) had an average pitch of the concavities and convexities of 280 nm and an average height of the concavities and convexities of 25 m.

Next, a glass substrate (manufactured by Matsunami Glass Ind., Ltd., under the product name of "Micro slide glass") and a curable resin (manufactured by Norland Optical Adhesive under the product name of "NOA 61") were prepared. Then, the curable resin was applied onto the glass substrate. Thereafter, the curable resin was cured by irradiation with ultraviolet rays for 1 hour, with the obtained Master Block (M-3A) being pressed thereto. Then, Master Block (M-3A) was detached from the cured resin layer, and thereby the cured resin layer having concavities and convexities formed thereon was formed on the glass substrate. Thus, a diffraction grating was obtained. Note that the curable resin had an average pitch of the concavities and convexities of 280 nm and an average height of the concavities and convexities of 35 nm.

Subsequently, on the cured resin layer of the obtained diffraction grating, a transparent electrode (ITO, thickness: 120 nm), a hole transporting layer [N,N'diphenyl-N,N'-bis(3-methylphenyl)-1,1'-diphenyl-4,4'-diamine, thickness: 40 nm], an electron transporting layer (8-hydroxyquinoline aluminum, thickness: 30 nm), a lithium fluoride layer (thickness: 1.5 nm), and a metal electrode (aluminum, thickness: 150 nm) were each stacked by a vapor deposition method, and formed into such a shape that the shape of the concavities and convexities formed on the surface of the cured resin layer was maintained. Thus, an organic EL element was obtained.

Comparative Example 6

An organic EL element for comparison was obtained in the same manner as in Example 2, except that the obtained Master Block (M-3A) was not used, and hence no concavities and convexities were formed on the cured resin layer.

Comparative Example 7

A diffraction grating for comparison was obtained in the same manner as in Example 2, except that a one-dimensional diffraction grating (the average pitch of the concavities and convexities: 380 nm, the average height of the concavities and convexities: 65 nm) was used as the master block instead of the obtained Master Block (M-3A). Note that the concavities and convexities formed on the surface of the cured resin layer 2 was arranged one-dimensionally periodically. In addition, the average pitch of the concavities and convexities was 380 nm, and the average height of the concavities and convexities was 60 nm. In addition, on the cured resin layer of the obtained diffraction grating, a transparent electrode (ITO, thickness: 200 nm), a hole transporting layer [poly(3,4-ethylenedioxythiophene)/poly(4-styrenesulfon ate)), thickness: 20 nm], an electron transporting layer [poly[2-methoxy-5-(2'-ethylhexyloxy)-1,4-(1-cyanovinyl ene)phenylene], thickness: 100 nm], a lithium fluoride layer (thickness: 1 nm), and a metal electrode (aluminum, thickness: 150 nm) were each stacked by a vapor deposition method, and formed into such a shape that the shape of the concavities and convexities formed on the surface of the cured resin layer was maintained. Thus, an organic EL element for comparison was obtained.

Comparative Example 8

An organic EL element for comparison was obtained in the same manner as in Comparative Example 7, except that the one-dimensional diffraction grating was not used as the master block, and hence no concavities and convexities were formed on the cured resin layer.

Example 3

A 0.1% by mass toluene solution of Random Copolymer was spin coated onto a silicon wafer, and then a heat treatment was carried out at a temperature of 170° C. for 24 hours. Thus, a base member was obtained. A block copolymer solution was obtained by dissolving 187 mg of Block Copolymer (P-1) in 10 g of toluene, followed by filtration through a membrane filter having a pore diameter of 0.45 μm. The thus obtained block copolymer solution was spin coated onto the base member at a spin speed of 800 rpm. Then, the coating film was dried on a hot plate of 55° C. for 10 minutes, and subsequently subjected to an annealing treatment in an oven of 170° C. for 24 hours. Thus, First Master Block (M-4A) having concavities and convexities formed on a surface thereof due to micro phase separation was obtained.

Figure 29:
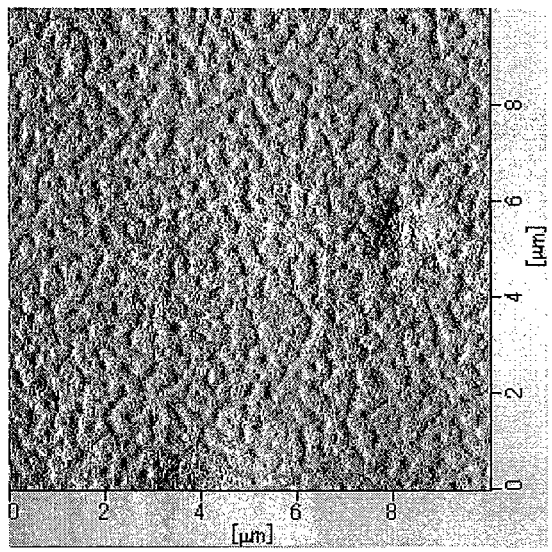
FIG. 29 is a photograph showing a concavity and convexity analysis image, in which a result of analysis conducted on a surface of a first master block obtained in Example 3 by use of a scanning probe microscope is displayed on a display.

A concavity and convexity analysis image of the obtained master block was obtained by analyzing the shape of the concavities and convexities formed on the surface by use of a scanning probe microscope (manufactured by SII NanoTechnology Inc., under the product name of "E-sweep"). FIG. 29 shows the obtained concavity and convexity analysis image. As shown in FIG. 29, concavities and convexities due to the micro phase separation were formed on the surface of Master Block (M-4A). Hence, it was shown that the diffraction grating and the organic EL element of the present invention were obtainable by use of Master Block (M-4A) described above. In addition, the thickness of the coating film made of Block Copolymer (P-1) in the obtained master block was measured by use of a step measuring instrument (manufactured by Kosaka Seisakusho under the product name of "SURF-COATER ET-4000A"). As a result, the thickness of the coating film was 270 nm. In addition, Master Block (M-4A) had an average pitch of the concavities and convexities of 450 nm and an average height of the concavities and convexities of 10 nm.

Example 4

A block copolymer solution was obtained by dissolving 206 mg of Block Copolymer (P-4) in 10 g of toluene, followed by filtration through a membrane filter having a pore diameter of 0.45 μm. The block copolymer solution was spin coated onto glass serving as a base member at a spin speed of 800 rpm. Then, the coating film was dried on a hot plate of 55° C. for 10 minutes, and subsequently subjected to an annealing treatment in a vacuum oven of 170° C. for 24 hours. Thus, First Master Block (M-5A) having concavities and convexities formed on a surface thereof due to micro phase separation was obtained.

Figure 30:
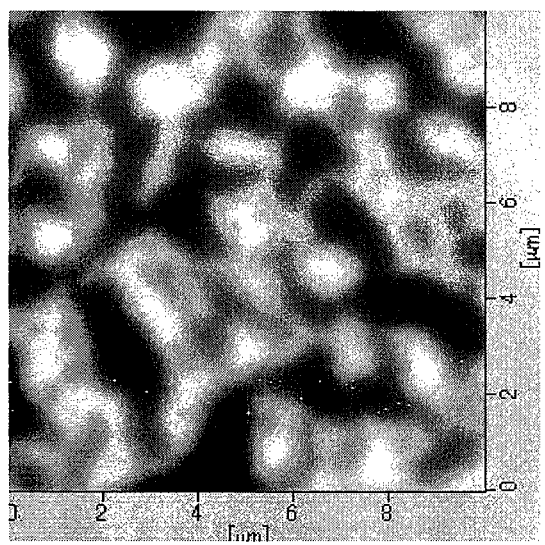
FIG. 30 is a photograph showing a concavity and convexity analysis image, in which a result of analysis conducted on a surface of a first master block obtained in Example 4 by use of a scanning probe microscope is displayed on a display.
Figure 31:
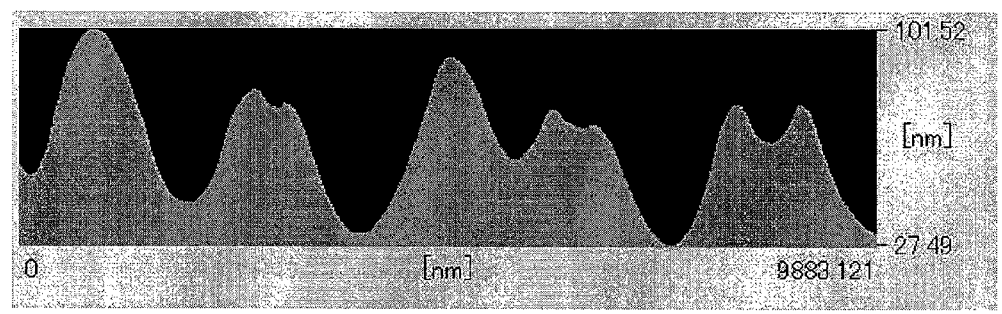
FIG. 31 is a photograph showing a sectional concavity and convexity analysis image, in which a result of analysis conducted on a section of the first master block obtained in Example 4 by use of the scanning probe microscope is displayed on a display.

A concavity and convexity analysis image of the obtained master block was obtained by analyzing the shape of the concavities and convexities formed on the surface by use of a scanning probe microscope (manufactured by SII NanoTechnology Inc., under the product name of "E-sweep"). FIG. 30 shows the obtained concavity and convexity analysis image. In addition, FIG. 31 shows an obtained sectional concavity and convexity analysis image. As shown in FIGS. 30 and 31, concavities and convexities due to micro phase separation were formed on the surface of Master Block (M-5A). Hence, it was shown that the diffraction grating and the organic EL element of the present invention were obtainable by use of Master Block (M-5A) described above. In addition, the thickness of the coating film made of Block Copolymer (P-4) in the obtained master block was measured by use of a step measuring instrument (manufactured by Kosaka Seisakusho under the product name of "SURF-COATER ET-4000A"). As a result, the thickness of the coating film was 315 nm. Moreover, Master Block (M-5A) had an average pitch of the concavities and convexities of 600 nm and an average height of the concavities and convexities of 50 nm.

Example 5

A 0.1% by mass toluene solution of Random Copolymer was spin coated onto a silicon wafer, and then a heat treatment was carried out at a temperature of 170° C. for 24 hours. Thus, a base member was obtained. A block copolymer solution was obtained by dissolving 163 mg of Block Copolymer (P-3) in 10 g of toluene, followed by filtration through a membrane filter having a pore diameter of 0.45 μm. The thus obtained block copolymer solution was spin coated onto the base member at a spin speed of 800 rpm. Then, the coating film was dried on a hot plate of 55° C. for 10 minutes, and subsequently subjected to a solvent treatment under a saturated vapor pressure of chloroform for one day. Thus, First Master Block (M-6A) having concavities and convexities formed on a surface thereof due to micro phase separation was obtained.

Figure 32:
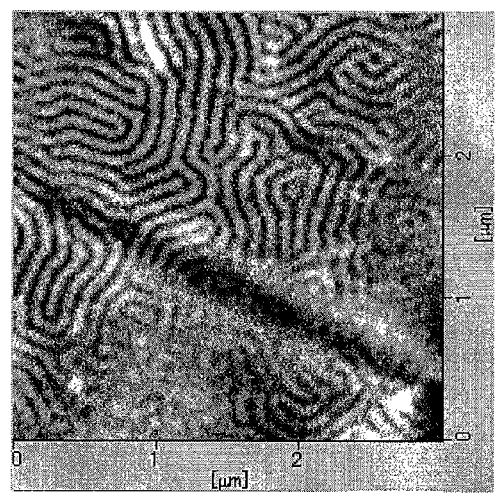
FIG. 32 is a photograph showing a concavity and convexity analysis image, in which a result of analysis conducted on a surface of a first master block obtained in Example 5 by use of a scanning probe microscope is displayed on a display.

A concavity and convexity analysis image of the obtained master block was obtained by analyzing the shape of the concavities and convexities formed on the surface by use of a scanning probe microscope (manufactured by SII NanoTechnology Inc., under the product name of "E-sweep"). FIG. 32 shows the obtained concavity and convexity analysis image. As shown in FIG. 32, concavities and convexities due to the micro phase separation were formed on the surface of Master Block (M-6A). Hence, it was shown that the diffraction grating and the organic EL element of the present invention were obtainable by use of Master Block (M-6A) described above. In addition, the thickness of the coating film made of Block Copolymer (P-3) in the obtained master block was measured by use of a step measuring instrument (manufactured by Kosaka Seisakusho under the product name of "SURF-COATER ET-4000A"). As a result, the thickness of the coating film was 209 nm. Moreover, Master Block (M-6A) had an average pitch of the concavities and convexities of 110 nm and an average height of the concavities and convexities of 8 nm.

Example 6

A 0.1% by mass toluene solution of Random Copolymer was spin coated onto a silicon wafer, and then a heat treatment was carried out at a temperature of 170° C. for 24 hours. Thus, a base member was obtained. A block copolymer solution was obtained by dissolving 292 mg of Block Copolymer (P-2) and 87 mg of Homopolymer (A) in 10 g of toluene, followed by filtration through a membrane filter having a pore diameter of 0.45 μm. The thus obtained block copolymer solution was spin coated onto the base member at a spin speed of 800 rpm. Then, the coating film was dried on a hot plate of 55° C. for 10 minutes, and subsequently subjected to an annealing treatment in a vacuum oven of 130° C. for 24 hours. Thus, First Master Block (M-7A) having concavities and convexities formed on a surface thereof due to micro phase separation was obtained.

Figure 33:
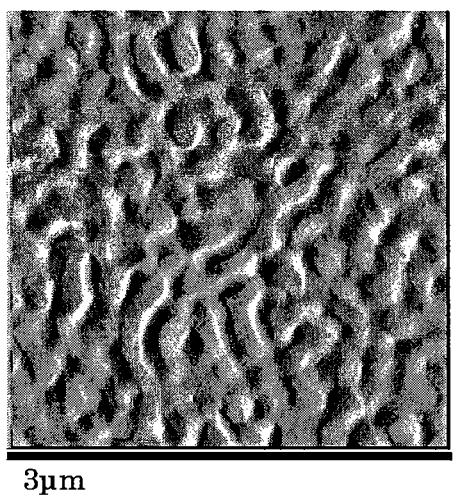
FIG. 33 is a photograph showing a concavity and convexity analysis image, in which a result of analysis conducted on a surface of a first master block obtained in Example 6 by use of a scanning probe microscope is displayed on a display.

A concavity and convexity analysis image of the obtained master block was obtained by analyzing the shape of the concavities and convexities formed on the surface by use of a scanning probe microscope (manufactured by SII NanoTechnology Inc., under the product name of "E-sweep"). FIG. 33 shows the obtained concavity and convexity analysis image. As shown in FIG. 33, concavities and convexities due to the micro phase separation were formed on the surface of Master Block (M-7A). Hence, it was shown that the diffraction grating and the organic EL element of the present invention were obtainable by use of Master Block (M-7A) described above. In addition, the thickness of the coating film made of Block Copolymer (P-2) in the obtained master block was measured by use of a step measuring instrument (manufactured by Kosaka Seisakusho under the product name of "SURF-COATER ET-4000A"). As a result, the thickness of the coating film was 529 nm. Moreover, Master Block (M-7A) had an average pitch of the concavities and convexities of 310 nm and an average, height of the concavities and convexities of 11 nm.

Figure 34:
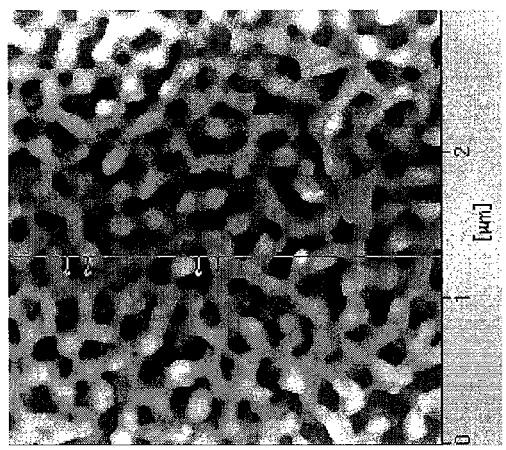
FIG. 34 is a photograph showing a concavity and convexity analysis image, in which a result of analysis conducted on a surface of a first master block obtained in Example 6 after an etching treatment by use of a scanning probe microscope is displayed on a display.
Figure 35:
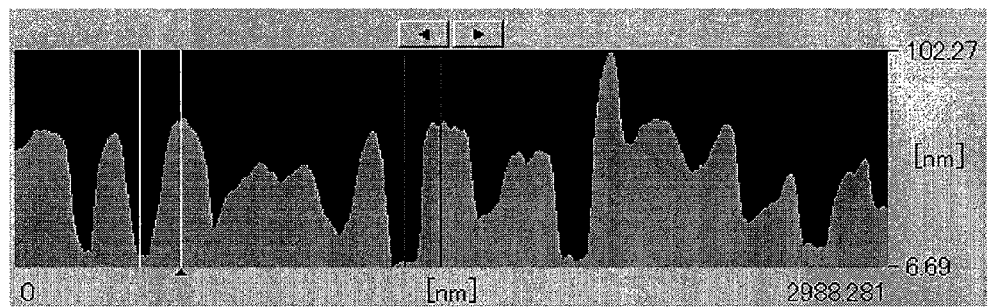
FIG. 35 is a photograph showing a sectional concavity and convexity analysis image, in which a result of analysis conducted on a section of the first master block obtained in Example 6 after the etching treatment by use of the scanning probe microscope is displayed on a display.

The coating film of the obtained Master Block (M-7A) was irradiated with ultraviolet rays at an irradiation intensity of 12 J/cm$^2$ by use of a high pressure mercury lamp, and then subjected to ultrasonic cleaning in acetic acid. Thus, First Master Block (M-8A) subjected to an etching treatment by which PMMA was selectively removed was obtained. A concavity and convexity analysis image of the obtained master block was obtained by analyzing the shape of the concavities and convexities formed on the surface by use of a scanning probe microscope (manufactured by SII NanoTechnology Inc., under the product name of "E-sweep"). FIG. 34 shows the obtained concavity and convexity analysis image. In addition, FIG. 35 shows an obtained sectional concavity and convexity analysis image. As is apparent from the results shown in FIGS. 33 to 35, it was shown that the etching treatment deepened the shape of the concavities and convexities formed on the surface. In addition, Master Block (M-8A) had an average pitch of the concavities and convexities of 310 nm and an average height of the concavities and convexities of 65 nm.

Example 7

A 0.1% by mass toluene solution of Random Copolymer was spin coated onto a silicon wafer, and then a heat treatment was carried out at a temperature of 170° C. for 24 hours. Thus, a base member was obtained. Next, a toluene solution in which the total concentration of Block Copolymer (P-2) and Homopolymer (B) was 1.5% by mass was obtained by dissolving Block Copolymer (P-2) and Homopolymer (B) in toluene at such a ratio that Homopolymer (B) was 25 parts by mass relative to 100 parts by mass of Block Copolymer (P-2). Then, a block copolymer solution was obtained by filtering the toluene solution through a membrane filter having a pore diameter of 0.45 μm. Subsequently, the thus obtained block copolymer solution was spin coated onto the base member at a spin speed of 800 rpm. Thus, a coating film was obtained. Next, the coating film was dried on a hot plate of 55° C. for 10 minutes, and an annealing treatment was carried out by heating in a vacuum oven of 160° C. for 8 hours. Thus, First Master Block (M-9A) having concavities and convexities formed on a surface thereof due to micro phase separation was obtained. The shape of the concavities and convexities formed on the surface of the thus obtained Master Block (M-9A) was analyzed by use of a scanning probe microscope (manufactured by SII NanoTechnology Inc., under the product name of "E-sweep"). The analysis showed that concavities and convexities due to the micro phase separation were formed on the surface of Master Block (M-9A), and that the diffraction grating and the organic EL element of the present invention were obtainable by use of Master Block (M-9A) described above.

Figure 36:
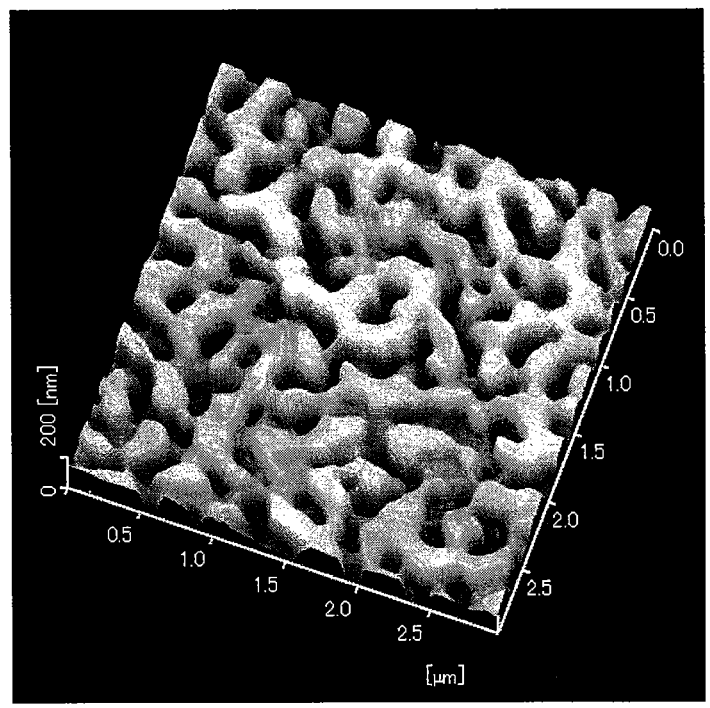
FIG. 36 is a photograph showing a concavity and convexity analysis image, in which a result of analysis conducted on a surface of a first master block obtained in Example 7 after an etching treatment by use of a scanning probe microscope is displayed on a display.
Figure 37:
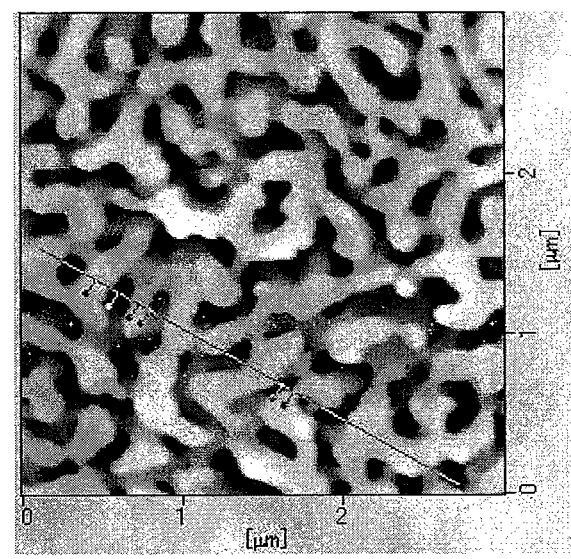
FIG. 37 is a photograph showing a concavity and convexity analysis image, in which a result of analysis conducted on the surface of the first master block obtained in Example 7 after the etching treatment by use of the scanning probe microscope is displayed on a display.

Subsequently, the coating film of the obtained Master Block (M-9A) was irradiated with ultraviolet rays at an irradiation intensity of 12 J/cm$^2$ by use of a high pressure mercury lamp, and then subjected to ultrasonic cleaning in acetic acid. Thus, First Master Block (M-10A) subjected to an etching treatment by which PMMA and PEO were selectively removed was obtained. Concavity and convexity analysis images were obtained by analyzing the shape of the concavities and convexities formed on the surface of the obtained Master Block (M-10A) by use of a scanning probe microscope (manufactured by SII NanoTechnology Inc., under the product name of "E-sweep"). FIGS. 36 and 37 show the obtained concavity and convexity analysis images. In addition, FIG. 38 shows an obtained sectional concavity and convexity analysis image.

Figure 38:
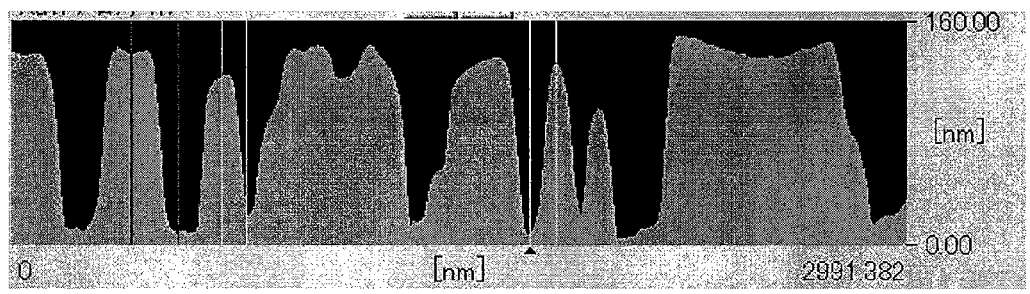
FIG. 38 is a photograph showing a sectional concavity and convexity analysis image, in which a result of analysis conducted on a section of the first master block obtained in Example 7 after the etching treatment by use of the scanning probe microscope is displayed on a display.

As is apparent from the results shown in FIGS. 36 to 38, concavities and convexities due to the micro phase separation were formed on the surface of Master Block (M-10A). Hence, it was shown that the diffraction grating and the organic EL element of the present invention were obtainable by use of Master Block (M-10A) described above. In addition, as is apparent from the results shown in FIGS. 36 to 38, it was shown that the use of polyethylene oxide (Homopolymer (B)) resulted in more vertical wall faces of the concave portions, and sufficiently increased the orientation in the vertical direction. In addition, from the results shown in FIGS. 36 to 38, it was shown that a master block having a sufficiently deep shape of the concavities and convexities was obtained. Note that the thickness of the coating film made of Block Copolymer (P-2) in the obtained Master Block (M-10A) was measured by use of a step measuring instrument (manufactured by Kosaka Seisakusho under the product name of "SURF-COATER ET-4000A"). As a result, the thickness of the coating film was 160 nm. In addition, Master Block (M-10A) had an average pitch of the concavities and convexities of 330 nm and an average height of the concavities and convexities of 120 nm.

Example 8

First, First Master Block (M-11A) was manufactured by employing the same method as the method for manufacturing First Master Block (M-9A) employed in Example 7, except that the heating temperature for the annealing treatment in the vacuum oven was changed to 170° C., and the heating time therefor was changed to 12 hours. The shape of the concavities and convexities formed on the surface of the thus obtained Master Block (M-11A) was analyzed by use of a scanning probe microscope (manufactured by SII NanoTechnology Inc., under the product name of "E-sweep"). The analysis showed that concavities and convexities due to the micro phase separation were formed on the surface of Master Block (M-11A), and that the diffraction grating and the organic EL element of the present invention were obtainable by use of Master Block (M-11A) described above.

Figure 39:
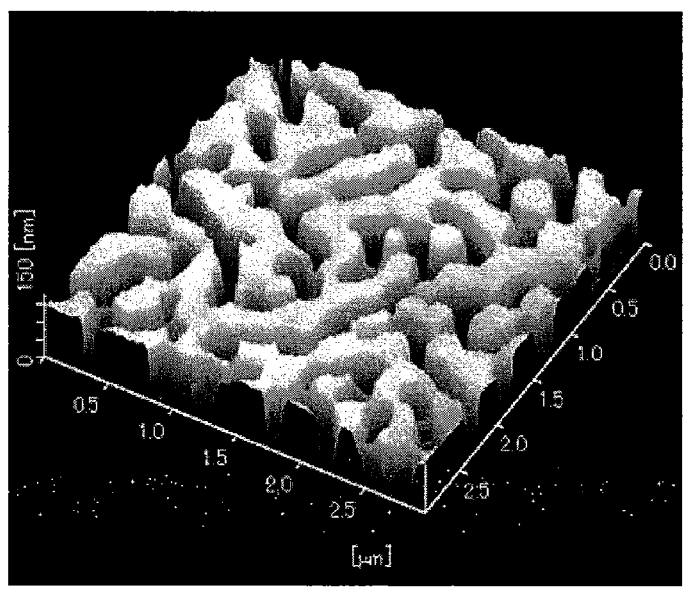
FIG. 39 is a photograph showing a concavity and convexity analysis image, in which a result of analysis conducted on a surface of a first master block obtained in Example 8 after an etching treatment by use of a scanning probe microscope is displayed on a display.
Figure 40:
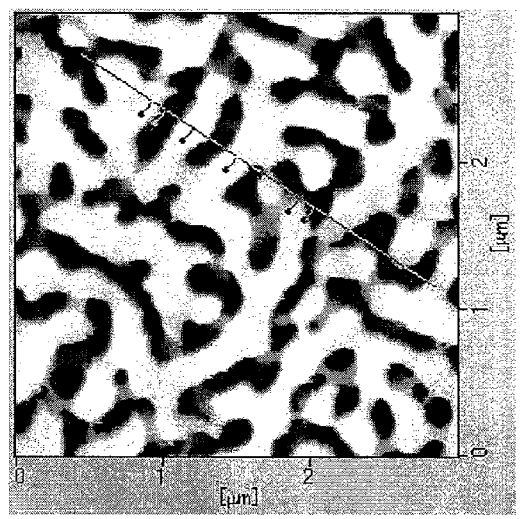
FIG. 40 is a photograph showing a concavity and convexity analysis image, in which a result of analysis conducted on the surface of the first master block obtained in Example 8 after the etching treatment by use of the scanning probe microscope is displayed on a display.

Subsequently, the coating film of the obtained Master Block (M-11A) was irradiated with ultraviolet rays at an irradiation intensity of 6 J/cm$^2$ by use of a high pressure mercury lamp, and then immersed in acetone for 30 minutes. Thus, First Master Block (M-12A) subjected to an etching treatment by which PMMA and PEO were selectively removed was obtained. Concavity and convexity analysis images were obtained by analyzing the shape of the concavities and convexities formed on the surface of the obtained Master Block (M-12A) by use of a scanning probe microscope (manufactured by SII NanoTechnology Inc., under the product name of "E-sweep"). FIGS. 39 and 40 show the obtained concavity and convexity analysis images. In addition, FIG. 41 shows an obtained sectional concavity and convexity analysis image.

Figure 41:
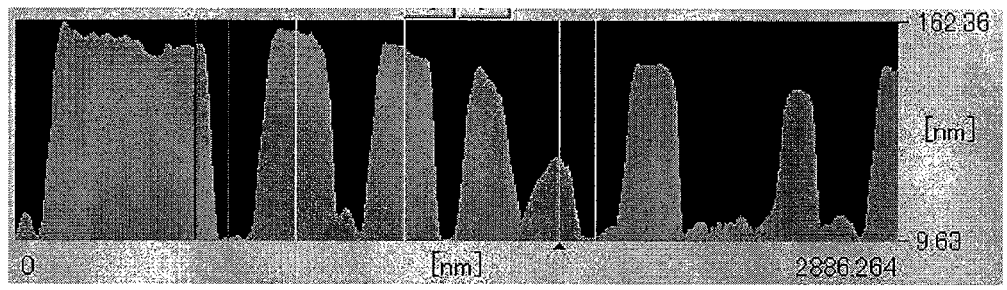
FIG. 41 is a photograph showing a sectional concavity and convexity analysis image, in which a result of analysis conducted on a section of the first master block obtained in Example 8 after the etching treatment by use of the scanning probe microscope is displayed on a display.

As is apparent from the results shown in FIGS. 39 to 41, concavities and convexities due to the micro phase separation were formed on the surface of Master Block (M-12A). Hence, it was shown that the diffraction grating and the organic EL element of the present invention were obtainable by use of Master Block (M-12A) described above. In addition, as is apparent from the results shown in FIGS. 39 to 41, the use of polyethylene oxide (Homopolymer (B)) resulted in more vertical wall faces of the concave portions, and sufficiently increased the orientation in the vertical direction. In addition, from the results shown in FIGS. 39 to 41, it was shown that a master block having a sufficiently deep shape of the concavities and convexities was obtainable by use of polyethylene oxide (Homopolymer (B)). Note that the thickness of the coating film made of Block Copolymer (P-2) in the obtained Master Block (M-12A) was measured by use of a step measuring instrument (manufactured by Kosaka Seisakusho under the product name of "SURF-COATER ET-4000A"). As a result, the thickness of the coating film was 155 nm. In addition, Master Block (M-12A) had an average pitch of the concavities and convexities of 380 nm and an average height of the concavities and convexities of 144 nm.

Example 9

First, First Master block (M-13A) was manufactured by employing the same method as the method for manufacturing First Master Block (M-9A) employed in Example 7, except that the ratio of Homopolymer (B) dissolved in the toluene solution was changed such that Homopolymer (B) was 35 parts by mass relative to 100 parts by mass of Block Copolymer (P-2), and that the heating temperature for the annealing treatment in the vacuum oven was changed to 170° C., and the heating time therefor was changed to 12 hours. The shape of the concavities and convexities formed on the surface of the thus obtained Master block (M-13A) was analyzed by use of a scanning probe microscope (manufactured by SII NanoTechnology Inc., under the product name of "E-sweep"). The analysis showed that concavities and convexities due to the micro phase separation were formed on the surface of Master block (M-13A), and that the diffraction grating and the organic EL element of the present invention were obtainable by use of Master Block (M-13A) described above.

Figure 42:
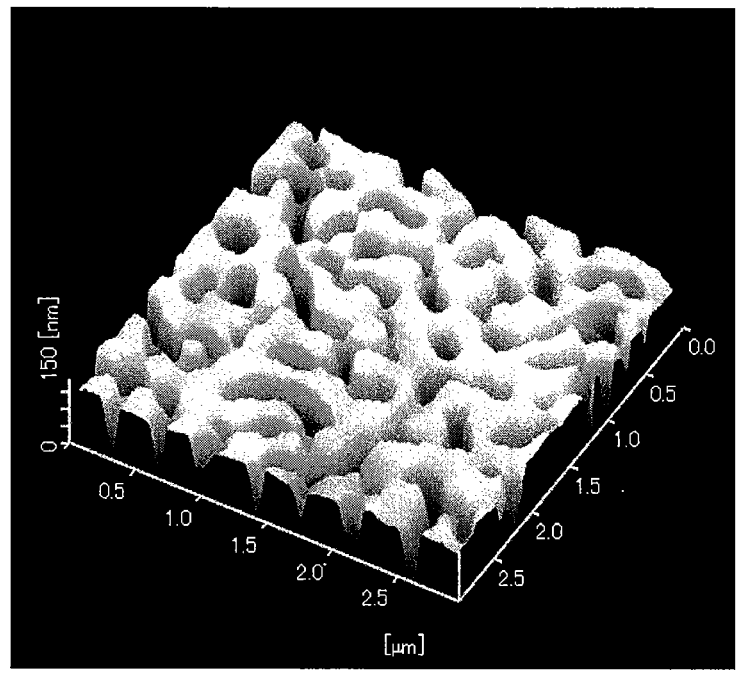
FIG. 42 is a photograph showing a concavity and convexity analysis image, in which a result of analysis conducted on a surface of a first master block obtained in Example 9 after an etching treatment by use of a scanning probe microscope is displayed on a display.
Figure 43:
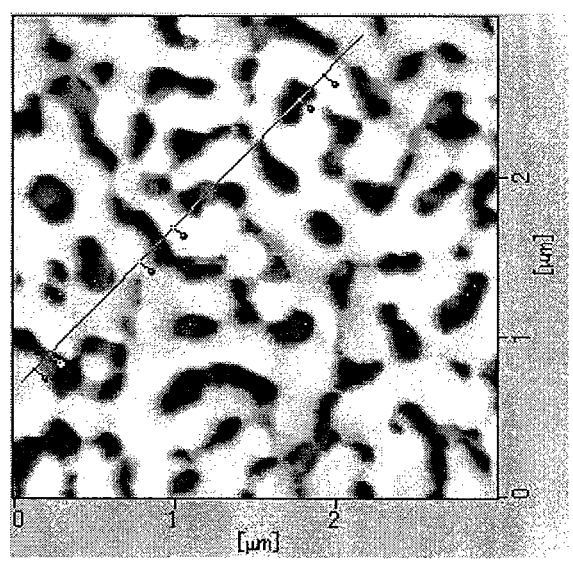
FIG. 43 is a photograph showing a concavity and convexity analysis image, in which a result of analysis conducted on the surface of the first master block obtained in Example 9 after the etching treatment by use of the scanning probe microscope is displayed on a display.

Subsequently, the coating film of the obtained Master block (M-13A) was irradiated with ultraviolet rays at an irradiation intensity of 12 J/cm$^2$ by use of a high pressure mercury lamp, and then subjected to ultrasonic cleaning in acetic acid. Thus, First Master Block (M-14A) subjected to an etching treatment by which PMMA and PEO were selectively removed was obtained. Concavity and convexity analysis images were obtained by analyzing the shape of the concavities and convexities formed on the surface of the obtained Master Block (M-14A) by use of a scanning probe microscope (manufactured by SII NanoTechnology Inc., under the product name of "E-sweep"). FIGS. 42 and 43 show the obtained concavity and convexity analysis images. In addition, FIG. 44 shows an obtained sectional concavity and convexity analysis image.

Figure 44:
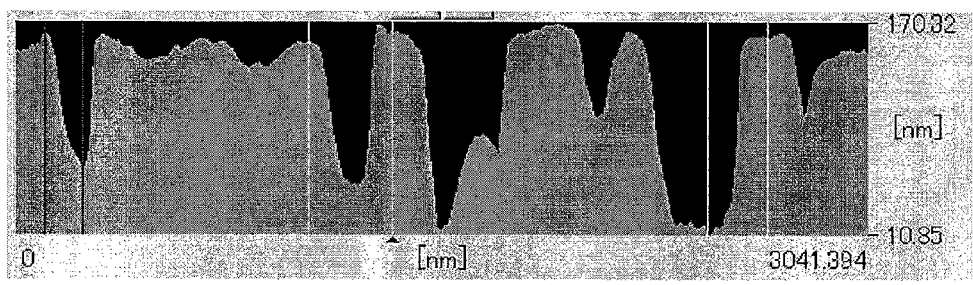
FIG. 44 is a photograph showing a sectional concavity and convexity analysis image, in which a result of analysis conducted on a section of the first master block obtained in Example 9 after the etching treatment by use of the scanning probe microscope is displayed on a display.

As is apparent from the results shown in FIGS. 42 to 44, concavities and convexities due to the micro phase separation were formed on the surface of Master Block (M-14A). Hence, it was shown that the diffraction grating and the organic EL element of the present invention were obtainable by use of Master Block (M-14A) described above. In addition, as is apparent from the results shown in FIGS. 42 to 44, the use of polyethylene oxide (Homopolymer (B)) resulted in more vertical wall faces of the concave portions, and sufficiently increased the orientation in the vertical direction. In addition, from the results shown in FIGS. 42 to 44, a master block having a sufficiently deep shape of the concavities and convexities was obtainable by use of polyethylene oxide (Homopolymer (B)). Note that the thickness of the coating film made of Block Copolymer (P-2) in the obtained Master Block (M-14A) was measured by use of a step measuring instrument (manufactured by Kosaka Seisakusho under the product name of "SURF-COATER ET-4000A"). As a result, the thickness of the coating film was 172 nm. In addition, Master Block (M-14A) had an average pitch of the concavities and convexities of 398 nm and an average height of the concavities and convexities of 158 nm.

Example 10

Figure 45:
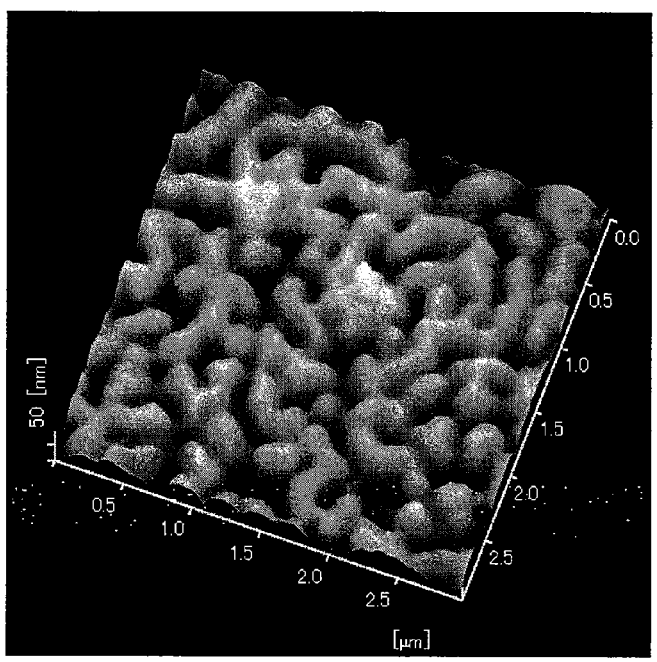
FIG. 45 is a photograph showing a concavity and convexity analysis image, in which a result of analysis conducted on a surface of a second master block obtained in Example 10 after an etching treatment by use of a scanning probe microscope is displayed on a display.
Figure 46:
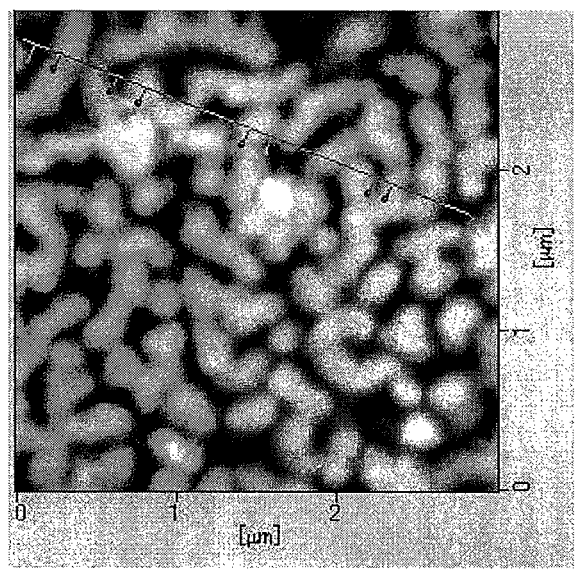
FIG. 46 is a photograph showing a concavity and convexity analysis image, in which a result of analysis conducted on the surface of the second master block obtained in Example 10 after the etching treatment by use of the scanning probe microscope is displayed on a display.

First, First Master Block (M-15A) was manufactured by employing the same method as the method for manufacturing First Master Block (M-9A) employed in Example 7, except that the total concentration of Block Copolymer (P-2) and Homopolymer (B) in the toluene solution was changed to 1.0% by mass, and that the heating temperature for the annealing treatment in the vacuum oven was changed to 170° C., and the heating time therefor was changed to 8 hours. Subsequently, the coating film of the obtained Master Block (M-15A) was irradiated with ultraviolet rays at an irradiation intensity of 12 J/cm$^2$ by use of a high pressure mercury lamp, and then subjected to ultrasonic cleaning in acetic acid. Thus, First Master Block (M-16A) subjected to an etching treatment by which PMMA and PEO were selectively removed was obtained. Next, a silicone-based polymer [a resin composition of a mixture of 90% by mass of polydimethylsiloxane (manufactured by Wacker Chemie AG under the product name of "ELASTSIL-A") and 10% by mass of a curing agent (manufactured by Wacker Chemie AG under the product name of "ELASTSIL-B")] from which bubbles were removed by degasification by well mixing was applied dropwise onto the obtained Master Block (M-16A), then was cured by being heated at 50° C. for 1 hour, and thereafter detached from Master Block (M-16A). Thus, Second Master Block (M-17A) was obtained. Concavity and convexity analysis images were obtained by analyzing the shape of the concavities and convexities formed on the surface of the obtained Master Block (M-17A) by use of a scanning probe microscope (manufactured by SII NanoTechnology Inc., under the product name of "E-sweep"). FIGS. 45 and 46 show the obtained concavity and convexity analysis images. In addition, FIG. 47 shows an obtained sectional concavity and convexity analysis image.

Figure 47:
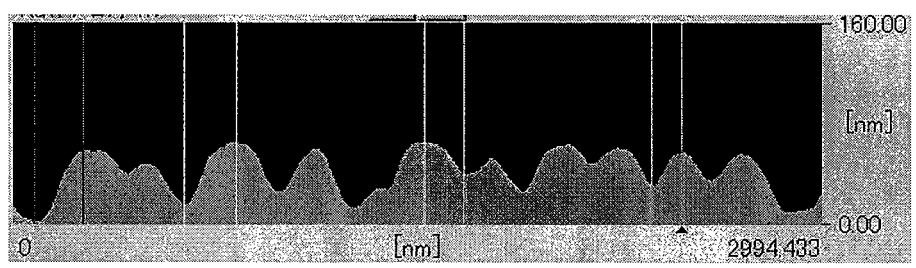
FIG. 47 is a photograph showing a sectional concavity and convexity analysis image, in which a result of analysis conducted on a section of the second master block obtained in Example 10 after the etching treatment by use of the scanning probe microscope is displayed on a display.

As is apparent from the results shown in FIGS. 45 to 47, concavities and convexities which were originated from the concavities and convexities formed on the surface of Master Block (M-16A) due to the micro phase separation were formed on the surface of Master Block (M-17A). Hence, it was shown that the diffraction grating and the organic EL element of the present invention were obtainable by use of Master Block (M-17A) described above. Note that, the obtained Master Block (M-17A) had an average pitch of the concavities and convexities of 360 nm and an average height of the concavities and convexities of 40 nm.

Example 11

First, First Master Block (M-18A) was manufactured by employing the same method as the method for manufacturing First Master Block (M-9A) employed in Example 7, except that the total concentration of Block Copolymer (P-2) and Homopolymer (B) in the toluene solution was changed to 1.3% by mass, and that the heating temperature for the annealing treatment in the vacuum oven was changed to 190° C., and the heating time therefor was changed to 8.5 hours. The shape of the concavities and convexities formed on the surface of the thus obtained Master Block (M-18A) was analyzed by use of a scanning probe microscope (manufactured by SII NanoTechnology Inc., under the product name of "E-sweep"). The analysis showed that concavities and convexities due to the micro phase separation were formed on the surface of Master Block (M-18A), and that the diffraction grating and the organic EL element of the present invention were obtainable by use of Master Block (M-18A) described above.

Figure 48:
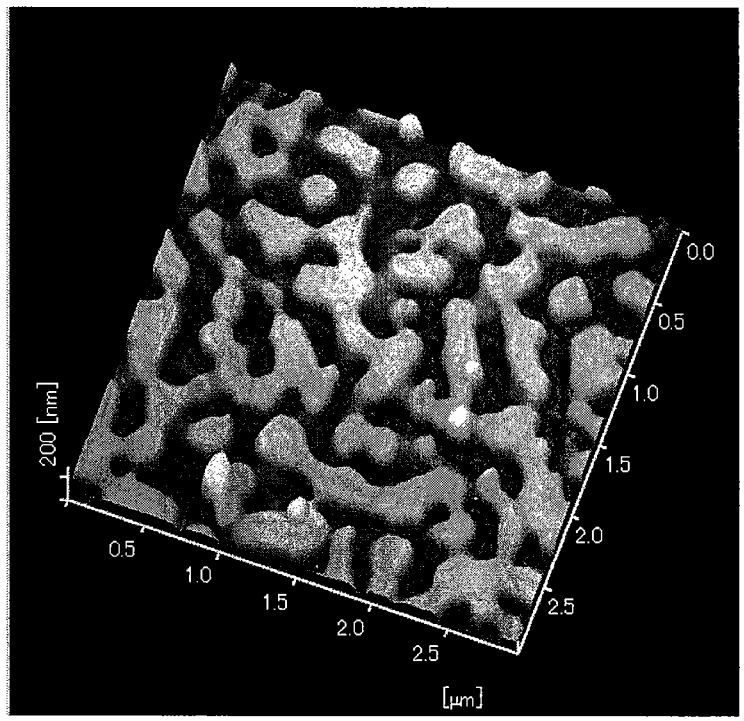
FIG. 48 is a photograph showing a concavity and convexity analysis image, in which a result of analysis conducted on a surface of a first master block obtained in Example 11 after an etching treatment by use of a scanning probe microscope is displayed on a display.
Figure 49:
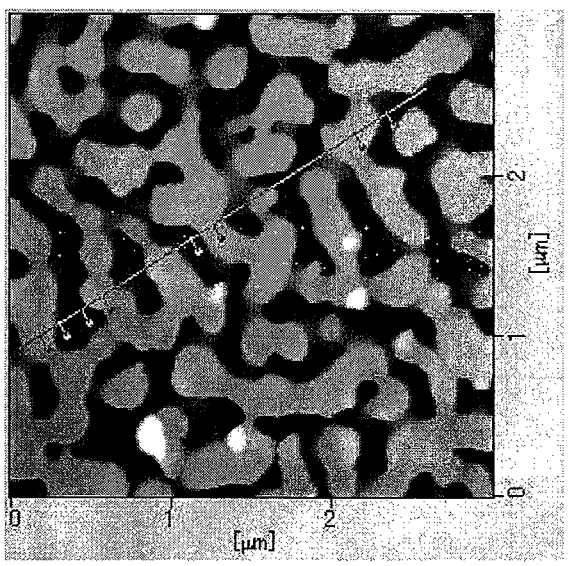
FIG. 49 is a photograph showing a concavity and convexity analysis image, in which a result of analysis conducted on the surface of the first master block obtained in Example 11 after the etching treatment by use of the scanning probe microscope is displayed on a display.

Subsequently, the coating film of the obtained Master Block (M-18A) was irradiated with ultraviolet rays at an irradiation intensity of 12 J/cm$^2$ by use of a high pressure mercury lamp, and then subjected to ultrasonic cleaning in acetic acid. Thus, First Master Block (M-19A) subjected to an etching treatment by which PMMA and PEO were selectively removed was obtained. Concavity and convexity analysis images were obtained by analyzing the shape of the concavities and convexities formed on the surface of the obtained Master Block (M-19A) by use of a scanning probe microscope (manufactured by SII NanoTechnology Inc., under the product name of "E-sweep"). FIGS. 48 and 49 show the obtained concavity and convexity analysis images. In addition, FIG. 50 shows an obtained sectional concavity and convexity analysis image.

Figure 50:
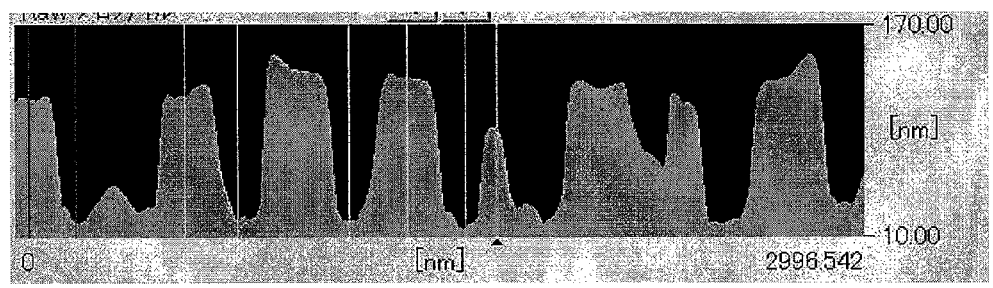
FIG. 50 is a photograph showing a sectional concavity and convexity analysis image, in which a result of analysis conducted on a section of the first master block obtained in Example 11 after the etching treatment by use of the scanning probe microscope is displayed on a display.

As is apparent from the results shown in FIGS. 48 to 50, concavities and convexities due to the micro phase separation were formed on the surface of Master Block (M-19A). Hence, it was shown that the diffraction grating and the organic EL element of the present invention were obtainable by use of Master Block (M-19A) described above. In addition, as is apparent from the results shown in FIGS. 48 to 50, the use of polyethylene oxide (Homopolymer (B)) resulted in more vertical wall faces of the concave portions, and sufficiently increased the orientation in the vertical direction. In addition, as is apparent from the results shown in FIGS. 48 to 50, it was shown that a master block having a sufficiently deep shape of the concavities and convexities was obtainable by use of polyethylene oxide (Homopolymer (B)). Note that the thickness of the coating film made of Block Copolymer (P-2) in the obtained Master Block (M-14A) was measured by use of a step measuring instrument (manufactured by Kosaka Seisakusho under the product name of "SURF-COATER ET-4000A"). As a result, the thickness of the coating film was 135 nm. In addition, Master Block (M-19A) had an average pitch of the concavities and convexities of 370 nm and an average height of the concavities and convexities of 118 nm.

Example 12

First, First Master Block (M-20A) was manufactured by employing the same method as the method for manufacturing First Master Block (M-9A) employed in Example 7, except that the heating temperature for the annealing treatment in the vacuum oven was changed to 190° C., and the heating time therefor was changed to 12 hours. The shape of the concavities and convexities formed on the surface of the thus obtained Master Block (M-20A) was analyzed by use of a scanning probe microscope (manufactured by SII NanoTechnology Inc., under the product name of "E-sweep"). The analysis showed that concavities and convexities due to the micro phase separation were formed on the surface of Master Block (M-20A), and that the diffraction grating and the organic EL element of the present invention were obtainable by use of Master Block (M-20A) described above.

Figure 51:
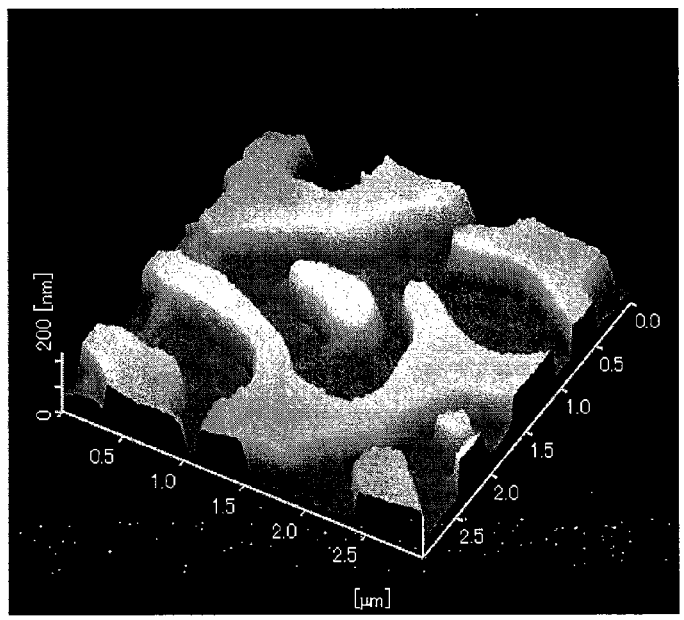
FIG. 51 is a photograph showing a concavity and convexity analysis image, in which a result of analysis conducted on a surface of a first master block obtained in Example 12 after an etching treatment by use of a scanning probe microscope is displayed on a display.
Figure 52:
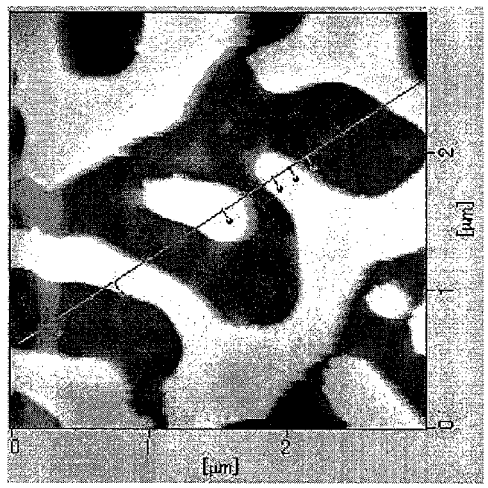
FIG. 52 is a photograph showing a concavity and convexity analysis image, in which a result of analysis conducted on the surface of the first master block obtained in Example 12 after the etching treatment by use of the scanning probe microscope is displayed on a display.

Subsequently, the coating film of the obtained Master Block (M-20A) was irradiated with ultraviolet rays at an irradiation intensity of 12 J/cm$^2$ by use of a high pressure mercury lamp, and then subjected to ultrasonic cleaning in acetone. Thus, First Master Block (M-21A) subjected to an etching treatment by which PMMA and PEO were selectively removed was obtained. Concavity and convexity analysis images were obtained by analyzing the shape of the concavities and convexities formed on the surface of the obtained Master Block (M-21A) by use of a scanning probe microscope (manufactured by SII NanoTechnology Inc., under the product name of "E-sweep"). FIGS. 51 and 52 show the obtained concavity and convexity analysis images. In addition, FIG. 53 shows an obtained sectional concavity and convexity analysis image.

Figure 53:
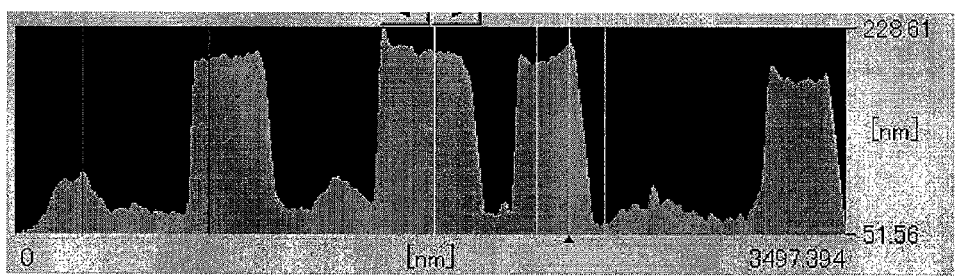
FIG. 53 is a photograph showing a sectional concavity and convexity analysis image, in which a result of analysis conducted on a section of the first master block obtained in Example 12 after the etching treatment by use of the scanning probe microscope is displayed on a display.

As is apparent from the results shown in FIGS. 51 to 53, concavities and convexities due to the micro phase separation were formed on the surface of Master Block (M-21A). Hence, it was shown that the diffraction grating and the organic EL element of the present invention were obtainable by use of Master Block (M-21A) described above. In addition, as is apparent from the results shown in FIGS. 51 to 53, the use of polyethylene oxide (Homopolymer (B)) resulted in more vertical wall faces of the concave portions, and sufficiently increased the orientation in the vertical direction. Moreover, as is apparent from the results shown in FIGS. 51 to 53, it was shown that a master block having a sufficiently deep shape of the concavities and convexities was obtainable by use of polyethylene oxide (Homopolymer (B)). Note that the thickness of the coating film made of Block Copolymer (P-2) in the obtained Master Block (M-21A) was measured by use of a step measuring instrument (manufactured by Kosaka Seisakusho under the product name of "SURF-COATER ET-4000A"). As a result, the thickness of the coating film was 180 nm. In addition, Master Block (M-21A) had an average pitch of the concavities and convexities of 780 nm and an average height of the concavities and convexities of 155 nm.

Example 13

First, First Master Block (M-22A) was manufactured by employing the same method as the method for manufacturing First Master Block (M-9A) employed in Example 7, except that the kind of the block copolymer was changed from Block Copolymer (P-2) to Block Copolymer (P-5), and that the heating temperature for the annealing treatment in the vacuum oven was changed to 190° C., and the heating time therefor was changed to 8.5 hours. The shape of the concavities and convexities formed on the surface of the thus obtained Master Block (M-22A) was analyzed by use of a scanning probe microscope (manufactured by SII NanoTechnology Inc., under the product name of "E-sweep"). The analysis showed that concavities and convexities due to the micro phase separation were formed on the surface of Master Block (M-22A), and that the diffraction grating and the organic EL element of the present invention were obtainable by use of Master Block (M-22A) described above.

Figure 54:
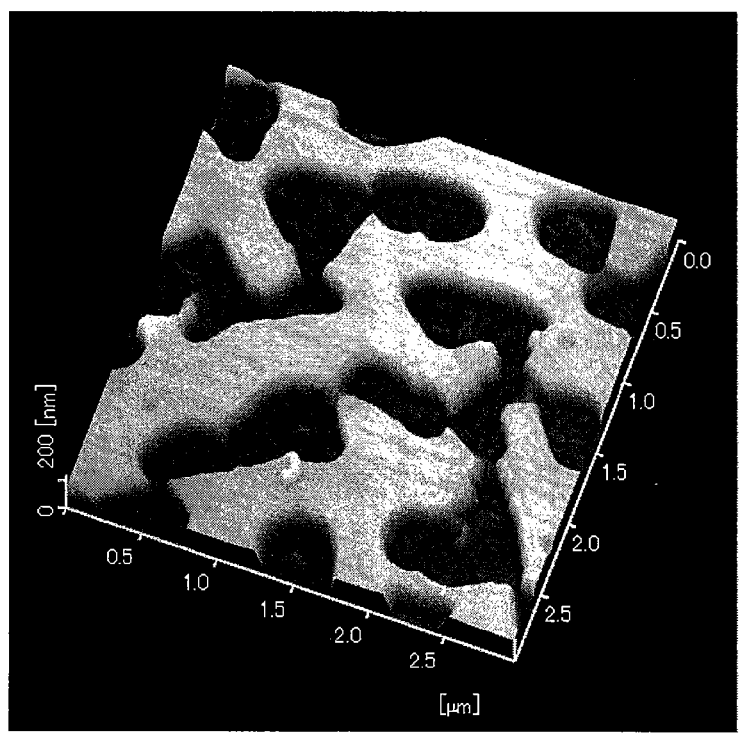
FIG. 54 is a photograph showing a concavity and convexity analysis image, in which a result of analysis conducted on a surface of a first master block obtained in Example 13 after an etching treatment by use of a scanning probe microscope is displayed on a display.
Figure 55:
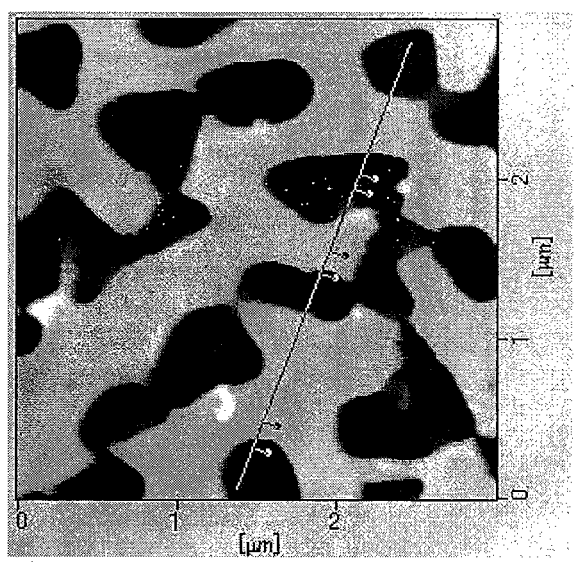
FIG. 55 is a photograph showing a concavity and convexity analysis image, in which a result of analysis conducted on the surface of the first master block obtained in Example 13 after the etching treatment by use of the scanning probe microscope is displayed on a display.

Subsequently, the coating film of the obtained Master Block (M-22A) was irradiated with ultraviolet rays at an irradiation intensity of 12 J/cm$^2$ by use of a high pressure mercury lamp, and then immersed in acetic acid for 30 minutes. Thus, First Master Block (M-23A) subjected to an etching treatment by which PMMA and PEO were selectively removed was obtained. Concavity and convexity analysis images were obtained by analyzing the shape of the concavities and convexities formed on the surface of the obtained Master Block (M-23A) by use of a scanning probe microscope (manufactured by SII NanoTechnology Inc., under the product name of "E-sweep"). FIGS. 54 and 55 show the obtained concavity and convexity analysis images. In addition, FIG. 56 shows an obtained sectional concavity and convexity analysis image.

Figure 56:
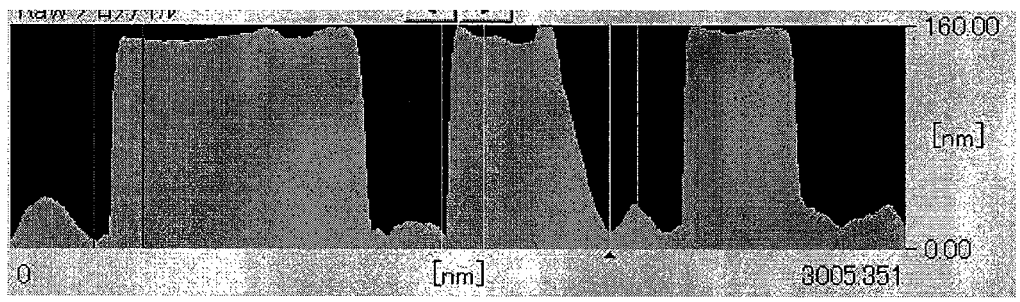
FIG. 56 is a photograph showing a sectional concavity and convexity analysis image, in which a result of analysis conducted on a section of the first master block obtained in Example 13 after the etching treatment by use of the scanning probe microscope is displayed on a display.

As is apparent from the results shown in FIGS. 54 to 56, concavities and convexities due to the micro phase separation were formed on the surface of Master Block (M-23A). Hence, it was shown that the diffraction grating and the organic EL element of the present invention were obtainable by use of Master Block (M-23A) described above. In addition, as is apparent from the results shown in FIGS. 54 to 56, the use of polyethylene oxide (Homopolymer (B)) resulted in more vertical wall faces of the concave portions, and sufficiently increased the orientation in the vertical direction. Moreover, as is apparent from the results shown in FIGS. 54 to 56, it was shown that a master block having a sufficiently deep shape of the concavities and convexities was obtainable by use of polyethylene oxide (Homopolymer (B)). Note that the thickness of the coating film made of Block Copolymer (P-5) in the obtained Master Block (M-23A) was measured by use of a step measuring instrument (manufactured by Kosaka Seisakusho under the product name of "SURF-COATER ET-4000A"). As a result, the thickness of the coating film was 170 nm. In addition, Master Block (M-23A) had an average pitch of the concavities and convexities of 880 nm and an average height of the concavities and convexities of 159 nm.

Example 14

First, First Master Block (M-24A) was manufactured by employing the same method as the method for manufacturing First Master Block (M-9A) employed in Example 7, except that the kind of the block copolymer was changed from Block Copolymer (P-2) to Block Copolymer (P-6), and that the heating temperature for the annealing treatment in the vacuum oven was changed to 180° C., and the heating time therefor was changed to 4 hours. The shape of the concavities and convexities formed on the surface of the thus obtained Master Block (M-24A) was analyzed by use of a scanning probe microscope (manufactured by SII NanoTechnology Inc., under the product name of "E-sweep"). The analysis showed that concavities and convexities due to the micro phase separation were formed on the surface of Master Block (M-24A), and that the diffraction grating and the organic EL element of the present invention were obtainable by use of Master Block (M-24A) described above.

Figure 57:
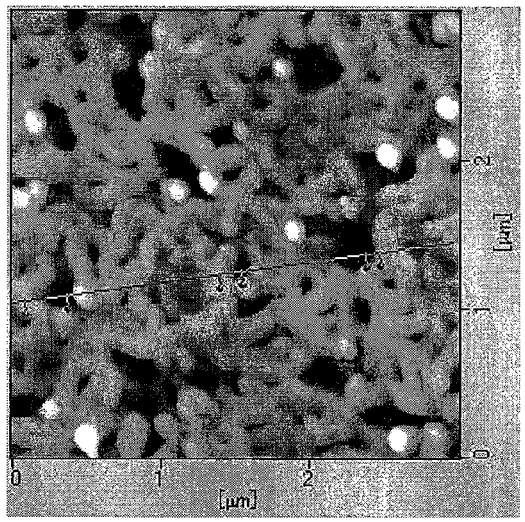
FIG. 57 is a photograph showing a concavity and convexity analysis image, in which a result of analysis conducted on a surface of a first master block obtained in Example 14 after an etching treatment by use of a scanning probe microscope is displayed on a display.

Subsequently, the coating film of the obtained Master Block (M-24A) was irradiated with ultraviolet rays at an irradiation intensity of 12 J/cm$^2$ by use of a high pressure mercury lamp, and then subjected to ultrasonic cleaning in acetic acid. Thus, First Master Block (M-25A) subjected to an etching treatment by which PMMA and PEO were selectively removed was obtained. A concavity and convexity analysis image was obtained by analyzing the shape of the concavities and convexities formed on the surface of the obtained Master Block (M-25A) by use of a scanning probe microscope (manufactured by SII NanoTechnology Inc., under the product name of "E-sweep"). FIG. 57 shows the obtained concavity and convexity analysis image. In addition, FIG. 58 shows an obtained sectional concavity and convexity analysis image.

Figure 58:
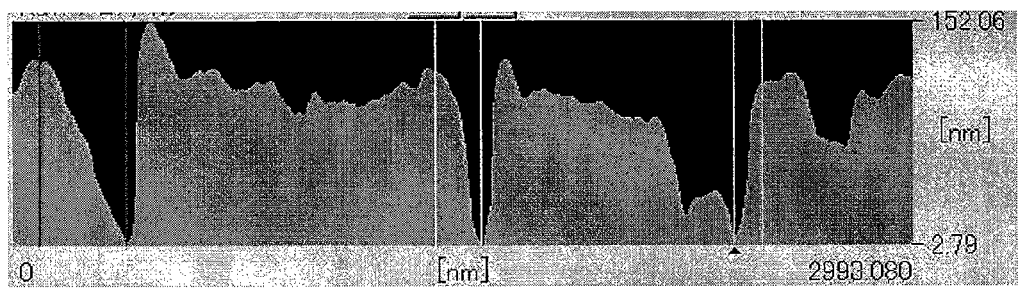
FIG. 58 is a photograph showing a sectional concavity and convexity analysis image, in which a result of analysis conducted on a section of the first master block obtained in Example 14 after the etching treatment by use of the scanning probe microscope is displayed on a display.

As is apparent from the results shown in FIGS. 57 and 58, concavities and convexities due to the micro phase separation were formed on the surface of Master Block (M-25A). Hence, it was shown that the diffraction grating and the organic EL element of the present invention were obtainable by use of Master Block (M-25A) described above. In addition, as is apparent from the results shown in FIGS. 57 and 58, the use of polyethylene oxide (Homopolymer (B)) resulted in more vertical wall faces of the concave portions, and sufficiently increased the orientation in the vertical direction. Moreover, as is apparent from the results shown in FIGS. 57 and 58, it was shown that a master block having a sufficiently deep shape of the concavities and convexities was obtainable by use of polyethylene oxide (Homopolymer (B)). Note that the thickness of the coating film made of Block Copolymer (P-6) in the obtained Master Block (M-25A) was measured by use of a step measuring instrument (manufactured by Kosaka Seisakusho under the product name of "SURF-COATER ET-4000A"). As a result, the thickness of the coating film was 130 nm. In addition, Master Block (M-25A) had an average pitch of the concavities and convexities of 155 nm and an average height of the concavities and convexities of 45 nm.

Example 15

First, First Master Block (M-26A) was manufactured by employing the same method as the method for manufacturing First Master Block (M-9A) employed in Example 7, except that the kind of the block copolymer was changed from Block Copolymer (P-2) to Block Copolymer (P-6), and that the heating temperature for the annealing treatment in the vacuum oven was changed to 190° C., and the heating time therefor was changed to 12 hours. The shape of the concavities and convexities formed on the surface of the thus obtained Master Block (M-26A) was analyzed by use of a scanning probe microscope (manufactured by SII NanoTechnology Inc., under the product name of "E-sweep"). The analysis showed that concavities and convexities due to the micro phase separation were formed on the surface of Master Block (M-26A), and that the diffraction grating and the organic EL element of the present invention were obtainable by use of Master Block (M-26A) described above.

Figure 59:
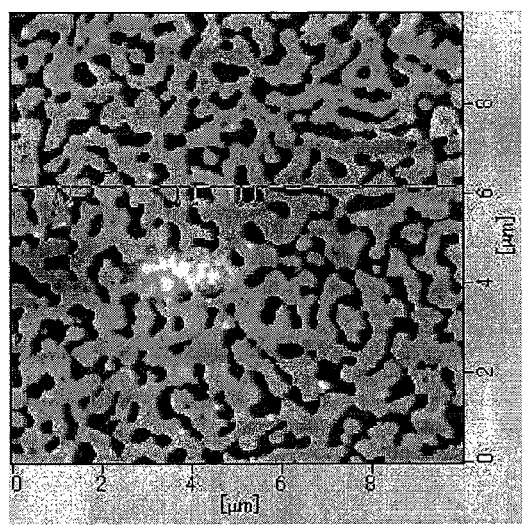
FIG. 59 is a photograph showing a concavity and convexity analysis image, in which a result of analysis conducted on a surface of a first master block obtained in Example 15 after an etching treatment by use of a scanning probe microscope is displayed on a display.

Subsequently, the coating film of the obtained Master Block (M-26A) was irradiated with ultraviolet rays at an irradiation intensity of 12 J/cm$^2$ by use of a high pressure mercury lamp, and then subjected to ultrasonic cleaning in acetic acid. Thus, First Master Block (M-27A) subjected to an etching treatment by which PMMA and PEO were selectively removed was obtained. A concavity and convexity analysis image was obtained by analyzing the shape of the concavities and convexities formed on the surface of the obtained Master Block (M-27A) by use of a scanning probe microscope (manufactured by SII NanoTechnology Inc., under the product name of "E-sweep"). FIG. 59 shows the obtained concavity and convexity analysis image. In addition, FIG. 60 shows an obtained sectional concavity and convexity analysis image.

Figure 60:
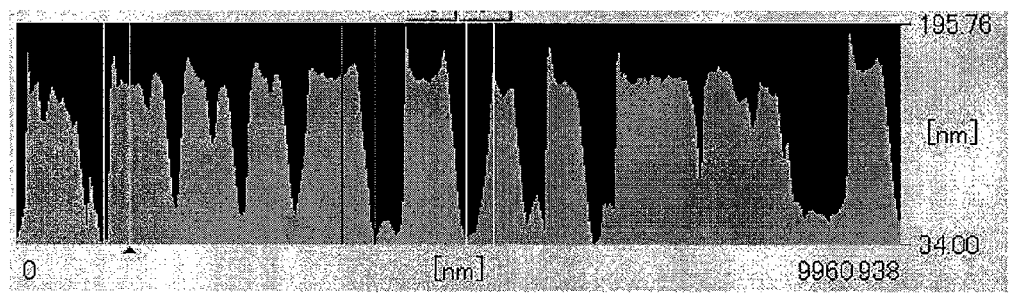
FIG. 60 is a photograph showing a sectional concavity and convexity analysis image, in which a result of analysis conducted on a section of the first master block obtained in Example 15 after the etching treatment by use of the scanning probe microscope is displayed on a display.

As is apparent from the results shown in FIGS. 59 and 60, concavities and convexities due to the micro phase separation were formed on the surface of Master Block (M-27A). Hence, it was shown that the diffraction grating and the organic EL element of the present invention were obtainable by use of Master Block (M-27A) described above. In addition, as is apparent from the results shown in FIGS. 59 and 60, it was shown that the use of polyethylene oxide (Homopolymer (B)) resulted in more vertical wall faces of the concave portions, and sufficiently increased the orientation in the vertical direction. Moreover, as is apparent from the results shown in FIGS. 59 and 60, it was shown that a master block having a sufficiently deep shape of the concavities and convexities was obtainable by use of polyethylene oxide (Homopolymer (B)). Note that the thickness of the coating film made of Block Copolymer (P-6) in the obtained Master Block (M-27A) was measured by use of a step measuring instrument (manufactured by Kosaka Seisakusho under the product name of "SURF-COATER ET-4000A"). As a result, the thickness of the coating film was 150 nm. In addition, Master Block (M-27A) had an average pitch of the concavities and convexities of 450 nm and an average height of the concavities and convexities of 156 nm.

Example 16

First, First Master Block (M-28A) was manufactured by employing the same method as the method for manufacturing First Master Block (M-9A) employed in Example 7, except that the kind of the block copolymer was changed from Block Copolymer (P-2) to Block Copolymer (P-7), and that the heating temperature for the annealing treatment in the vacuum oven was changed to 170° C., and the heating time therefor was changed to 12 hours. The shape of the concavities and convexities formed on the surface of the thus obtained Master Block (M-28A) was analyzed by use of a scanning probe microscope (manufactured by SII NanoTechnology Inc., under the product name of "E-sweep"). The analysis showed that concavities and convexities due to the micro phase separation were formed on the surface of Master Block (M-28A), and that the diffraction grating and the organic EL element of the present invention were obtainable by use of Master Block (M-28A) described above.

Figure 61:
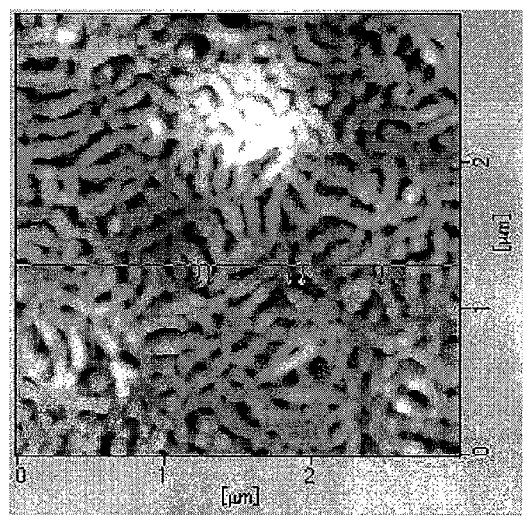
FIG. 61 is a photograph showing a concavity and convexity analysis image, in which a result of analysis conducted on a surface of a first master block obtained in Example 16 after an etching treatment by use of a scanning probe microscope is displayed on a display.

Subsequently, the coating film of the obtained Master Block (M-28A) was irradiated with ultraviolet rays at an irradiation intensity of 12 J/cm$^2$ by use of a high pressure mercury lamp, and then subjected to ultrasonic cleaning in acetic acid. Thus, First Master Block (M-29A) subjected to an etching treatment by which PMMA and PEO were selectively removed was obtained. A concavity and convexity analysis images was obtained by analyzing the shape of the concavities and convexities formed on the surface of the obtained Master Block (M-29A) by use of a scanning probe microscope (manufactured by SII NanoTechnology Inc., under the product name of "E-sweep"). FIG. 61 shows the obtained concavity and convexity analysis image. In addition, FIG. 62 shows an obtained sectional concavity and convexity analysis image.

Figure 62:
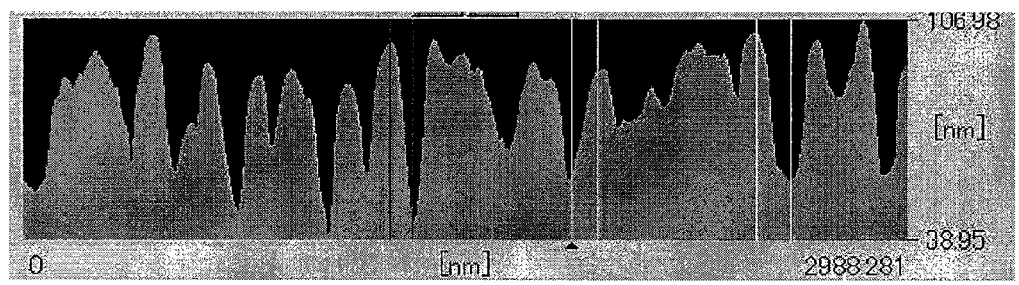
FIG. 62 is a photograph showing a sectional concavity and convexity analysis image, in which a result of analysis conducted on a section of the first master block obtained in Example 16 after the etching treatment by use of the scanning probe microscope is displayed on a display.

As is apparent from the results shown in FIGS. 61 and 62, concavities and convexities due to the micro phase separation were formed on the surface of Master Block (M-29A). Hence, it was shown that the diffraction grating and the organic EL element of the present invention were obtainable by use of Master Block (M-29A) described above. In addition, as is apparent from the results shown in FIGS. 61 and 62, the use of polyethylene oxide (Homopolymer (B)) resulted in more vertical wall faces of the concave portions, and sufficiently increased the orientation in the vertical direction. Moreover, as is apparent from the results shown in FIGS. 61 and 62, it was shown that a master block having a sufficiently deep shape of the concavities and convexities was obtainable by use of polyethylene oxide (Homopolymer (B)). Note that the thickness of the coating film made of Block Copolymer (P-7) in the obtained Master Block (M-29A) was measured by use of a step measuring instrument (manufactured by Kosaka Seisakusho under the product name of "SURF-COATER ET-4000A"). As a result, the thickness of the coating film was 105 nm. In addition, Master Block (M-29A) had an average pitch of the concavities and convexities of 118 nm and an average height of the concavities and convexities of 55 nm.

Example 17

First, First Master Block (M-30A) was manufactured by employing the same method as the method for manufacturing First Master Block (M-9A) employed in Example 7, except that the kind of the block copolymer was changed from Block Copolymer (P-2) to Block Copolymer (P-7), and that the heating temperature for the annealing treatment in the vacuum oven was changed to 190° C., and the heating time therefor was changed to 12 hours. The shape of the concavities and convexities formed on the surface of the thus obtained Master Block (M-30A) was analyzed by use of a scanning probe microscope (manufactured by SII NanoTechnology Inc., under the product name of "E-sweep"). The analysis showed that concavities and convexities due to the micro phase separation were formed on the surface of Master Block (M-30A), and that the diffraction grating and the organic EL element of the present invention were obtainable by use of Master Block (M-30A) described above.

Figure 63:
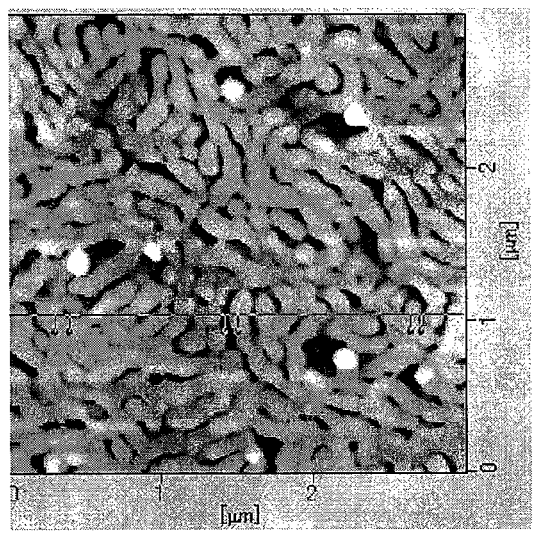
FIG. 63 is a photograph showing a concavity and convexity analysis image, in which a result of analysis conducted on a surface of a first master block obtained in Example 17 after an etching treatment by use of a scanning probe microscope is displayed on a display.

Subsequently, the coating film of the obtained Master Block (M-30A) was irradiated with ultraviolet rays at an irradiation intensity of 12 J/cm$^2$ by use of a high pressure mercury lamp, and then subjected to ultrasonic cleaning in acetic acid. Thus, First Master Block (M-31) subjected to an etching treatment by which PMMA and PEO were selectively removed was obtained. A concavity and convexity analysis image was obtained by analyzing the shape of the concavities and convexities formed on the surface of the obtained Master Block (M-31A) by use of a scanning probe microscope (manufactured by SII NanoTechnology Inc., under the product name of "E-sweep"). FIG. 63 shows the obtained concavity and convexity analysis image. In addition, FIG. 64 shows an obtained sectional concavity and convexity analysis image.

Figure 64:
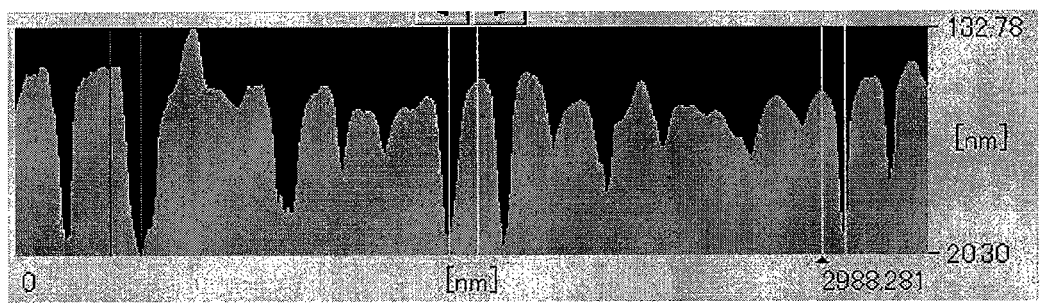
FIG. 64 is a photograph showing a sectional concavity and convexity analysis image, in which a result of analysis conducted on a section of the first master block obtained in Example 17 after the etching treatment by use of the scanning probe microscope is displayed on a display.

As is apparent from the results shown in FIGS. 63 and 64, concavities and convexities due to the micro phase separation were formed on the surface of Master Block (M-31A). Hence, it was shown that the diffraction grating and the organic EL element of the present invention were obtainable by use of Master Block (M-31A) described above. In addition, as is apparent from the results shown in FIGS. 63 and 64, it was shown that the use of polyethylene oxide (Homopolymer (B)) resulted in more vertical wall faces of the concave portions, and sufficiently increased the orientation in the vertical direction. Moreover, as is apparent from the results shown in FIGS. 63 and 64, it was shown that a master block having a sufficiently deep shape of the concavities and convexities was obtainable by use of polyethylene oxide (Homopolymer (B)). Note that the thickness of the coating film made of Block Copolymer (P-7) in the obtained Master Block (M-31A) was measured by use of a step measuring instrument (manufactured by Kosaka Seisakusho under the product name of "SURF-COATER ET-4000A"). As a result, the thickness of the coating film was 120 nm. In addition, Master Block (M-31A) had an average pitch of the concavities and convexities of 142 nm and an average height of the concavities and convexities of 68 nm.

Example 18

First, First Master Block (M-32A) was manufactured by employing the same method as the method for manufacturing First Master Block (M-9A) employed in Example 7, except that the kind of the block copolymer was changed from Block Copolymer (P-2) to Block Copolymer (P-3), and that the heating temperature for the annealing treatment in the vacuum oven was changed to 210° C., and the heating time therefor was changed to 2 hours. The shape of the concavities and convexities formed on the surface of the thus obtained Master Block (M-32A) was analyzed by use of a scanning probe microscope (manufactured by SII NanoTechnology Inc., under the product name of "E-sweep"). The analysis showed that concavities and convexities due to the micro phase separation were formed on the surface of Master Block (M-32A), and that the diffraction grating and the organic EL element of the present invention were obtainable by use of Master Block (M-32A) described above.

Figure 65:
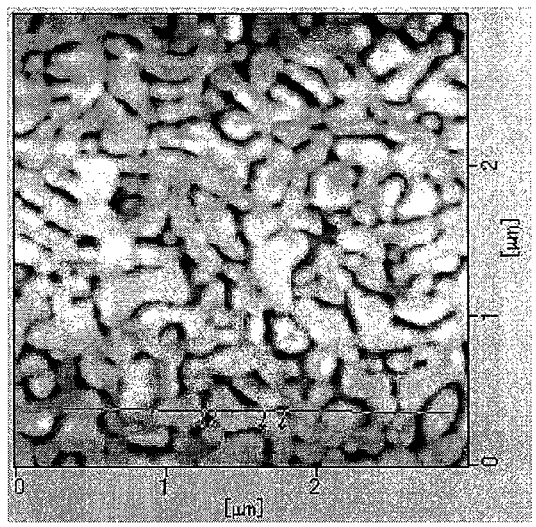
FIG. 65 is a photograph showing a concavity and convexity analysis image, in which a result of analysis conducted on a surface of a first master block obtained in Example 18 after an etching treatment by use of a scanning probe microscope is displayed on a display.

Subsequently, the coating film of the obtained Master Block (M-32A) was irradiated with ultraviolet rays at an irradiation intensity of 12 J/cm$^2$ by use of a high pressure mercury lamp, and then subjected to ultrasonic cleaning in acetic acid. Thus, First Master Block (M-33A) subjected to an etching treatment by which PMMA and PEO were selectively removed was obtained. A concavity and convexity analysis images was obtained by analyzing the shape of the concavities and convexities formed on the surface of the obtained Master Block (M-33A) by use of a scanning probe microscope (manufactured by SII NanoTechnology Inc., under the product name of "E-sweep"). FIG. 65 shows the obtained concavity and convexity analysis image. In addition, FIG. 66 shows an obtained sectional concavity and convexity analysis image.

Figure 66:
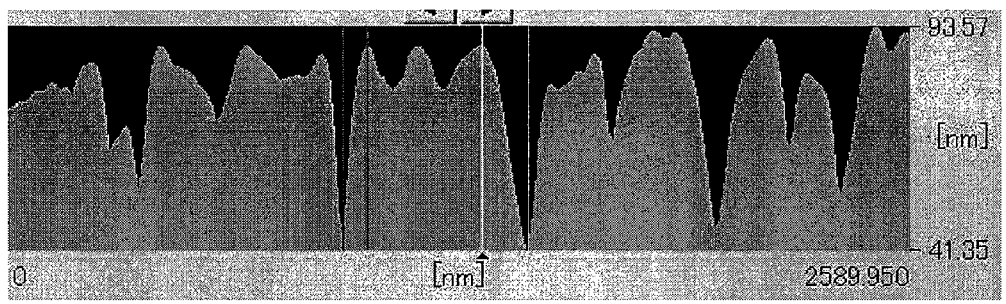
FIG. 66 is a photograph showing a sectional concavity and convexity analysis image, in which a result of analysis conducted on a section of the first master block obtained in Example 18 after the etching treatment by use of the scanning probe microscope is displayed on a display.

As is apparent from the results shown in FIGS. 65 and 66, concavities and convexities due to the micro phase separation were formed on the surface of Master Block (M-33A). Hence, it was shown that the diffraction grating and the organic EL element of the present invention were obtainable by use of Master Block (M-33A) described above. In addition, as is apparent from the results shown in FIGS. 65 and 66, it was shown that the use of polyethylene oxide (Homopolymer (B)) resulted in more vertical wall faces of the concave portions, and sufficiently increased the orientation in the vertical direction. Moreover, as is apparent from the results shown in FIGS. 65 and 66, it was shown that a master block having a sufficiently deep shape of the concavities and convexities was obtainable by use of polyethylene oxide (Homopolymer (B)). Note that the thickness of the coating film made of Block Copolymer (P-3) in the obtained Master Block (M-33A) was measured by use of a step measuring instrument (manufactured by Kosaka Seisakusho under the product name of "SURF-COATER ET-4000A"). As a result, the thickness of the coating film was 110 nm. In addition, Master Block (M-33A) had an average pitch of the concavities and convexities of 123 nm and an average height of the concavities and convexities of 25 nm.

Example 19

First, First Master Block (M-34A) was manufactured by employing the same method as the method for manufacturing First Master Block (M-9A) employed in Example 7, except that the kind of the block copolymer was changed from Block Copolymer (P-2) to Block Copolymer (P-3), that the ratio of Homopolymer (B) dissolved in the toluene solution was changed such that the Homopolymer (B) was 50 parts by mass relative to 100 parts by mass of Block Copolymer (P-2), and that the heating temperature for the annealing treatment in the vacuum oven was changed to 210° C., and the heating time therefor was changed to 2 hours. The shape of the concavities and convexities formed on the surface of the thus obtained Master Block (M-34A) was analyzed by use of a scanning probe microscope (manufactured by SII NanoTechnology Inc., under the product name of "E-sweep"). The analysis showed that concavities and convexities due to the micro phase separation were formed on the surface of Master Block (M-34A), and that the diffraction grating and the organic EL element of the present invention were obtainable by use of Master Block (M-34A) described above.

Figure 67:
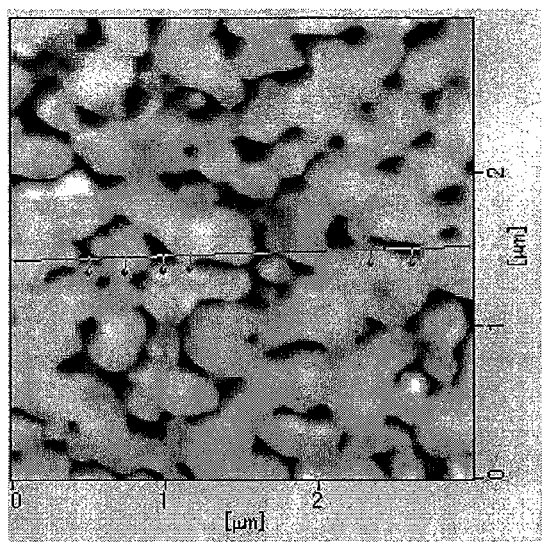
FIG. 67 is a photograph showing a concavity and convexity analysis image, in which a result of analysis conducted on a surface of a first master block obtained in Example 19 after an etching treatment by use of a scanning probe microscope is displayed on a display.

Subsequently, the coating film of the obtained Master Block (M-34A) was irradiated with ultraviolet rays at an irradiation intensity of 12 J/cm$^2$ by use of a high pressure mercury lamp, and then subjected to ultrasonic cleaning in acetic acid. Thus, First Master Block (M-35A) subjected to an etching treatment by which PMMA and PEO were selectively removed was obtained. Concavity and convexity analysis images were obtained by analyzing the shape of the concavities and convexities formed on the surface of the obtained Master Block (M-35A) by use of a scanning probe microscope (manufactured by SII NanoTechnology Inc., under the product name of "E-sweep"). FIG. 67 shows the obtained concavity and convexity analysis image. In addition, FIG. 68 shows an obtained sectional concavity and convexity analysis image.

Figure 68:
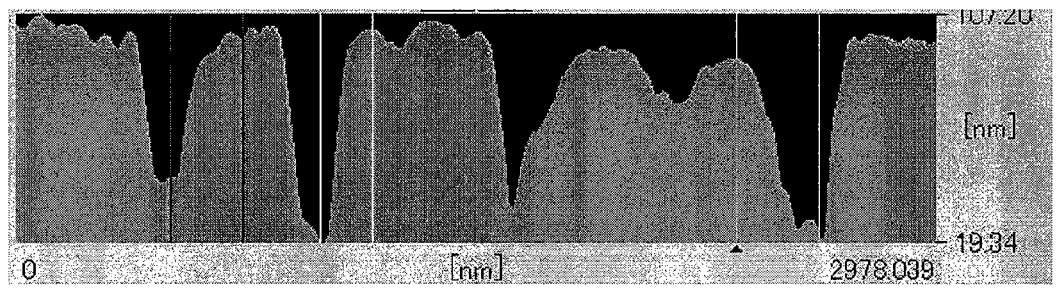
FIG. 68 is a photograph showing a sectional concavity and convexity analysis image, in which a result of analysis conducted on a section of the first master block obtained in Example 19 after the etching treatment by use of the scanning probe microscope is displayed on a display.

As is apparent from the results shown in FIGS. 67 and 68, concavities and convexities due to the micro phase separation were formed on the surface of Master Block (M-35A). Hence, it was shown that the diffraction grating and the organic EL element of the present invention were obtainable by use of Master Block (M-35A) described above. In addition, as is apparent from the results shown in FIGS. 67 and 68, it was shown that the use of polyethylene oxide (Homopolymer (B)) resulted in more vertical wall faces of the concave portions, and sufficiently increased the orientation in the vertical direction. Moreover, as is apparent from the results shown in FIGS. 67 and 68, it was shown that a master block having a sufficiently deep shape of the concavities and convexities was obtainable by use of polyethylene oxide (Homopolymer (B)). Note that the thickness of the coating film made of Block Copolymer (P-3) in the obtained Master Block (M-35A) was measured by use of a step measuring instrument (manufactured by Kosaka Seisakusho under the product name of "SURF-COATER ET-4000A"). As a result, the thickness of the coating film was 100 nm. In addition, Master Block (M-35A) had an average pitch of the concavities and convexities of 350 nm and an average height of the concavities and convexities of 65 nm.

Comparative Example 9

First, First Master Block (M-36A) was manufactured by employing the same method as the method for manufacturing First Master Block (M-9A) employed in Example 7, except that the kind of the block copolymer was changed from Block Copolymer (P-2) to Comparative Block Copolymer (CP-1), and that the heating temperature for the annealing treatment in the vacuum oven was changed to 190° C., and the heating time therefor was changed to 12 hours. The shape of the concavities and convexities formed on the surface of the thus obtained Master Block (M-36A) was analyzed by use of a scanning probe microscope (manufactured by SII NanoTechnology Inc., under the product name of "E-sweep"). The analysis showed that the concavities and convexities due to the micro phase separation were insufficient.

Figure 69:
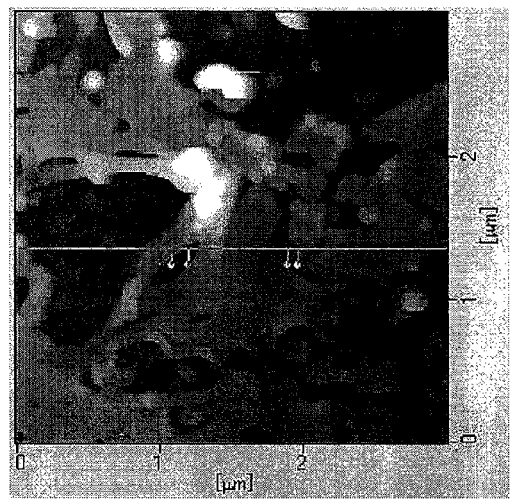
FIG. 69 is a photograph showing a concavity and convexity analysis image, in which a result of analysis conducted on a surface of a first master block obtained in Comparative Example 9 after an etching treatment by use of a scanning probe microscope is displayed on a display.

Subsequently, the coating film of the obtained Master Block (M-36A) was irradiated with ultraviolet rays at an irradiation intensity of 12 J/cm$^2$ by use of a high pressure mercury lamp, and then subjected to ultrasonic cleaning in acetic acid. Thus, First Master Block (M-37A) subjected to an etching treatment by which PMMA was selectively removed was obtained. A concavity and convexity analysis image was obtained by analyzing the shape of the concavities and convexities formed on the surface of the obtained Master Block (M-37A) by use of a scanning probe microscope (manufactured by SII NanoTechnology Inc., under the product name of "E-sweep"). FIG. 69 shows the obtained concavity and convexity analysis image. In addition, FIG. 70 shows an obtained sectional concavity and convexity analysis image.

Figure 70:
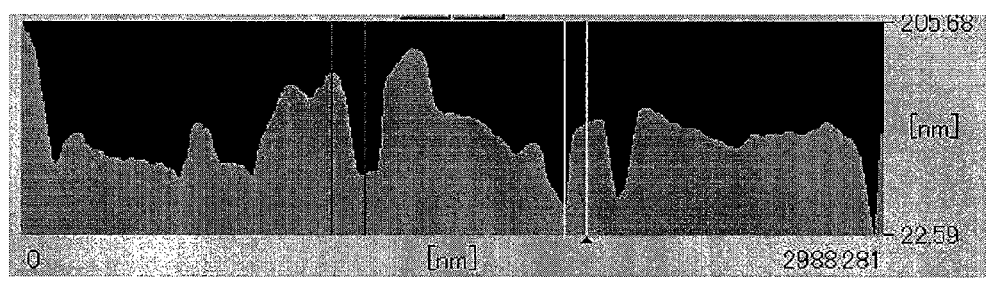
FIG. 70 is a photograph showing a sectional concavity and convexity analysis image, in which a result of analysis conducted on a section of the first master block obtained in Comparative Example 9 after the etching treatment by use of the scanning probe microscope is displayed on a display.

From the results shown in FIGS. 69 and 70, it was found that no concavities and convexities with sufficient depths were formed even after the etching, and the orientation in the vertical direction was particularly low, in the master block obtained in Comparative Example 9 by use of Block Copolymer (CP-1) having a number average molecular weight of less than 500000. Hence, it was found that a diffraction grating having a sufficiently low wavelength-dependence and a sufficiently low directivity was not obtainable by use of the master block obtained in Comparative Example 9.

Comparative Example 10

First, First Master Block (M-38A) was manufactured by employing the same method as the method for manufacturing First Master Block (M-9A) employed in Example 7, except that the kind of the block copolymer was changed from Block Copolymer (P-2) to Comparative Block Copolymer (CP-2), and that the heating temperature for the annealing treatment in the vacuum oven was changed to 190° C., and the heating time therefor was changed to 12 hours. The shape of the concavities and convexities formed on the surface of the thus obtained Master Block (M-38A) was analyzed by use of a scanning probe microscope (manufactured by SII NanoTechnology Inc., under the product name of "E-sweep"). As a result, the concavities and convexities due to the micro phase separation were insufficient.

Figure 71:
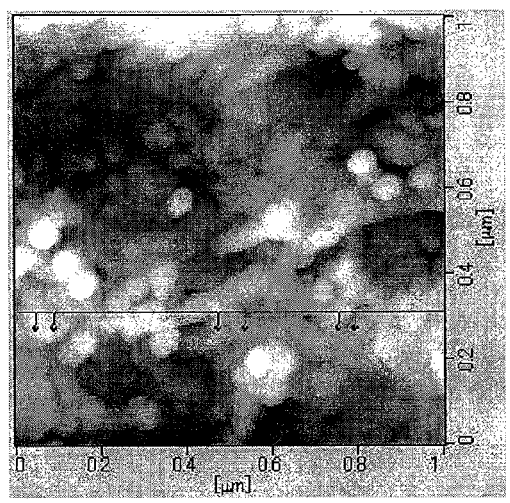
FIG. 71 is a photograph showing a concavity and convexity analysis image, in which a result of analysis conducted on a surface of a first master block obtained in Comparative Example 10 after an etching treatment by use of a scanning probe microscope is displayed on a display.

Subsequently, the coating film of the obtained Master Block (M-38A) was irradiated with ultraviolet rays at an irradiation intensity of 12 J/cm$^2$ by use of a high pressure mercury lamp, and then subjected to ultrasonic cleaning in acetic acid. Thus, First Master Block (M-39A) subjected to an etching treatment by which PMMA was selectively removed was obtained. A concavity and convexity analysis images was obtained by analyzing the shape of the concavities and convexities formed on the surface of the obtained Master Block (M-39A) by use of a scanning probe microscope (manufactured by SII NanoTechnology Inc., under the product name of "E-sweep"). FIG. 71 shows the obtained concavity and convexity analysis image. In addition, FIG. 72 shows an obtained sectional concavity and convexity analysis image.

Figure 72:
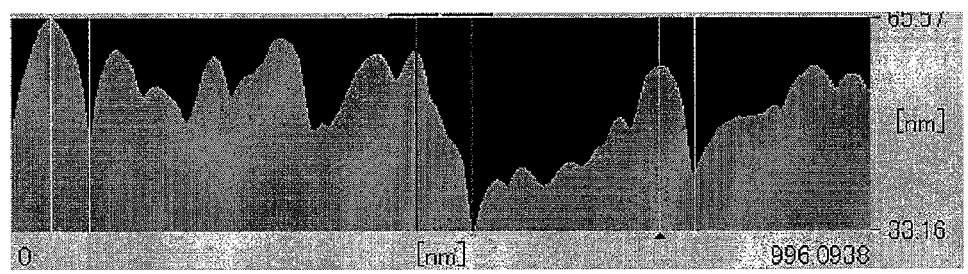
FIG. 72 is a photograph showing a sectional concavity and convexity analysis image, in which a result of analysis conducted on a section of the first master block obtained in Comparative Example 10 after the etching treatment by use of the scanning probe microscope is displayed on a display.

From the results shown in FIGS. 71 and 72, it can be understood that no concavities and convexities with sufficient depths were formed even after the etching, and the orientation in the vertical direction was particularly low, in the master block obtained in Comparative Example 10 by use of Block Copolymer (CP-1) having a number average molecular weight of less than 500000. Hence, it was found that a diffraction grating having a sufficiently low wavelength-dependence and a sufficiently low directivity was not obtainable by use of the master block obtained in Comparative Example 10.

<Evaluation of Characteristics of Organic EL Elements Obtained in Example 2 and Comparative Examples 6 to 10>

(iv) Evaluation of Light Emission Efficiency

Figure 73:
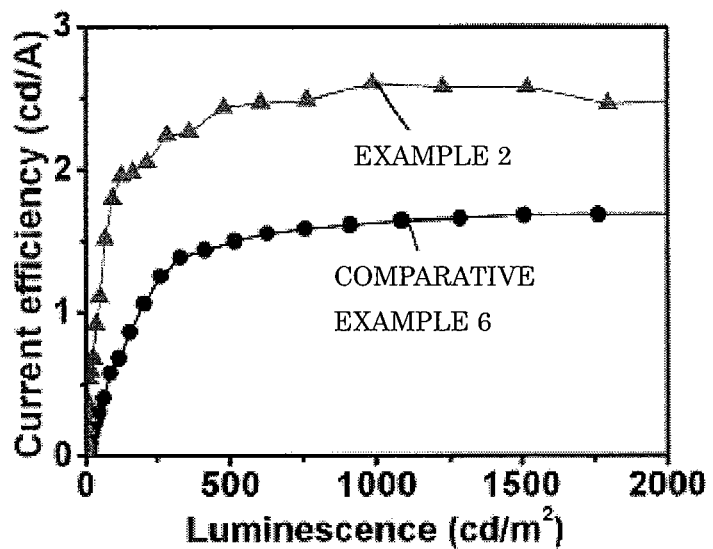
FIG. 73 is a graph showing the relationship between the current efficiency and the luminance inorganic EL elements obtained in Example 2 and Comparative Example 6.
Figure 74:
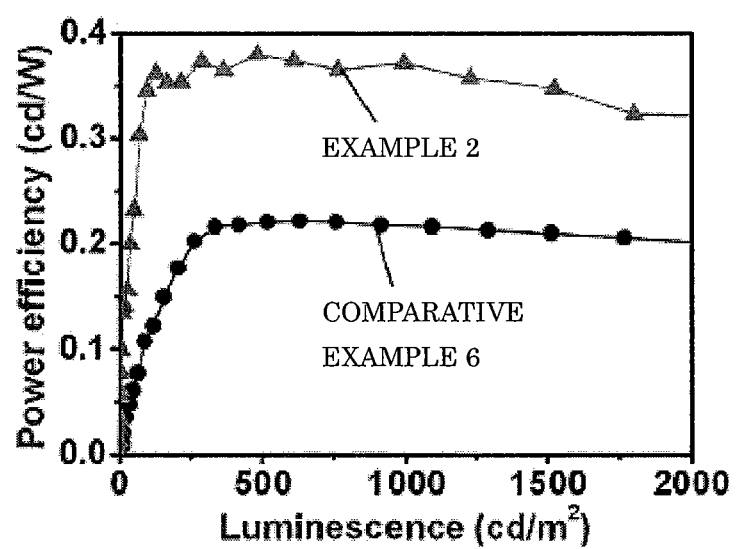
FIG. 74 is a graph showing the relationship between the power efficiency and the luminance in the organic EL elements obtained in Example 2 and Comparative Example 6.

The light emission efficiency of each of the organic EL elements obtained in Example 2 and Comparative Example 6 were determined as follows. Specifically, the current efficiency and the power efficiency of each of the organic EL elements were calculated by employing the same method as the method used to determine the light emission efficiency of the organic EL element obtained in Example (the method employed for the above-described (iii) Evaluation of Light Emission Efficiency), except that the organic EL elements obtained in Example 2 and Comparative Example 6 were used. FIG. 73 shows the relationship between the current efficiency and the luminance. In addition, FIG. 74 shows the relationship between the power efficiency and the luminance. As is apparent from the results shown in FIGS. 73 and 74, the current efficiency and the voltage efficiency of the organic EL element (Example 2) of the present invention at a luminance of 2000 cd/m$^2$ were 1.5 times and 1.6 times those of the organic EL element (Comparative Example 6) having no concavities and convexities. Hence, it was shown that the organic EL element (Example 2) of the present invention had a sufficient external extraction efficiency.

(v) Evaluation of Wavelength-Dependence

Figure 75:
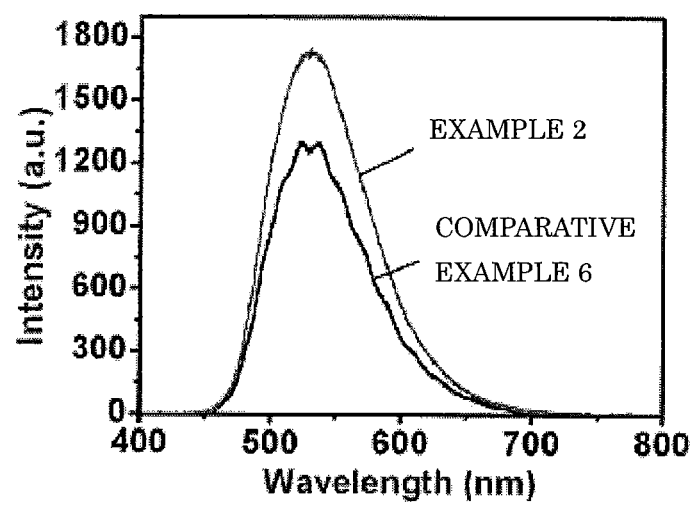
FIG. 75 is a graph showing emission spectra of the organic EL elements obtained in Example 2 and Comparative Example 6.
Figure 76:
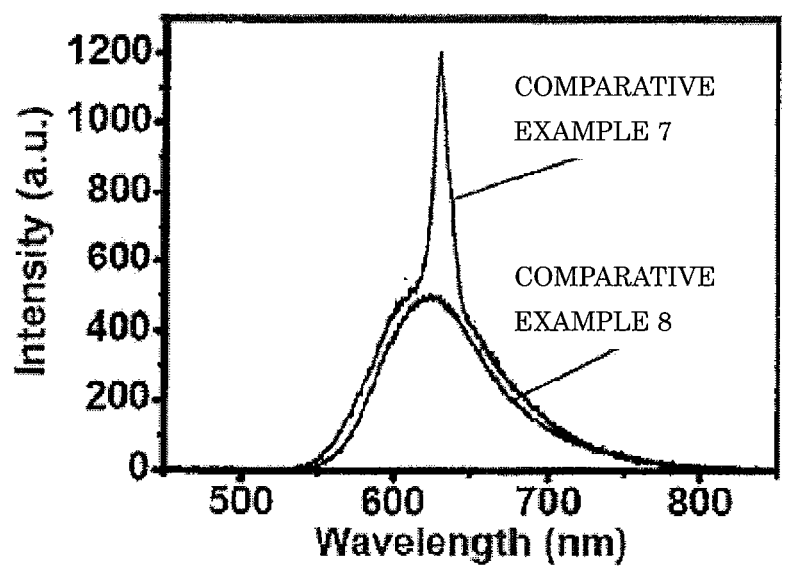
FIG. 76 is a graph showing emission spectra of organic EL elements obtained in Comparative Example 7 and Comparative Example 8.

An emission spectrum of each of the organic EL elements obtained in Example 2 and Comparative Examples 6 to 8 was measured by employing the same method as the method used to determine the wavelength-dependence of the organic EL element obtained in Example 1 (the method employed for the above-described (i) Evaluation of Wave length-Dependence), except that the organic EL elements obtained in Example 2 and Comparative Examples 6 to 8 were used. FIG. 75 shows the obtained results for Example 2 and Comparative Example 6. Meanwhile, FIG. 76 shows the obtained results for Comparative Examples 7 and 8. As is apparent from the results shown in FIGS. 75 and 76, the organic EL element (Example 2) of the present invention had almost the same emission wave length region as that of the organic EL element (Comparative Example 6) having no concavities and convexities. Hence, it was shown that the wavelength-dependence of light emission of the organic EL element (Example 2) of the present invention was sufficiently low. In contrast, the emission wavelength region was narrower in the case (Comparative Example 7) where the concavities and convexities were formed on the surface of the cured resin layer in a periodic arrangement than in the case of the organic EL element (Comparative Example 8) having no concavities and convexities.

(vi) Evaluation of Directivity

The directivity of each of the organic EL elements obtained in Example 2 and Comparative Example 7 was evaluated by the following method. The organic EL element was visually observed in all directions (directions of all around 360°). Neither particularly bright sites nor particularly dark sites were observed when the organic EL element obtained in Example 2 was observed in any of the directions all around 360°, and the brightness was uniform in all the directions. In this way, it was shown that the directivity of light emission of the organic EL element (Example 2) of the present invention was sufficiently low. In contrast, it was shown that the organic EL element obtained in Comparative Example 7 tended to be particularly bright when observed in a specific direction, and tended to be particularly dark when observed in a direction perpendicular to the specific direction.

Example 20

A block copolymer solution was obtained by dissolving 100 mg of Block Copolymer (P-2) in 10 g of toluene, followed by filtration through a membrane filter having a pore diameter of 0.50 μm. The obtained block copolymer solution was spin coated onto a polyphenylene sulfide film (manufactured by Toray Industries, Inc.) serving as a base member at a spin speed of 800 rpm. Thus, First Master Block (M-40A) having concavities and convexities formed on a surface thereof due to micro phase separation was obtained.

Next, the coating film of the obtained Master Block (M-40A) was irradiated with ultraviolet rays in an accumulated light amount of 12 J/cm$^2$ by use of a high pressure mercury lamp, and then subjected to ultrasonic cleaning in acetic acid. Thus, First Master Block (M-41A) subjected to an etching treatment by which PMMA was selectively removed was obtained.

Subsequently, a silicone-based polymer [a resin composition of a mixture of 90% by mass of a silicone rubber (manufactured by Wacker Chemie AG under the product name of "Elastosil RT601") and 10% by mass of a curing agent] was applied by a dropping method onto the surface having the concavities and convexities formed thereon of First Master Block (M-41A), then cured by being heated at 50° C. for 1 hour, and thereafter detached from Master Block (M-41A). Thus, Master Block (M-42A) was obtained. Next, a glass substrate (manufactured by Matsunami Glass Ind. Ltd., under the product name of "Micro slide glass") and a curable resin (manufactured by Norland Optical Adhesive under the product name of "NOA 81") were prepared. The curable resin was applied onto the glass substrate. Thereafter, the curable resin was cured by irradiation with ultraviolet rays for 1 hour, with the obtained Master Block (M-42A) being pressed thereto. After that, Master Block (M-42A) was detached from the cured resin layer, and thereby a cured resin layer having concavities and convexities formed thereon was formed on the glass substrate. Thus, a diffraction grating was obtained.

A concavity and convexity analysis image was obtained by analyzing the shape of the concavities and convexities formed on the surface of the thus obtained cured resin layer by use of an atomic force microscope (a scanning probe microscope equipped with an environment control unit "Nanonavi II Station/E-sweep" manufactured by SII NanoTechnology Inc.). Note that, for this analysis, height data were measured at 65536 (256 columns×256 rows) measuring points in a measuring region of 3 μm square on the nanometer scale. Then, the obtained concavity and convexity analysis image was subjected to a flattening process including primary inclination correction, and then to two-dimensional fast Fourier transform processing. Thus, a Fourier-transformed image was obtained. It was shown that the Fourier-transformed image showed a circular pattern substantially centered at an origin at which an absolute value of wavenumber was 0 μm$^{-1}$, and the circular pattern was present within a region where an absolute value of wavenumber was within a range of 10 μm$^{-1}$ or less. In addition, the average value (m) of the depth distribution, the median (M) of the depth distribution, the standard deviation (σ), and the kurtosis (k) were determined on the basis of the obtained height data at the measuring points by use of the same methods as described above, respectively. Table 1 shows the results of the average value (m), the median (M), the standard deviation (σ), and the kurtosis (k).

Subsequently, on the cured resin layer of the obtained diffraction grating, a transparent electrode (ITO, thickness: 120 nm), a hole transporting layer [N,N'-diphenyl-N,N'-bis (3-methylphenyl)-1,1'-diphenyl-4,4'-diamine, thickness: 40 nm], an electron transporting layer (8-hydroxyquinoline aluminum, thickness: 30 nm), a lithium fluoride layer (thickness: 1.5 nm), and a metal electrode (aluminum, thickness: 150 nm) were each stacked by a vapor deposition method, and formed into such a shape that the shape of the concavities and convexities formed on the surface of the cured resin layer was maintained. Thus, an organic EL element was obtained.

Example 21

A block copolymer solution was obtained by dissolving 51 mg of Block Copolymer (P-2) and 15 mg of a polymethyl methacrylate homopolymer in 6.4 g of toluene, followed by filtration through a membrane filter having a pore diameter of 0.50 μm. The obtained block copolymer solution was spin coated onto a polyphenylene sulfide film (manufactured by Toray Industries, Inc.) serving as a base member at a spin speed of 800 rpm, and then subjected to an annealing treatment in an vacuum oven of 110° C. for 7 hours. Thus, First Master Block (M-43A) having concavities and convexities formed on a surface thereof due to micro phase separation was obtained.

The coating film of the obtained Master Block (M-43A) was irradiated with ultraviolet rays in an accumulated light amount of 12 J/cm$^2$ by use of a high pressure mercury lamp, and then subjected to ultrasonic cleaning in acetic acid. Thus, First Master Block (M-44A) subjected to an etching treatment by which PMMA was selectively removed was obtained. A concavity and convexity analysis image was obtained by analyzing the shape of the concavities and convexities formed on the surface of the obtained master block by use of an atomic force microscope (a scanning probe microscope equipped with an environment control unit "Nanonavi II Station/E-sweep" manufactured by SII NanoTechnology Inc.). Then, the obtained concavity and convexity analysis image was subjected to a flattening process including primary inclination correction, and then to two-dimensional fast Fourier transform processing. Thus, a Fourier-transformed image was obtained. It was shown that the First Master Block (M-44A) showed, in the Fourier-transformed image, a circular pattern substantially centered at an origin at which an absolute value of wavenumber is 0 μm$^{-1}$, and that the circular pattern was present within a region where an absolute value of wavenumber was within a range of 10 μm$^{-1}$ or less. In addition, Master Block (M-44A) had an average pitch of the concavities and convexities of 200 to 400 nm, and an average height of the concavities and convexities of 80 nm.

A diffraction grating was manufactured and an organic EL element was obtained in the same manner as in Example 20, except that the thus obtained Master Block (M-44A) was used instead of Master Block (M-42A) of Example 20. Note that a concavity and convexity analysis image was obtained by analyzing the shape of the concavities and convexities formed on the surface of the cured resin layer of the thus obtained diffraction grating by use of an atomic force microscope (a scanning probe microscope equipped with an environment control unit "Nanonavi II Station/E-sweep" manufactured by SII NanoTechnology Inc.). Note that, for this analysis, height data were measured at 65536 (256 columns×256 rows) measuring points in a measuring region of 3 μm square on the nanometer scale. Then, the obtained concavity and convexity analysis image was subjected to a flattening process including primary inclination correction, and then to two-dimensional fast Fourier transform processing. Thus, a Fourier-transformed image was obtained. It was shown that the Fourier-transformed image showed a circular pattern substantially centered at an origin at which an absolute value of wavenumber was 0 µm$^{-1}$, and that the circular pattern was present within a region where an absolute value of wavenumber was within a range of 10 µm$^{-1}$ or less. In addition, the average value (m) of the depth distribution, the median (M) of the depth distribution, the standard deviation (σ), and the kurtosis (k) were determined on the basis of the obtained height data at the measuring points by use of the same methods as described above, respectively. Table 1 shows the results of the average value (m), the median (M), the standard deviation (σ), and the kurtosis (k).

Example 22

A block copolymer solution was obtained by dissolving 100 mg of Block Copolymer (P-2) and 30 mg of polymethyl methacrylate in 10 g of toluene, followed by filtration through a membrane filter having a pore diameter of 0.50 µm. The obtained block copolymer solution was spin coated onto a polyphenylene sulfide film (manufactured by Toray Industries, Inc.) serving as a base member at a spin speed of 800 rpm. Then, the coating film was subjected to an annealing treatment in a vacuum oven of 110° C. for 7 hours. Thus, First Master Block (M-45A) having concavities and convexities formed on a surface thereof due to micro phase separation was obtained.

Next, the coating film of the obtained Master Block (M-45A) was irradiated with ultraviolet rays in an accumulated light amount of 12 J/cm$^2$ by use of a high pressure mercury lamp, and then cleaned by being immersed in acetic acid. Thus, First Master Block (M-46A) subjected to an etching treatment by which PMMA was selectively removed was obtained.

Subsequently, a silicone-based polymer [a resin composition of a mixture of 90% by mass of a silicone rubber (manufactured by Wacker Chemie AG under the product name of "Elastosil RT601") and 10% by mass of a curing agent] was applied by a dropping method onto the surface having the concavities and convexities of First Master Block (M-46A), then cured by being heated at 50° C. for 1 hour, and thereafter detached from Master Block (M-46A). Thus, Master Block (M-47A) was obtained.

A diffraction grating was manufactured and an organic EL element was obtained in the same manner as in Example 20, except that the thus obtained Master Block (M-47A) was used instead of Master Block (M-42A) of Example 20. Note that a concavity and convexity analysis image was obtained by analyzing the shape of the concavities and convexities formed on the surface of the cured resin layer of the thus obtained diffraction grating by use of an atomic force microscope (a scanning probe microscope equipped with an environment control unit "Nanonavi II Station/E-sweep" manufactured by SII NanoTechnology Inc.). Note that, for this analysis, height data were measured at 65536 (256 columns×256 rows) measuring points in a measuring region of 3 µm square on the nanometer scale. Then, the obtained concavity and convexity analysis image was subjected to a flattening process including secondary inclination correction, and then to two-dimensional fast Fourier transform processing. Thus, a Fourier-transformed image was obtained. It was shown that the Fourier-transformed image showed a circular pattern substantially centered at an origin at which an absolute value of wavenumber was 0 µm$^{-1}$, and that the circular pattern was present within a region where an absolute value of wavenumber was within a range of 10 µm$^{-1}$ or less. In addition, the average value (m) of the depth distribution, the median (M) of the depth distribution, the standard deviation (σ), and the kurtosis (k) were determined on the basis of the obtained height data at the measuring points by use of the same methods as described above, respectively. Table 1 shows the results of the average value (m), the median (M), the standard deviation (σ), and the kurtosis (k).

Example 23

A block copolymer solution was obtained by dissolving 60 mg of Block Copolymer (P-2) and 16 mg of polyethylene oxide in 5 g of toluene, followed by filtration through a membrane filter having a pore diameter of 0.50 µm. The obtained block copolymer solution was spin coated onto a polyphenylene sulfide film (manufactured by Toray Industries, Inc.) serving as a base member at a spin speed of 800 rpm, and subjected to an annealing treatment in an oven of 170° C. for 3 hours. Thus, First Master Block (M-48A) having concavities and convexities formed on a surface thereof due to micro phase separation was obtained.

Next, the coating film of the obtained Master Block (M-48A) was irradiated with ultraviolet rays in an accumulated light amount of 12 J/cm$^2$ by use of a high pressure mercury lamp, and then subjected to ultrasonic cleaning in acetic acid. Thus, First Master Block (M-49A) subjected to an etching treatment by which PMMA was selectively removed was obtained. Subsequently, the obtained First Master Block (M-49A) was heated under a temperature condition of 130° C. for 1 hour. Thus, Master Block (M-50A) subjected to a heat treatment was obtained.

Subsequently, a silicone-based polymer [a resin composition of a mixture of 90% by mass of a silicone rubber (manufactured by Wacker Chemie AG under the product name of "Elastosil RT601") and 10% by mass of a curing agent] was applied by a dropping method onto the surface having concavities and convexities of Master Block (M-50A), then cured by being heated at 50° C. for 1 hour, and thereafter detached from Master Block (M-50A). Thus, Master Block (M-51A) was obtained.

Figure 77:
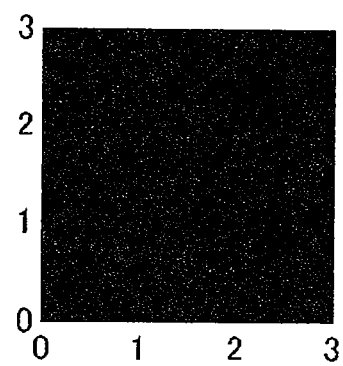
FIG. 77 is a photograph showing a concavity and convexity analysis image, in which a result of analysis conducted on a surface of a diffraction grating obtained in Example 23 by use of an atomic force microscope is displayed on a display.
Figure 78:
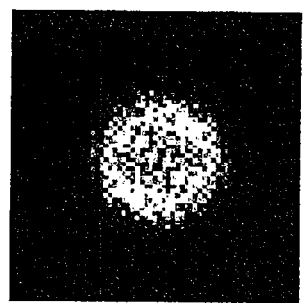
FIG. 78 is a photograph showing a Fourier-transformed image, in which a result of two-dimensional fast Fourier transform processing conducted on the concavity and convexity analysis image, which was obtained by use of the atomic force microscope, of the surface of the diffraction grating obtained in Example 23 is displayed on a display.
Figure 79:
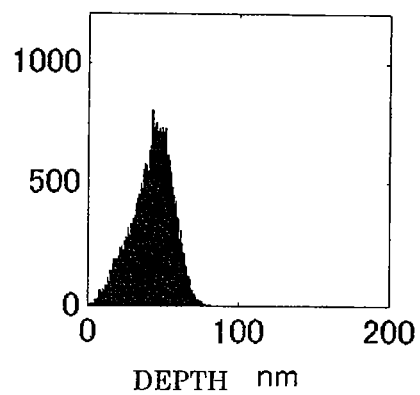
FIG. 79 is a photograph showing a graph of the depth distribution of the concavities and convexities on the surface of the diffraction grating obtained in Example 23.

A diffraction grating was manufactured and an organic EL element was obtained in the same manner as in Example 20, except that the thus obtained Master Block (M-51A) was used instead of Master Block (M-42A) of Example 20. Note that a concavity and convexity analysis image was obtained by analyzing the shape of the concavities and convexities formed on the surface of the cured resin layer of the thus obtained diffraction grating by use of an atomic force microscope (a scanning probe microscope equipped with an environment control unit "Nanonavi II Station/E-sweep" manufactured by SII NanoTechnology Inc.). FIG. 77 shows the obtained concavity and convexity analysis image. Note that, for this analysis, height data were measured at 65536 (256 columns×256 rows) measuring points in a measuring region of 3 µm square on the nanometer scale. Then, the obtained concavity and convexity analysis image was subjected to a flattening process including primary inclination correction, and then to two-dimensional fast Fourier transform processing. Thus, a Fourier-transformed image was obtained. FIG. 78 shows the obtained Fourier-transformed image. It was shown that the Fourier-transformed image showed a circular pattern substantially centered at an origin at which an absolute value of wavenumber was 0 µm$^{-1}$, and that the circular pattern was present within a region where an absolute value of wavenumber was within a range of 10 µm or less. In addition, the average value (m) of the depth distribution, the median (M) of the depth distribution, the standard deviation (σ), and the kurtosis (k) were determined on the basis of the obtained height data at the measuring points by use of the same methods as described above, respectively. Table 1 shows the results of the average value (m), the median (M), the standard deviation (σ), and the kurtosis (k). Note that FIG. 79 shows a graph of the depth distribution.

Figure 80:
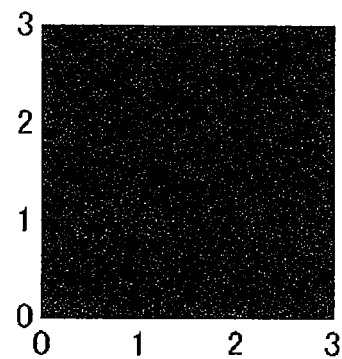
FIG. 80 is a photograph showing an image which shows the relationship of the distance between a transparent electrode and a metal electrode determined from the result of analysis conducted on the surface of the diffraction grating obtained in Example 23 by use of the atomic force microscope.
Figure 81:
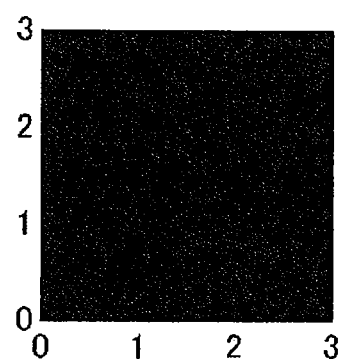
FIG. 81 is a photograph showing an image of leakage-current prone regions determined from the result of analysis conducted on the surface of the diffraction grating obtained in Example 23 by use of the atomic force microscope.
Figure 82:
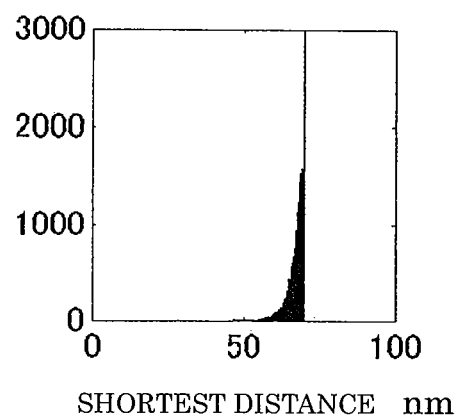
FIG. 82 is a graph showing the distribution of the shortest distance determined from the result of analysis conducted on the surface of the diffraction grating obtained in Example 23 by use of the atomic force microscope.

In addition, the distribution of the shortest distance was calculated on the basis of the concavity and convexity analysis image (SPM image) in the following manner, and the ratio of the presence of regions (the leakage-current prone regions) in which the shortest distance of the inter-electrode distance was a half or less of the standard distance (70 nm) (i.e., the shortest distance was 35 nm or less) was determined. Specifically, on the assumption that a transparent electrode and a metal electrode having the same shape as that of the concavity and convexity analysis image (SPM image) were away from each other by the standard distance, the distance between the transparent electrode and the metal electrode was calculated for each measuring point. Then, an image of the shortest distances and the distribution of shortest distance were obtained by a process in which a case where the obtained shortest distance was a half or less of the standard distance was expressed in white, whereas a case where the obtained shortest distance was greater than a half of the standard distance remained in the original color. Of the obtained results, an image expressing the distance between the transparent electrode and the metal electrode on a gray scale is shown in FIG. 80 (in FIG. 80, sites with long distances are expressed in bright colors (while), and sites with short distances are expressed in dark colors (black)), an image concerning the leakage-current prone regions is shown in FIG. 81 (In FIG. 81, the leakage-current prone regions are expressed in white; note that no white regions existed in this example), and a graph of the distribution of the shortest distances is shown in FIG. 82. As a result of the measurement, the ratio of the presence of the leakage-current prone regions was 0.0%.

Example 24

A block copolymer solution was obtained by dissolving 50 mg of Block Copolymer (P-2) and 13 g of polyethylene oxide in 5 g of toluene, followed by filtration through a membrane filter having a pore diameter of 0.50 μm. The obtained block copolymer solution was spin coated onto a polyphenylene sulfide film (manufactured by Toray Industries, Inc.) serving as a base member at a spin speed of 800 rpm, and then subjected to an annealing treatment in an oven of 170° C. for 5 hours. Thus, First Master Block (M-52A) having concavities and convexities formed on a surface thereof due to micro phase separation was obtained.

Next, the coating film of the obtained Master Block (M-52A) was irradiated with ultraviolet rays in an accumulated light amount of 12 J/cm$^2$ by use of a high pressure mercury lamp, and then subjected to ultrasonic cleaning in acetic acid. Thus, First Master Block (M-53A) subjected to an etching treatment by which PMMA was selectively removed was obtained.

Subsequently, Pt was stacked in a thickness of 50 nm on the surface having concavities and convexities formed thereon of Master Block (M-53A) by Ar sputtering. Thus, Master Block (M-54A) was obtained.

Next, a silicone-based polymer [a resin composition of a mixture of 90% by mass of a silicone rubber (manufactured by Wacker Chemie AG under the product name of "Elastosil RT601") and 10% by mass of a curing agent] was applied by a dropping method onto the surface having concavities and convexities formed thereon of Master Block (M-54A) on Master Block (M-49A), then cured by being heated at 50° C. for 1 hour, and thereafter detached from Master Block (M-54A). Thus, Master Block (M-55A) was obtained.

A diffraction grating was manufactured and an organic EL element was obtained in the same manner as in Example 20, except that, the thus obtained Master Block (M-55A) was used instead of Master Block (M-42A) of Example 20. Note that a concavity and convexity analysis image was obtained by analyzing the shape of the concavities and convexities formed on the surface of the cured resin layer of the thus obtained diffraction grating by use of an atomic force microscope (as canning probe micros cope equipped with an environment control unit "Nanonavi II Station/E-sweep" manufactured by SII NanoTechnology Inc.). Note that, for this analysis, height data were measured at 65536 (256 columns× 256 rows) measuring points in a measuring region of 3 μm square on the nanometer scale. Then, the obtained concavity and convexity analysis image was subjected to a flattening process including primary inclination correction, and then to two-dimensional fast Fourier transform processing. Thus, a Fourier-transformed image was obtained. It was shown that the Fourier-transformed image showed a circular pattern substantially centered at an origin at which an absolute value of wavenumber was 0 μm$^{-1}$, and that the circular pattern was present within a region where an absolute value of wavenumber was within a range of 10 μm$^{-1}$ or less. In addition, the average value (m) of the depth distribution, the median (M) of the depth distribution, the standard deviation (σ), and the kurtosis (k) were determined on the basis of the obtained height data at the measuring points by use of the same methods as described above, respectively. Table 1 shows the results of the average value (m), the median (M), the standard deviation (σ), and the kurtosis (k).

Example 25

First, a silicone-based polymer [a resin composition of a mixture of 90% by mass of a silicone rubber (manufactured by Wacker Chemie AG under the product name of "Elastosil RT601") and 10% by mass of a curing agent] was applied by a spin coating method onto a base member (material: glass, size: 40 mm×40 mm), and cured by being heated at 100° C. for 1 hour. Thus, a silicone-based polymer film was formed. Next, surface modification was conducted by carrying out a UV-ozone treatment for 1 minute.

Next, an aluminum vapor-deposition film (thickness: 10 nm) was formed on the silicone-based polymer film by a vapor deposition method under conditions of a temperature of 100° C. and a pressure of 1×10$^{-3}$ Pa. Then, after cooling to room temperature (25° C.) over a period of 30 minutes, the pressure was returned to the atmospheric pressure (1.013×10$^5$ Pa). Consequently, concavities and convexities were formed on a surface of the aluminum vapor-deposition film formed on the silicone-based polymer film. Subsequently, a silicone-based polymer [a resin composition of a mixture of 90% by mass of a silicone rubber (manufactured by Wacker Chemie AG under the product name of "Elastosil RT601") and 10% by mass of a curing agent] was applied by a dropping method onto the aluminum vapor-deposition film, then cured by being heated at 100° C. for 1 hour, and thereafter detached from the aluminum vapor-deposition film. Thus, Master Block (M-5B) was obtained.

Subsequently, a UV curable resin (manufactured by Norland Optical Adhesive under the product name of "NOA 81") was prepared, and the UV curable resin was applied onto a glass substrate. Then, the UV curable resin was cured by irradiation with ultraviolet rays for 1 hour, with the obtained Master Block (M-5B) being pressed thereto. Thus, Master Block (M-6B) having concavities and convexities formed on a surface thereof was obtained.

Next, a silicone-based polymer [a resin composition of a mixture of 90% by mass of a silicone rubber (manufactured by Wacker Chemie AG under the product name of "Elastsil RT601") and 10% by mass of a curing agent] was applied by a dropping method onto Master Block (M-6B) having concavities and convexities formed on a surface thereof, then cured by being heated at 100° C. for 1 hour, and thereafter detached from Master Block (M-6B: UV curable resin film). Thus, Master Block (M-7B) was obtained.

Then, an aluminum vapor-deposition film (thickness: 10 nm) was formed on Master Block (M-7B) having concavities and convexities formed on a surface thereof by a vapor deposition method under conditions of a temperature of 100° C. and a pressure of $1 \times 10^{-3}$ Pa. Then, after cooling to room temperature (25° C.) over a period of 30 minutes, the pressure was returned to the atmospheric pressure ($1.013 \times 10^5$ Pa). Consequently, concavities and convexities were formed on a surface of the aluminum vapor-deposition film formed on Master Block (M-7B). Subsequently, a UV curable resin (manufactured by Norland Optical Adhesive under the product name of "NOA 81") was prepared. The curable resin was applied onto a glass substrate. Then, the curable resin was cured by irradiation with ultraviolet rays for 1 hour, with the obtained Master Block (M-7B) having the aluminum vapor-deposition film formed thereon being pressed thereto. Thus, Master Block (M-8B) having concavities and convexities formed on a surface thereof was obtained.

Subsequently, a silicone-based polymer [a resin composition of a mixture of 90% by mass of a silicone rubber (manufactured by Wacker Chemie AG under the product name of "Elastosil RT601") and 10% by mass of a curing agent] was applied onto Master Block (M-8B) by a dropping method, then cured by being heated at 100° C. for 1 hour, and thereafter detached from the UV curable resin film. Thus, Master Block (M-9B) was obtained. Moreover, an aluminum vapor-deposition film (thickness: 10 nm) was formed on Master Block (M-9B) having concavities and convexities formed on a surface thereof by a vapor deposition method under conditions of a temperature of 100° C. and a pressure of $1 \times 10^{-3}$ Pa. Then, after cooling to room temperature (25° C.) over a period of 30 minutes, the pressure was returned to the atmospheric pressure ($1.013 \times 10^5$ Pa). Consequently, concavities and convexities were formed on a surface of the aluminum vapor-deposition film formed on Master Block (M-9B).

Next, a UV curable resin (manufactured by Norland Optical Adhesive under the product name of "NOA 81") was prepared. The curable resin was applied onto a glass substrate. Then, the curable resin was cured by irradiation with ultraviolet rays for 1 hour, with the obtained Master Block (M-9B) having the aluminum vapor-deposition film formed thereon being pressed thereto. Thus, Master Block (M-10B) having concavities and convexities formed on a surface thereof was obtained.

Subsequently, a silicone-based polymer [a resin composition of a mixture of 90% by mass of a silicone rubber (manufactured by Wacker Chemie AG under the product name of "Elastosil RT601") and 10% by mass of a curing agent] was applied by a dropping method onto Master Block (M-10B) having concavities and convexities formed on a surface thereof, then cured by being heated at 50° C. for 1 hours, and thereafter detached from the UV curable resin film. Thus, Master Block (M-11B) was obtained.

Subsequently, an acrylic-based UV curable resin was applied onto a PET substrate (manufactured by Toyobo Co., Ltd., COSMOSHINE A-4100). Then, the curable resin was cured by irradiation with ultraviolet rays at 600 mJ/cm$^2$, with the obtained Master Block (M-11B) being pressed thereto.

Thus, Master Block (M-12B) having concavities and convexities formed on a surface thereof was obtained. Subsequently, electro conductivity was provided by forming a nickel thin film on the surface having concavities and convexities formed thereon of Master Block (M-12B) by a sputtering method. Then, Master Block (M-12B) was subjected to nickel electro-forming by immersing the Master Block (M-12B) in a nickel sulfamate solution, and then causing a current to flow therethrough, thereby converting Master Block (M-12B) into a metal master block. Thus, Master Block (M-13B) was obtained.

Next, a fluorine-based UV curable resin was applied onto a PET substrate (manufactured by Toyobo Co., Ltd., COSMOSHINE A-4100). Then, the curable resin was cured by irradiation with ultraviolet rays at 600 mJ/cm$^2$, with Master Block (M-13B) converted into a metal master block being pressed thereto. Thus, Master Block (M-14B) having concavities and convexities formed on a surface thereof was obtained.

Subsequently, a silicone-based polymer [a resin composition of a mixture of 90% by mass of a silicone rubber (manufactured by Wacker Chemie AG under the product name of "Elastosil RT601") and 10% by mass of a curing agent] was applied by a dropping method onto the surface having concavities and convexities formed thereon of Master Block (M-14B), then cured by being heated at 50° C. for 1 hour, and thereafter detached from Master Block (M-14B: the UV curable resin film). Thus, Master Block (M-15B) was obtained.

Next, a UV curable resin (manufactured by Norland Optical Adhesive under the product name of "NOA 81") was prepared, and the UV curable resin was applied onto a glass substrate. Then, the curable resin was cured by irradiation with ultraviolet rays for 1 hour, with the obtained Master Block (M-15B) being pressed thereto. Thus, a diffraction grating having concavities and convexities formed on a surface thereof was obtained (note that the thus obtained diffraction grating can also be used as a master block).

Then, an organic EL element was obtained in the same manner as in Example 20, except that the thus obtained diffraction grating was used instead of the diffraction grating of Example 20. Note that a concavity and convexity analysis image was obtained by analyzing the shape of the concavities and convexities formed on the surface of the cured resin layer of the thus obtained diffraction grating by use of an atomic force microscope (a scanning probe microscope equipped with an environment control unit "Nanonavi II Station/E-sweep" manufactured by SII NanoTechnology Inc.). Note that, for this analysis, height data were measured at 65536 (256 columns×256 rows) measuring points in a measuring region of 3 μm square on the nanometer scale. Then, the obtained concavity and convexity analysis image was subjected to a flattening process including primary inclination correction, and then to two-dimensional fast Fourier transform processing. Thus, a Fourier-transformed image was obtained. It was shown that the Fourier-transformed image showed an annular pattern substantially centered at an origin at which an absolute value of wavenumber was 0 μm$^{-1}$, and the annular pattern was present within a region where an absolute value of wavenumber was within a range from 1.25 to 5 μm$^{-1}$. In addition, the average value (m) of the depth distribution, the median (M) of the depth distribution, the standard deviation (σ), and the kurtosis (k) were determined on the basis of the obtained height data at the measuring points by use of the same methods as described above, respectively. Table 1 shows the results of the average value (m), the median (M), the standard deviation (σ), and the kurtosis (k).

Example 26

A block copolymer solution was obtained by dissolving 50 mg of Block Copolymer (P-2) and 13 g of polyethylene oxide in 5 g of toluene, followed by filtration through a membrane filter having a pore diameter of 0.50 μm. The obtained block copolymer solution was spin coated onto a polyphenylene sulfide film (manufactured by Toray Industries, Inc.) serving as abase member at a spin speed of 800 rpm, and then subjected to an annealing treatment in an oven of 170° C. for 5 hours. Thus, First Master Block (M-56A) having concavities and convexities formed on a surface thereof due to micro phase separation was obtained.

Next, the coating film of the obtained Master Block (M-56A) was irradiated with ultraviolet rays in an accumulated light amount of 12 J/cm$^2$ by use of a high pressure mercury lamp, and then subjected to ultrasonic cleaning in acetic acid. Thus, First Master Block (M-57A) subjected to an etching treatment by which PMMA was selectively removed was obtained. Subsequently, Pt was stacked in a thickness of 50 nm on the concave and convex surface of Master Block (M-57A) by an Ar sputtering method. Thus, Master Block (M-58A) was obtained.

Subsequently, a silicone-based polymer [a resin composition of a mixture of 90% by mass of a silicone rubber (manufactured by Wacker Chemie AG under the product name of "Elastosil RT601") and 10% by mass of a curing agent] was applied onto Master Block (M-58A) by a dropping method, then cured by being heated at 50° C. for 1 hour, and thereafter detached from Master Block (M-58A). Thus, Master Block (M-59A) was obtained.

A diffraction grating was manufactured and an organic EL element was obtained in the same manner as in Example 20, except that the thus obtained Master Block (M-59A) was used instead of Master Block (M-42A) of Example 20. Note that a concavity and convexity analysis image was obtained by analyzing the shape of the concavities and convexities formed on the surface of the cured resin layer of the thus obtained diffraction grating by use of an atomic force microscope (a scanning probe microscope equipped with an environment control unit "Nanonavi II Station/E-sweep" manufactured by SII NanoTechnology Inc.). Note that, for this analysis, height data were measured at 65536 (256 columns×256 rows) measuring points in a measuring region of 3 μm square on the nanometer scale. Then, the obtained concavity and convexity analysis image was subjected to a flattening process including primary inclination correction, and then to two-dimensional fast Fourier transform processing. Thus, a Fourier-transformed image was obtained. It was shown that the Fourier-transformed image showed a circular pattern substantially centered at an origin at which an absolute value of wavenumber was 0 μm$^{-1}$, and that the circular pattern was present within a region where an absolute value of wavenumber was within a range of 10 μm$^{-1}$ or less. In addition, the average value (m) of the depth distribution, the median (M) of the depth distribution, the standard deviation (σ), and the kurtosis (k) were determined on the basis of the obtained height data at the measuring points by use of the same methods as described above, respectively. Table 1 shows the results of the average value (m), the median (M), the standard deviation (σ), and the kurtosis (k).

Example 27

First, a silicone-based polymer [a resin composition of a mixture of 90% by mass of a silicone rubber (manufactured by Wacker Chemie AG under the product name of "Elastosil RT601") and 10% by mass of a curing agent] was applied onto a base member (material: glass, size: 40 mm×40 mm) by a spin coating method, and cured by being heated at 100° C. for 1 hour. Thus, a silicone-based polymer film was formed. Next, surface modification was conducted by carrying out a UV-ozone treatment for 1 minute.

Next, an aluminum vapor-deposition film (thickness: 10 nm) was formed on the silicone-based polymer film by a vapor deposition method under conditions of room temperature and a pressure of 1×10$^{-3}$ Pa. Then, after cooling to room temperature (25° C.) over a period of 30 minutes, the pressure was returned to the atmospheric pressure (1.013×10$^5$ Pa). Consequently, concavities and convexities were formed on a surface of the aluminum vapor-deposition film formed on the silicone-based polymer film. Subsequently, a silicone-based polymer [a resin composition of a mixture of 90% by mass of a silicone rubber (manufactured by Wacker Chemie AG under the product name of "Elastosil RT601") and 10% by mass of a curing agent] was applied onto the aluminum vapor-deposition film by a dropping method, then cured by being heated at 60° C. for hours, and thereafter detached from the aluminum vapor-deposition film. Thus, Master Block (M-16B) was obtained.

Next, a UV curable resin (manufactured by Norland Optical Adhesive under the product name of "NOA 81") was prepared, and the UV curable resin was applied onto a glass substrate. Then, the curable resin was cured by irradiation with ultraviolet rays for 1 hour, with the obtained Master Block (M-16B) being pressed thereto. Thus, Master Block (M-17B) having concavities and convexities formed on a surface thereof was obtained.

Subsequently, a silicone-based polymer [a resin composition of a mixture of 90% by mass of a silicone rubber (manufactured by Wacker Chemie AG under the product name of "Elastsil RT601") and 10% by mass of a curing agent] was applied by a dropping method onto Master Block (M-17B) having concavities and convexities formed on a surface thereof, then cured by being heated at 60° C. for 2 hours, and thereafter detached from Master Block (M-17B: UV curable resin film). Thus, Master Block (M-18B) was obtained.

Then, an aluminum vapor-deposition film (thickness: 10 nm) was formed on Master Block (M-18B) having concavities and convexities formed on a surface thereof by a vapor deposition method under conditions of a temperature of 100° C. and a pressure of 1×10$^{-3}$ Pa. Then, after cooling to room temperature (25° C.) over a period of 30 minutes, the pressure was returned to the atmospheric pressure (1.013×10$^5$ Pa). Consequently, concavities and convexities were formed on a surface of the aluminum vapor-deposition film formed on Master Block (M-18B). Subsequently, a UV curable resin (manufactured by Norland Optical Adhesive under the product name of "NOA 81") was prepared. The UV curable resin was applied onto a glass substrate. Then, the curable resin was cured by irradiation with ultraviolet rays for 1 hour, with the obtained Master Block (M-18B) having the aluminum vapor-deposition film formed thereon being pressed thereto. Thus, Master Block (M-19B) having concavities and convexities formed on a surface thereof was obtained.

Subsequently, a silicone-based polymer [a resin composition of a mixture of 90% by mass of a silicone rubber (manufactured by Wacker Chemie AG under the product name of "Elastosil RT601") and 10% by mass of a curing agent] was applied onto Master Block (M-19B) by a dropping method, then cured by being heated at 60° C. for 2 hours, and thereafter detached from Master Block (M-19B: UV curable resin film). Thus, Master Block (M-20B) was obtained. Moreover, an aluminum vapor-deposition film (thickness: 10 nm) was formed on Master Block (M-20B) having concavities and convexities formed on a surface thereof by a vapor deposition method under conditions of a temperature of 100° C. and a pressure of 1×10$^{-3}$ Pa. Then, after cooling to room temperature (25° C.) over a period of 30 minutes, the pressure was returned to the atmospheric pressure (1.013×10$^5$ Pa). Consequently, concavities and convexities were formed on a surface of the aluminum vapor-deposition film formed on Master Block (M-20B).

Subsequently, a UV curable resin (manufactured by Norland Optical Adhesive under the product name of "NOA 81") was prepared. The curable resin was applied onto the glass substrate. Then, the curable resin was cured by irradiation with ultraviolet rays for 1 hour, with the obtained Master Block (M-20B) having the aluminum vapor-deposition film formed thereon being pressed thereto. Thus, Master Block (M-21B) having concavities and convexities formed on a surface thereof was obtained.

Subsequently, a silicone-based polymer [a resin composition of a mixture of 90% by mass of a silicone rubber (manufactured by Wacker Chemie AG under the product name of "Elastosil RT601") and 10% by mass of a curing agent] was applied onto Master Block (M-21B) by a dropping method, then cured by being heated at 50° C. for 1 hour, and thereafter detached from Master Block (M-21B: UV curable resin film). Thus, Master Block (M-22B) was obtained. Moreover, a UV curable resin (manufactured by Norland Optical Adhesive under the product name of "NOA 81") was prepared. The curable resin was applied onto the glass substrate. Then, the curable resin was cured by irradiation with ultraviolet rays at 600 mJ/cm$^2$, with Master Block (M-22B) being pressed thereto. Thus, a diffraction grating having concavities and convexities formed on a surface thereof was obtained (the thus obtained diffraction grating can also be used as a master block).

An organic EL element was obtained in the same manner as in Example 20, except that the thus obtained diffraction grating was used instead of the diffraction grating of Example 20. Note that a concavity and convexity analysis image was obtained by analyzing the shape of the concavities and convexities formed on the surface of the cured resin layer of the thus obtained diffraction grating by use of an atomic force microscope (a scanning probe microscope equipped with an environment control unit "Nanonavi II Station/E-sweep" manufactured by SII NanoTechnology Inc.). Note that, for this analysis, height data were measured at 65536 (256 columns×256 rows) measuring points in a measuring region of 3 μm square on the nanometer scale. Then, the obtained concavity and convexity analysis image was subjected to a flattening process including primary inclination correction, and then to two-dimensional fast Fourier transform processing. Thus, a Fourier-transformed image was obtained. It was shown that the Fourier-transformed image showed an annular pattern substantially centered at an origin at which an absolute value of wavenumber was 0 μm$^{-1}$, and that the annular pattern was present within a region where an absolute value of wavenumber was within a range from 1.25 to 5 μm$^{-1}$. In addition, the average value (m) of the depth distribution, the median (M) of the depth distribution, the standard deviation (σ), and the kurtosis (k) were determined on the basis of the obtained height data at the measuring points by use of the same methods as described above, respectively. Table 1 shows the results of the average value (m), the median (M), the standard deviation (σ), and the kurtosis (k).

Example 28

Master Block (M-23B) was obtained by employing the same method as the method for manufacturing Master Block (M-21B) in Example 27, except that the treatment time of the UV-ozone treatment was changed from 1 minute to 2 minutes.

Figure 83:
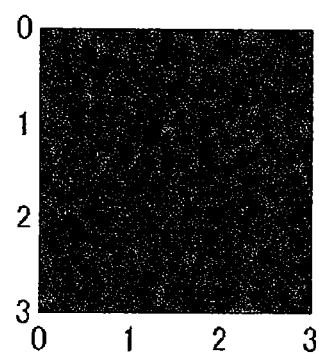
FIG. 83 is a photograph showing a concavity and convexity analysis image, in which a result of analysis conducted on a surface of a diffraction grating obtained in Example 28 by use of an atomic force microscope is displayed on a display.
Figure 84:
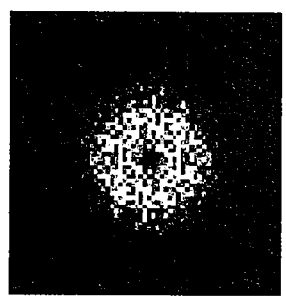
FIG. 84 is a photograph showing a Fourier-transformed image, in which a result of two-dimensional fast Fourier transform processing conducted on the concavity and convexity analysis image, which was obtained by use of the atomic force microscope, of the surface of the diffraction grating obtained in Example 28 is displayed on a display.
Figure 85:
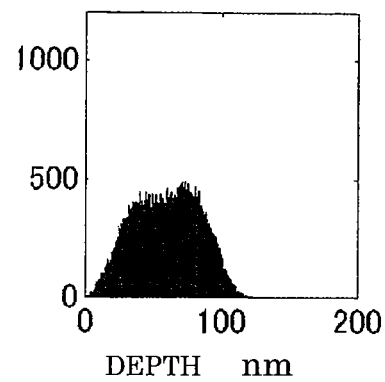
FIG. 85 is a photograph showing a graph of the depth distribution of the concavities and convexities on the surface of the diffraction grating obtained in Example 28.

A diffraction grating was manufactured and an organic EL element was obtained in the same manner as in Example 27, except that the thus obtained Master Block (M-23B) was used instead of the Master Block (M-21B) of Example 27. Note that a concavity and convexity analysis image was obtained by analyzing the shape of the concavities and convexities formed on the surface of the cured resin layer of the thus obtained diffraction grating by use of an atomic force microscope (a scanning probe microscope equipped with an environment control unit "Nanonavi II Station/E-sweep" manufactured by SII NanoTechnology Inc.). FIG. 83 shows the obtained concavity and convexity analysis image. Note that, for this analysis, height data were measured at 65536 (256 columns×256 rows) measuring points in a measuring region of 3 μm square on the nanometer scale. Then, the obtained concavity and convexity analysis image was subjected to a flattening process including primary inclination correction, and then to two-dimensional fast Fourier transform processing. Thus, a Fourier-transformed image was obtained. FIG. 84 shows the obtained Fourier-transformed image. It was shown that the Fourier-transformed image showed an annular pattern substantially centered at an origin at which an absolute value of wavenumber was 0 μm$^{-1}$, and that the annular pattern was present within a region where an absolute value of wavenumber was within a range from 1.25 to 5 μm$^{-1}$. In addition, the average value (m) of the depth distribution, the median (M) of the depth distribution, the standard deviation (σ), and the kurtosis (k) were determined on the basis of the obtained height data at the measuring points by use of the same methods as described above, respectively. Table 1 shows the results of the average value (m), the median (M), the standard deviation (σ), and the kurtosis (k). Note that FIG. 85 shows a graph of the depth distribution.

Figure 86:
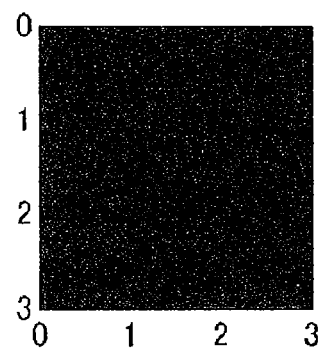
FIG. 86 is a photograph showing an image which shows the relationship of the distance between a transparent electrode and a metal electrode determined from the result of analysis conducted on the surface of the diffraction grating obtained in Example 28 by use of the atomic force microscope.
Figure 87:
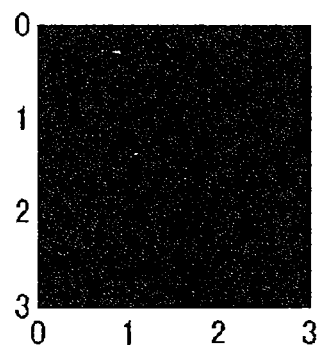
FIG. 87 is a photograph showing an image of leakage-current prone regions determined from the result of analysis conducted on the surface of the diffraction grating obtained in Example 28 by use of the atomic force microscope.
Figure 88:
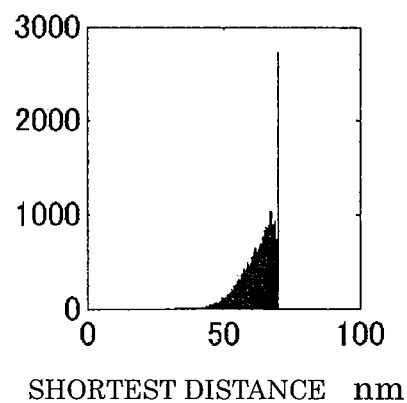
FIG. 88 is a graph showing the distribution of shortest distance determined from the result of analysis conducted on the surface of the diffraction grating obtained in Example 28 by use of the atomic force microscope.

In addition, the ratio of the presence of leakage-current prone regions was determined on the basis of the concavity and convexity analysis image (SPM image) by the same method as that employed in Example 23. FIG. 86 shows an image expressing the distance between the transparent electrode and the metal electrode on a gray scale (in FIG. 86, sites with long distances are expressed in bright colors (while), and sites with short distances are expressed in dark colors (black)). FIG. 87 shows an image concerning the leakage-current prone regions (white regions indicating the leakage-current prone regions did not exist in this Example). FIG. 88 shows a graph of the distribution of the shortest distances. As a result of the measurement, the ratio of the presence of leakage-current prone regions was 0.0%.

Example 29

First, Master Block (M-24B) was formed by employing the same method as the method for manufacturing Master Block (M-21B) described in Example 27.

Next, a silicone-based polymer [a resin composition of a mixture of 90% by mass of a silicone rubber (manufactured by Wacker Chemie AG under the product name of "Elastosil RT601") and 10% by mass of a curing agent] was applied by a dropping method onto the surface having concavities and convexities formed thereon of Master Block (M-24B), then cured by being heated at 50° C. for 1 hour, and thereafter detached from Master Block (M-24B). Thus, Master Block (M-25B) was obtained (master block formation step (I)).

Next, a fluorine-containing acrylic-based UV curable resin was applied dropwise onto a glass substrate, cured by UV irradiation at 600 mJ/cm$^2$, with Master Block (M-25B) being pressed thereto, and then detached from Master Block (M-25B). Thus, Master Block (M-26B) was obtained (master block formation step (II)).

Subsequently, Master Block (M-27B) was obtained by employing the same step as the master block formation step (II), except that Master Block (M-26B) was used instead of Master Block (M-25B). Moreover, Master Block (M-28B) was obtained by employing the same step as the master block formation step (I), except that Master Block (M-27B) was used instead of Master Block (M-24B). Subsequently, Master Block (M-29B) was obtained by employing the same step as the master block formation step (II), except that Master Block (M-28B) was used instead of Master Block (M-25B).

A diffraction grating was manufactured and an organic EL element was obtained in the same manner as in Example 20, except that the thus obtained Master Block (M-29B) was used, and that an acrylic-based UV curable resin was used as the UV curable resin. Note that a concavity and convexity analysis image was obtained by analyzing the shape of the concavities and convexities formed on the surface of the cured resin layer of the thus obtained diffraction grating by use of an atomic force microscope (a scanning probe microscope equipped with an environment control unit "Nanonavi II Station/E-sweep" manufactured by SII NanoTechnology Inc.). Note that, for this analysis, height data were measured at 65536 (256 columns×256 rows) measuring points in a measuring region of 3 μm square. Then, the obtained concavity and convexity analysis image was subjected to a flattening process including primary inclination correction, and then to two-dimensional fast Fourier transform processing. Thus, a Fourier-transformed image was obtained. It was shown that the Fourier-transformed image showed an annular pattern substantially centered at an origin at which an absolute value of wavenumber was 0 μm$^{-1}$, and that the annular pattern was present within a region where an absolute value of wavenumber was within a range from 1.25 to 5 μm$^{-1}$. In addition, the average value (m) of the depth distribution, the median (M) of the depth distribution, the standard deviation (σ), and the kurtosis (k) were determined on the basis of the obtained height data at the measuring points by use of the same methods as described above, respectively. Table 1 shows the results of the average value (m), the median (M), the standard deviation (σ), and the kurtosis (k).

Example 30

First, Master Block (M-30B) was manufactured by employing the same method as the method for manufacturing Master Block (M-23B) described in Example 28.

Next, Master Block (M-31B) was obtained by employing the same method as that described in Example 29, except that Master Block (M-30B) was used instead of Master Block (M-24B).

A diffraction grating was manufactured and an organic EL element was obtained in the same manner as in Example 20, except that the thus obtained Master Block (M-31B) was used, and that an acrylic-based UV curable resin was used as the UV curable resin. Note that a concavity and convexity analysis image was obtained by analyzing the shape of the concavities and convexities formed on the surface of the cured resin layer of the thus obtained diffraction grating by use of an atomic force microscope (a scanning probe microscope equipped with an environment control unit "Nanonavi II Station/E-sweep" manufactured by SII NanoTechnology Inc.). Note that, for this analysis, height data were measured at 65536 (256 columns×256 rows) measuring points in a measuring region of 3 μm square on the nanometer scale.

Then, the obtained concavity and convexity analysis image was subjected to a flattening process including primary inclination correction, and then to two-dimensional fast Fourier transform processing. Thus, a Fourier-transformed image was obtained. It was shown that the Fourier-transformed image showed an annular pattern substantially centered at an origin at which an absolute value of wavenumber was 0 μm$^{-1}$, and that the annular pattern was present within a region where an absolute value of wavenumber was within a range from 1.25 to 5 μm$^{-1}$. In addition, the average value (m) of the depth distribution, the median (M) of the depth distribution, the standard deviation (σ), and the kurtosis (k) were determined on the basis of the obtained height data at the measuring points by use of the same methods as described above, respectively. Table 1 shows the results of the average value (m), the median (M), the standard deviation (σ), and the kurtosis (k).

Example 31

First, Master Block (M-32B) was manufactured by employing the same method as the method for manufacturing Master Block (M-23B) described in Example 28.

Next, a silicone-based polymer [a resin composition of a mixture of 90% by mass of a silicone rubber (manufactured by Wacker Chemie AG under the product name of "Elastosil RT601") and 10% by mass of a curing agent] was applied onto Master Block (M-32B) by a dropping method, then cured by being heated at 50° C. for 1 hour, and thereafter detached from the UV curable resin film. Thus, Master Block (M-33B) was obtained. Moreover, a fluorine-based UV curable resin was prepared, and the fluorine-based UV curable resin was applied onto a glass substrate subjected to a silane coupling treatment. Then, the curable resin was cured by irradiation with ultraviolet rays at 600 mJ/cm$^2$, with Master Block (M-33B) being pressed thereto. Thus, Master Block (M-34B) having concavities and convexities formed on a surface thereof was obtained. Postcure was conducted by irradiating the thus obtained Master Block (M-34B) again with ultraviolet rays at an intensity of 100 mW.

Moreover, a fluorine-based UV curable resin was prepared, and the fluorine-based UV curable resin was applied again onto a glass substrate subjected to a silane coupling treatment. Then, the curable resin was cured by irradiation with ultraviolet rays at 600 mJ/cm$^2$, with Master Block (M-34B) on which the postcure was conducted as described above being pressed thereto. Thus, Master Block (M-35B) having concavities and convexities formed on a surface thereof was obtained.

Subsequently, a silicone-based polymer [a resin composition of a mixture of 90% by mass of a silicone rubber (manufactured by Wacker Chemie AG under the product name of "Elastosil RT601") and 10% by mass of a curing agent] was applied onto Master Block (M-35B) by a dropping method, then cured by being heated at 50° C. for 1 hour, and thereafter detached from the UV curable resin film. Thus, Master Block (M-36B) was obtained.

Subsequently, a fluorine-based UV curable resin was prepared, and the fluorine-based UV curable resin was again applied onto a PET substrate (manufactured by Toyobo Co., Ltd., COSMOSHINE A4100). Then, the curable resin was cured by irradiation with ultraviolet rays at 600 mJ/cm$^2$, with Master Block (M-36B) being pressed thereto. Thus, Master Block (M-37B) having concavities and convexities formed on a surface thereof was obtained.

Subsequently, an acrylic-based UV curable resin was prepared, and the acrylic-based UV curable resin was applied onto a glass substrate subjected to a silane coupling treatment.

Then, the curable resin was cured by irradiation with ultraviolet rays at 600 mJ/cm$^2$, with Master Block (M-37B) being pressed thereto. Thus, a diffraction grating having concavities and convexities formed on a surface thereof was obtained (the thus obtained diffraction grating can also be used as a master block).

An organic EL element was obtained in the same manner as in Example 20, except that the thus obtained diffraction grating was used instead of the diffraction grating of Example 20. Note that a concavity and convexity analysis image was obtained by analyzing the shape of the concavities and convexities formed on the surface of the cured resin layer of the thus obtained diffraction grating by use of an atomic force microscope (a scanning probe microscope equipped with an environment control unit "Nanonavi II Station/E-sweep" manufactured by SII NanoTechnology Inc.). Note that, for this analysis, height data were measured at 65536 (256 columns×256 rows) measuring points in a measuring region of 3 μm square on the nanometer scale. Then, the obtained concavity and convexity analysis image was subjected to a flattening process including primary inclination correction, and then to two-dimensional fast Fourier transform processing. Thus, a Fourier-transformed image was obtained. It was shown that the Fourier-transformed image showed an annular pattern substantially centered at an origin at which an absolute value of wavenumber was 0 μm$^{-1}$, and that the annular pattern was present within a region where an absolute value of wavenumber was within a range from 1.25 to 5 μm$^{-1}$. In addition, the average value (m) of the depth distribution and the median (M) of the depth distribution were determined on the basis of the obtained height data at the measuring points by use of the same methods as described above, respectively. Table 1 shows the results of the average value (m) and the median (M).

Example 32

A block copolymer solution was obtained by dissolving 31 mg of Block Copolymer (P-2) and 8 mg of polyethylene oxide in 6 g of toluene, followed by filtration through a membrane filter having a pore diameter of 0.50 μm. The obtained block copolymer solution was spin coated onto a polyphenylene sulfide film (manufactured by Toray Industries, Inc.) serving as abase member at a spin speed of 800 rpm, and then the coating film was subjected to an annealing treatment in an oven of 170° C. for 5 hours. Thus, First Master Block (M-60A) having concavities and convexities formed on a surface thereof due to micro phase separation was obtained.

Next, the coating film of the obtained Master Block (M-60A) was irradiated with ultraviolet rays in an accumulated light amount of 12 J/cm$^2$ by use of a high pressure mercury lamp, immersed in acetone, and then rinsed with ion-exchanged water. Thus, First Master Block (M-61A) subjected to an etching treatment by which PMMA was selectively removed was obtained.

Then, a silicone-based polymer [a resin composition of a mixture of 90% by mass of a silicone rubber (manufactured by Wacker Chemie AG under the product name of "Elastosil RT601") and 10% by mass of a curing agent] was applied onto Master Block (M-61A) by a dropping method, then cured by being heated at 50° C. for 1 hour, and thereafter detached from Master Block (M-61A). Thus, Master Block (M-62A) was obtained.

A diffraction grating was manufactured and an organic EL element was obtained in the same manner as in Example 20, except that the thus obtained Master Block (M-62A) was used instead of Master Block (M-42A) of Example 20. Note that a concavity and convexity analysis image was obtained by analyzing the shape of the concavities and convexities formed on the surface of the cured resin layer of the thus obtained diffraction grating by use of an atomic force microscope (a scanning probe microscope equipped with an environment control unit "Nanonavi II Station/E-sweep" manufactured by SII NanoTechnology Inc.). Note that, for this analysis, height data were measured at 65536 (256 columns×256 rows) measuring points in a measuring region of 3 μm square on the nanometer scale. Then, the obtained concavity and convexity analysis image was subjected to a flattening process including primary inclination correction, and then to two-dimensional fast Fourier transform processing. Thus, a Fourier-transformed image was obtained. It was shown that the Fourier-transformed image showed a circular pattern substantially centered at an origin at which an absolute value of wavenumber was 0 μm$^{-1}$, and that the circular pattern was present within a region where an absolute value of wavenumber was within a range of 10 μm$^{-1}$ or less. In addition, the average value (m) of the depth distribution, the median (M) of the depth distribution, and the standard deviation (σ) were determined on the basis of the obtained height data at the measuring points by use of the same methods as described above, respectively. Table 1 shows the results of the average value (m) and the median (M).

Example 33

A block copolymer solution was obtained by dissolving 100 mg of Block Copolymer (P-2) and 50 mg of polyethylene oxide in 10 g of toluene, followed by filtration through a membrane filter having a pore diameter of 0.50 μm. The obtained block copolymer solution was spin coated onto a polyphenylene sulfide film (manufactured by Toray Industries, Inc.) serving as a base member at a spin speed of 800 rpm, and then the coating film was subjected to an annealing treatment in an oven of 170° C. for 8 hours. Thus, First Master Block (M-63A) having concavities and convexities formed on a surface thereof due to micro phase separation was obtained. The thickness of the coating film made of Block Copolymer (P-2) in the thus obtained Master Block (M-63A) was measured by use of a step measuring instrument (manufactured by Kosaka Seisakusho under the product name of "SURF-COATER ET-4000A"). As a result, the thickness of the coating film was 104 nm.

Next, the coating film of the obtained Master Block (M-63A) was irradiated with ultraviolet rays in an accumulated light amount of 12 J/cm$^2$ by use of a high pressure mercury lamp, and then immersed in acetone, and rinsed with ion-exchanged water. Thus, First Master Block (M-64A) subjected to an etching treatment by which PMMA was selectively removed was obtained.

Then, a silicone-based polymer [a resin composition of a mixture of 90% by mass of a silicone rubber (manufactured by Wacker Chemie AG under the product name of "Elastosil RT601") and 10% by mass of a curing agent] was applied onto Master Block (M-64A) by a dropping method, then cured by being heated at 50° C. for 1 hour, and thereafter detached from Master Block (M-64A). Thus, Master Block (M-65A) was obtained.

Figure 89:
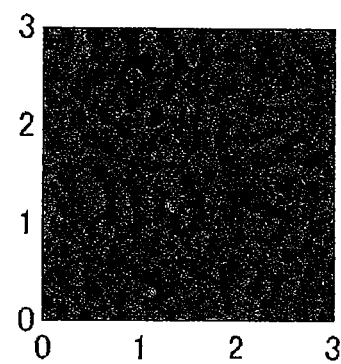
FIG. 89 is a photograph showing a concavity and convexity analysis image, in which a result of analysis conducted on a surface of a diffraction grating obtained in Example 33 by use of an atomic force microscope is displayed on a display.
Figure 90:
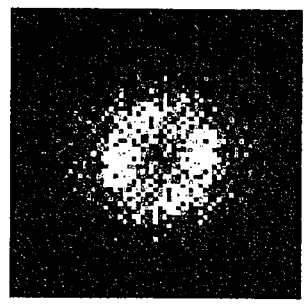
FIG. 90 is a photograph showing a Fourier-transformed image, in which a result of two-dimensional fast Fourier transform processing conducted on the concavity and convexity analysis image, which was obtained by use of the atomic force microscope, of the surface of the diffraction grating obtained in Example 33 is displayed on a display.
Figure 91:
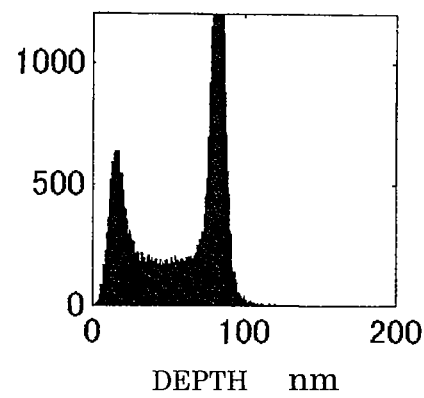
FIG. 91 is a photograph showing a graph of the depth distribution of the concavities and convexities on the surface of the diffraction grating obtained in Example 33.

A diffraction grating was manufactured and an organic EL element was obtained in the same manner as in Example 20, except that the thus obtained Master Block (M-65A) was used instead of Master Block (M-42A) of Example 20. Note that a concavity and convexity analysis image was obtained by analyzing the shape of the concavities and convexities formed on the surface of the cured resin layer of the thus obtained diffraction grating by use of an atomic force microscope (a scanning probe microscope equipped with an environment control unit "Nanonavi II Station/E-sweep" manufactured by SII NanoTechnology Inc.). FIG. 89 shows the obtained concavity and convexity analysis image. Note that, for this analysis, height data were measured at 65536 (256 columns×256 rows) measuring points in a measuring region of 3 μm square on the nanometer scale. Then, the obtained concavity and convexity analysis image was subjected to a flattening process including primary inclination correction, and then to two-dimensional fast Fourier transform processing. Thus, a Fourier-transformed image was obtained. FIG. 90 shows the obtained Fourier-transformed image. It was shown that the Fourier-transformed image showed a circular pattern substantially centered at an origin at which an absolute value of wavenumber was 0 μm$^{-1}$, and that the circular pattern was present within a region where an absolute value of wavenumber was within a range of 10 μm$^{-1}$ or less. In addition, the average value (m) of the depth distribution, the median (M) of the depth distribution, the standard deviation (σ), and the kurtosis (k) were determined on the basis of the obtained height data at the measuring points by use of the same methods as described above, respectively. Table 1 shows the results of the average value (m), the median (M), the standard deviation (σ), and the kurtosis (k). Note that FIG. 91 shows a graph of the depth distribution.

Figure 92:
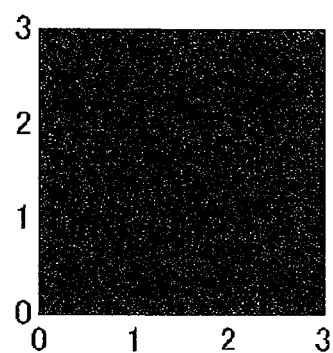
FIG. 92 is a photograph showing an image which shows the relationship of the distance between a transparent electrode and a metal electrode determined from the result of analysis conducted on the surface of the diffraction grating obtained in Example 33 by use of the atomic force microscope.
Figure 93:
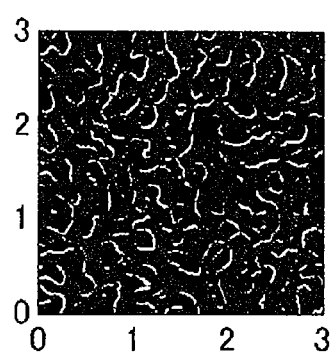
FIG. 93 is a photograph showing an image of leakage-current prone regions determined from the result of analysis conducted on the surface of the diffraction grating obtained in Example 33 by use of the atomic force microscope.
Figure 94:
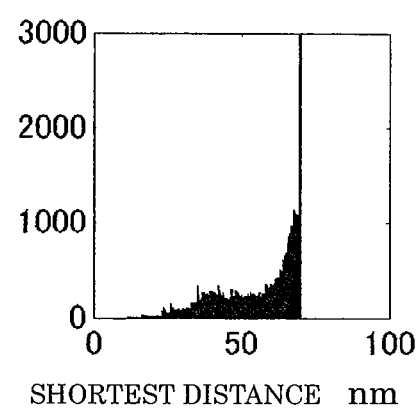
FIG. 94 is a graph showing the distribution of shortest distance determined from the result of analysis conducted on the surface of the diffraction grating obtained in Example 33 by use of the atomic force microscope.

In addition, the ratio of the presence of leakage-current prone regions was determined on the basis of the concavity and convexity analysis image (SPM image) by the same method as that employed in Example 23. FIG. 92 shows an image expressing the distance between the transparent electrode and the metal electrode on a gray scale (in FIG. 92, sites with long distances are expressed in bright colors (while), and sites with short distances are expressed in dark colors (black)). FIG. 93 shows an image concerning the leakage-current prone regions (in FIG. 93, white regions are leakage-current prone regions). FIG. 94 shows a graph of the distribution of the shortest distances. As a result of the measurement, the ratio of the presence of leakage-current prone regions was 7.9%.

Example 34

A block copolymer solution was obtained by dissolving 76 mg of Block Copolymer (P-5) and 11 mg of polyethylene oxide in 5.6 g of toluene, followed by filtration through a membrane filter having a pore diameter of 0.50 μm. The obtained block copolymer solution was spin coated onto a polyphenylene sulfide (manufactured by Toray Industries, Inc.) serving as a base member at a spin speed of 800 rpm, and then subjected to an annealing treatment in an oven of 190° C. for 8 hours. Thus, First Master Block (M-66A) having concavities and convexities formed on a surface thereof due to micro phase separation was obtained.

Next, the coating film of the obtained Master Block (M-66A) was irradiated with ultraviolet rays in an accumulated light amount of 12 J/cm$^2$ by use of a high pressure mercury lamp, then immersed in acetone, and rinsed with ion-exchanged water. Thus, First Master Block (M-67A) subjected to an etching treatment by which PMMA was selectively removed was obtained.

Then, a silicone-based polymer [a resin composition of a mixture of 90% by mass of a silicone rubber (manufactured by Wacker Chemie AG under the product name of "Elastosil RT601") and 10% by mass of a curing agent] was applied onto Master Block (M-67A) by a dropping method, then cured by being heated at 50° C. for 1 hour, and thereafter detached from Master Block (M-67A). Thus, Master Block (M-68A) was obtained.

Figure 95:
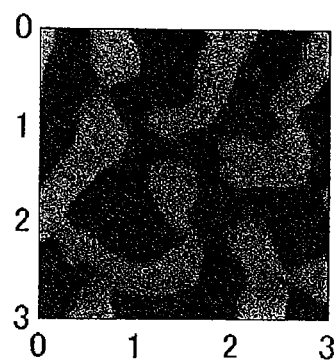
FIG. 95 is a photograph showing a concavity and convexity analysis image, in which a result of analysis conducted on a surface of a diffraction grating obtained in Example 34 by use of an atomic force microscope is displayed on a display.
Figure 96:
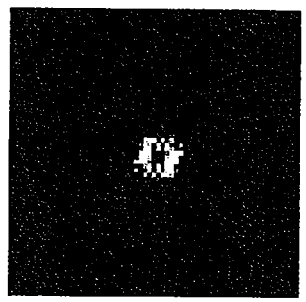
FIG. 96 is a photograph showing a Fourier-transformed image, in which a result of two-dimensional fast Fourier transform processing conducted on the concavity and convexity analysis image, which was obtained by use of the atomic force microscope, of the surfaces of the diffraction grating obtained in Example 34 is displayed on a display.
Figure 97:
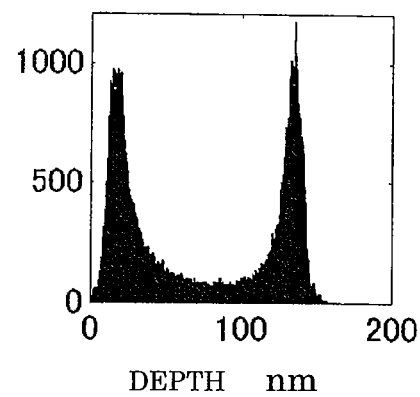
FIG. 97 is a photograph showing a graph of the depth distribution of the concavities and convexities on the surface of the diffraction grating obtained in Example 34.

A diffraction grating was manufactured and an organic EL element was obtained in the same manner as in Example 20, except that the thus obtained Master Block (M-68A) was used instead of Master Block (M-42A) of Example 20. Note that a concavity and convexity analysis image was obtained by analyzing the shape of the concavities and convexities formed on the surface of the cured resin layer of the thus obtained diffraction grating by use of an atomic force microscope (a scanning probe microscope equipped with an environment control unit "Nanonavi II Station/E-sweep" manufactured by SII NanoTechnology Inc.). FIG. 95 shows the obtained concavity and convexity analysis image. Note that, for this analysis, height data were measured at 65536(256 columns×256 rows) measuring points in a measuring region of 3 μm square on the nanometer scale. Then, the obtained concavity and convexity analysis image was subjected to a flattening process including primary inclination correction, and then to two-dimensional fast Fourier transform processing. Thus, a Fourier-transformed image was obtained. FIG. 96 shows the obtained Fourier-transformed image. It was shown that the Fourier-transformed image showed a circular pattern substantially centered at an origin at which an absolute value of wavenumber was 0 μm$^{-1}$, and that the circular pattern was present within a region where an absolute value of wavenumber was within a range of less than 2 μm$^{-1}$. In addition, the average value (m) of the depth distribution, the median (M) of the depth distribution, the standard deviation (σ), and the kurtosis (k) were determined on the basis of the obtained height data at the measuring points by use of the same methods as described above, respectively. Table 1 shows the results of the average value (m), the median (M), the standard deviation (σ), and the kurtosis (k). Note that FIG. 97 shows a graph of the depth distribution.

Figure 98:
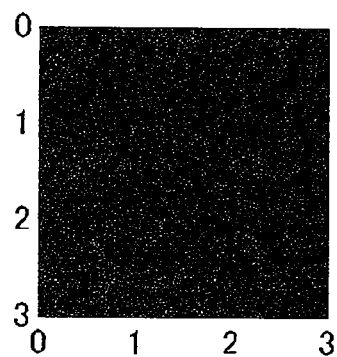
FIG. 98 is a photograph showing an image which shows the relationship of the distance between a transparent electrode and a metal electrode determined from a result of analysis conducted on the surface of the diffraction grating obtained in Example 34 by use of the atomic force microscope.
Figure 99:
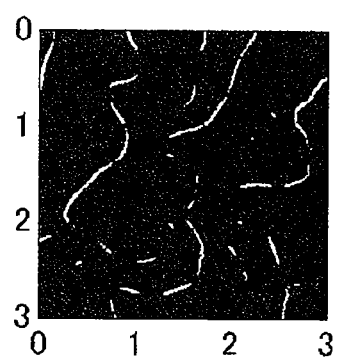
FIG. 99 is a photograph showing an image of leakage-current prone regions determined from the result of analysis conducted on the surface of the diffraction grating obtained in Example 34 by use of the atomic force microscope.
Figure 100:
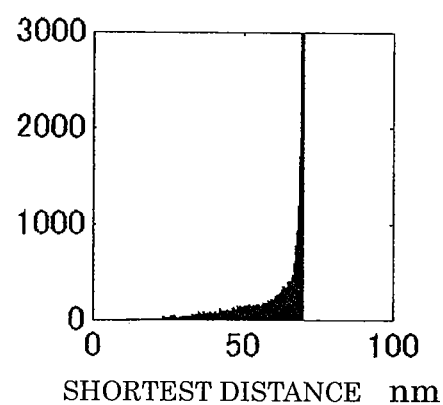
FIG. 100 is a graph showing the distribution of shortest distance determined from the result of analysis conducted on the surface of the diffraction grating obtained in Example 34 by use of the atomic force microscope.

In addition, the ratio of the presence of leakage-current prone regions was determined on the basis of the concavity and convexity analysis image (SPM image) by the same method as that employed in Example 23. FIG. 98 shows an image expressing the distance between the transparent electrode and the metal electrode on a gray scale (in FIG. 98, sites with long distances are expressed in bright colors (while), and sites with short distances are expressed in dark colors (black)). FIG. 99 shows an image concerning the leakage-current prone regions (in FIG. 99, white regions are leakage current prone regions). FIG. 100 shows a graph of the distribution of the shortest distances. As a result of the measurement, the ratio of the presence of leakage-current prone regions was 2.5%.

Example 35

A block copolymer solution was obtained by dissolving 100 mg of Block Copolymer (P-2) and 50 mg of polyethylene oxide in 10 g of toluene, followed by filtration through a membrane filter having a pore diameter of 0.50 μm. The obtained block copolymer solution was spin coated onto a polyphenylene sulfide film (manufactured by Toray Industries, Inc.) serving as a base member at a spin speed of 800 rpm, and then the coating film was subjected to an annealing treatment in an oven of 170° C. for 8 hours. Thus, First Master Block (M-69A) having concavities and convexities formed on a surface thereof due to micro phase separation was obtained. The thickness of the coating film made of Block Copolymer (P-2) in the thus obtained Master Block (M-69A) was measured by use of a step measuring instrument (manufactured by Kosaka Seisakusho under the product name of "SURF-COATER ET-4000A"). As a result, the thickness of the coating film was 100 nm.

Next, the coating film of the obtained Master Block (M-69A) was irradiated with ultraviolet rays in an accumulated light amount of 12 J/cm² by use of a high pressure mercury lamp, then immersed in acetone, and rinsed with ion-exchanged water. Thus, First Master Block (M-70A) subjected to an etching treatment by which PMMA was selectively removed was obtained.

Then, a silicone-based polymer [a resin composition of a mixture of 90% by mass of a silicone rubber (manufactured by Wacker Chemie AG under the product name of "Elastosil RT601") and 10% by mass of a curing agent] was applied onto Master Block (M-70A) by a dropping method, then cured by being heated at 50° C. for 1 hour, and thereafter detached from Master Block (M-70A). Thus, Master Block (M-71A) was obtained.

Figure 101:
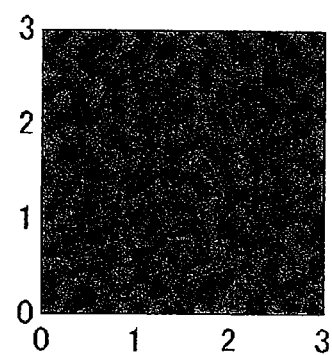
FIG. 101 is a photograph showing a concavity and convexity analysis image, in which a result of analysis conducted on a surface of a diffraction grating obtained in Example 35 by use of an atomic force microscope is displayed on a display.
Figure 102:
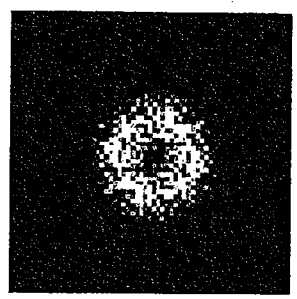
FIG. 102 is a photograph showing a Fourier-transformed image, in which a result of two-dimensional fast Fourier transform processing conducted on the concavity and convexity analysis image, which was obtained by use of the atomic force microscope, of the surface of the diffraction grating obtained in Example 35 is displayed on a display.
Figure 103:
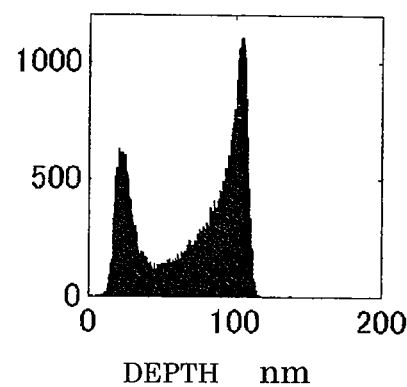
FIG. 103 is a photograph showing a graph of the depth distribution of the concavities and convexities on the surface of the diffraction grating obtained in Example 35.

A diffraction grating was manufactured and an organic EL element was obtained in the same manner as in Example 20, except that the thus obtained Master Block (M-71A) was used instead of Master Block (M-42A) of Example 20. Note that a concavity and convexity analysis image was obtained by analyzing the shape of the concavities and convexities formed on the surface of the cured resin layer of the thus obtained diffraction grating by use of an atomic force microscope (a scanning probe microscope equipped with an environment control unit "Nanonavi II Station/E-sweep" manufactured by SII NanoTechnology Inc.). FIG. 101 shows the obtained concavity and convexity analysis image. Note that, for this analysis, height data were measured at 65536 (256 columns×256 rows) measuring points in a measuring region of 3 μm square on the nanometer scale. Then, the obtained concavity and convexity analysis image was subjected to a flattening process including secondary inclination correction, and then to two-dimensional fast Fourier transform processing. Thus, a Fourier-transformed image was obtained. FIG. 102 shows the obtained Fourier-transformed image. It was shown that the Fourier-transformed image showed a circular pattern substantially centered at an origin at which an absolute value of wavenumber was 0 μm⁻¹, and that the circular pattern was present within a region where an absolute value of wavenumber was within a range of 10 μm⁻¹ or less. In addition, the average value (m) of the depth distribution, the median (M) of the depth distribution, the standard deviation (σ), and the kurtosis (k) were determined on the basis of the obtained height data at the measuring points by use of the same methods as described above, respectively. Table 1 shows the results of the average value (m), the median (M), the standard deviation (σ), and the kurtosis (k). Note that FIG. 103 shows a graph of the depth distribution.

Figure 104:
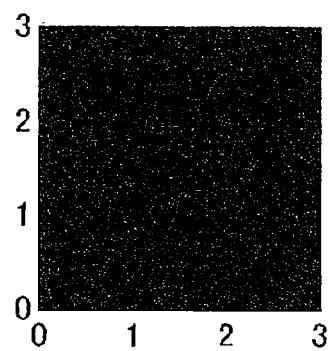
FIG. 104 is a photograph showing an image which shows the relationship of the distance between a transparent electrode and a metal electrode determined from the result of analysis conducted on the surface of the diffraction grating obtained in Example 35 by use of the atomic force microscope.
Figure 105:
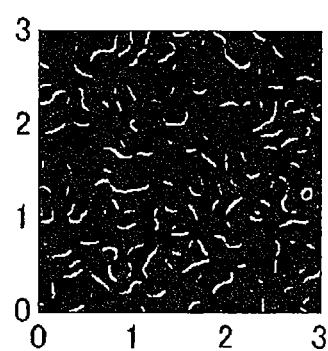
FIG. 105 is a photograph showing an image of leakage-current prone regions determined from the result of analysis conducted on the surface of the diffraction grating obtained in Example 35 by use of the atomic force microscope.
Figure 106:
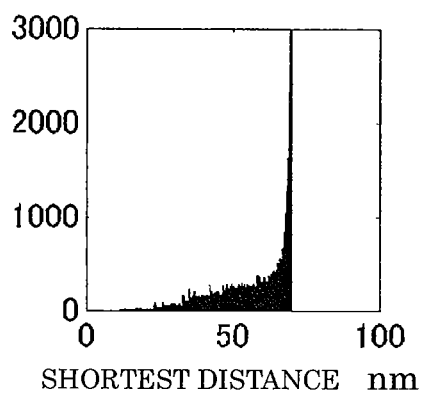
FIG. 106 is a graph showing the distribution of shortest distance determined from the result of analysis conducted on the surface of the diffraction grating obtained in Example 35 by use of the atomic force microscope.

In addition, the ratio of the presence of leakage-current prone regions was determined on the basis of the concavity and convexity analysis image (SPM image) by the same method as that employed in Example 23. FIG. 104 shows an image expressing the shortest distance. FIG. 105 shows an image concerning the leakage-current prone regions (in FIG. 105, white regions are leakage-current prone regions). FIG. 106 shows a graph of the distribution of the shortest distances. As a result of the measurement, the ratio of the presence of leakage-current prone regions was 5.1%.

TABLE 1

| Example | Average value (m) | Median (M) | Standard deviation (σ) | Kurtosis |
|---|---|---|---|---|
| Example 20 | 68.4 | 71.4 | 18.6 | 0.2 |
| Example 21 | 27.0 | 27.4 | 6.0 | 0.9 |
| Example 22 | 43.3 | 44.2 | 11.1 | 0.4 |
| Example 23 | 42.9 | 44.3 | 13.3 | −0.2 |
| Example 24 | 61.9 | 64.3 | 19.7 | −0.3 |
| Example 25 | 45.0 | 44.4 | 15.7 | −0.7 |
| Example 26 | 51.8 | 53.0 | 21.0 | −1.0 |
| Example 27 | 62.7 | 62.8 | 19.4 | −0.4 |
| Example 28 | 59.9 | 60.8 | 24.0 | −0.9 |
| Example 29 | 77.5 | 80.1 | 28.6 | −1.0 |
| Example 30 | 64.2 | 65.2 | 20.5 | −0.7 |
| Example 31 | 55.2 | 55.2 | 19.2 | −0.8 |
| Example 32 | 18.0 | 17.2 | 7.6 | −1.1 |
| Example 33 | 59.1 | 74.0 | 28.5 | −1.3 |
| Example 34 | 74.5 | 62.6 | 52.4 | −1.8 |
| Example 35 | 72.7 | 84.9 | 32.3 | −1.3 |

<Evaluation of Performances of Organic EL Elements Obtained in Examples 20 to 35 and Comparative Example 6>

(vii) Evaluation of Wavelength-Dependence and Directivity

The wavelength-dependence and the directivity were measured by employing the same methods as the above-described methods used to measure the wavelength-dependence and the directivity of the organic EL element obtained in Example 1 (the methods employed for the above-described (i) Evaluation of Wavelength-Dependence and the above-described (ii) Evaluation of Directivity), except that the organic EL elements obtained in Examples 20 to 35 and Comparative Example 6 were used. As a result of the measurement, it was found that each of the organic EL elements obtained in Examples 20 to 35 had a wavelength-dependence of light emission and a directivity which were sufficiently lower than those of the organic EL element obtained in Comparative Example 6.

(viii) Capability of Preventing Leakage Current

Capabilities of preventing leakage current of the organic EL element obtained in Examples 20 to 35 were evaluated as follows. Specifically, first, while a voltage was applied to each of the organic EL elements, an applied voltage (V) and a density (A/cm²) of a current flowing through the organic EL element were measured with a measuring instrument (manufactured by Keithley Instruments Inc., model No: 2400), and a light emission luminance (L) was measured with a luminance meter (manufactured by Konica Minolta Sensing, Inc., under the product name of "LS-100"). On the basis of the obtained current-voltage-luminance characteristics, the presence or absence of generation of a leakage current was evaluated by making comparison as to the relationship between the current and the luminance at the same voltage. As a result of the measurement, it was found that the organic EL elements obtained in Examples 20 to 32 were capable of sufficiently preventing the generation of a leakage current, in comparison with the organic EL elements obtained in Examples 33 to 35. As is apparent from Table 1, the value of the kurtosis of the organic EL element obtained in each of Examples 33 to 35 was −1.3 or less, whereas the value of the kurtosis of the organic EL element obtained in each of Examples 20 to 32 was −1.2 or more. In view of this, it can be understood that the generation of a leakage current can be suppressed at an advanced level by making the value of kurtosis −1.2 or greater. In addition, in each of the organic EL elements obtained in Examples 23 to 32 in which the kurtosis was within a range from −1.2 to 0.0, both inclusive, the generation of a leakage current was suppressed at a further advanced level. In addition, the ratio of the presence of the "leakage-current prone regions" referred herein was 0% in each of the organic EL elements obtained in Examples 23 and 28. Hence, it was found that such a structural characteristic made it possible to sufficiently suppress the generation of a leakage current at a further advanced level.

Figure 107:
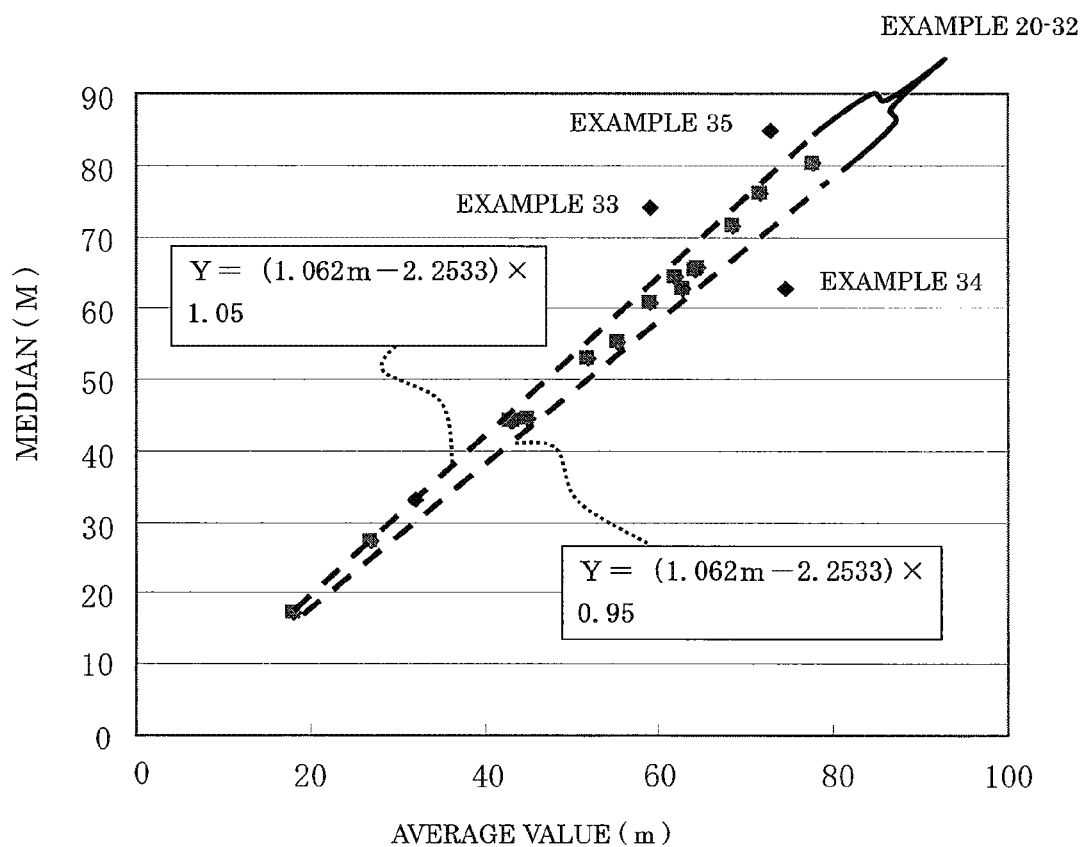
FIG. 107 is a graph showing the relationship between the average value (m) and the median (M) of the depth distribution of the concavities and convexities in cured resin layers of diffraction gratings obtained in Examples 20 to 35.

In addition, FIG. 107 shows a graph showing the relationship between the average value (m) and the median (M) of the organic EL elements obtained in Examples 20 to 35. As is apparent from the graph, the organic EL elements (Example 20 to 32) each comprising a diffraction grating comprising a cured resin layer satisfying the condition represented by the above-described inequality (1) were capable of suppressing the generation of a leakage current at a further advanced level.

(ix) Evaluation of Light Emission Efficiency

The light emission efficiency of each of the organic EL elements obtained in Examples 20 to 32 and Comparative Example 6 was determined as follows. Specifically, the current efficiency and the power efficiency of each of the organic EL elements were calculated by employing the same method as the above-described method used to determine the light emission efficiency of the organic EL element obtained in Example 1 (the method employed for the above-described (iii) Evaluation of Light Emission Efficiency), except that the organic EL elements obtained in Examples 20 to 32 and Comparative Example 6 were used. The light emission efficiency (power efficiency) of the organic EL element obtained in each of Examples 20 to 32 was determined, while the power efficiency of the organic EL element (Comparative Example 6) having no concavities and convexities at a light emission luminance of 2000 cd/m² was taken as a reference value (unit). Table 2 shows the obtained results.

TABLE 2

|  | Light extraction efficiency (Power efficiency) |
|---|---|
| Example 20 | 1.6 |
| Example 21 | 1.4 |
| Example 22 | 1.4 |
| Example 23 | 1.9 |
| Example 24 | 1.5 |
| Example 25 | 1.8 |
| Example 26 | 1.9 |
| Example 27 | 2.5 |
| Example 28 | 2.7 |
| Example 29 | 2.2 |
| Example 30 | 2.1 |
| Example 31 | 2.0 |
| Example 32 | 0.9 |
| Comparative Example 6 | 1.0 |

As is apparent from the results shown in Table 2 and from the results of the evaluation of the wavelength-dependence and the directivity, it was shown that each of the organic EL elements of the present invention had a sufficiently low wavelength-dependence of light emission and a sufficiently low directivity of light emission, and also had a sufficiently high power efficiency. As described above, it has been found that the organic EL element of the present invention has a sufficiently high light emission efficiency, and also has a sufficiently high level of external extraction efficiency.

INDUSTRIAL APPLICABILITY

As described above, according to the present invention, it is possible to provide a diffraction grating having a sufficiently low wavelength-dependence and a sufficiently low directivity, and also to provide an organic EL element using the diffraction grating, and methods for manufacturing the diffraction grating and the organic EL element.

The invention claimed is:

1. A diffraction grating comprising:
   a transparent supporting substrate; and
   a cured resin layer which is stacked on the transparent supporting substrate and which has concavities and convexities formed on a surface thereof, wherein
   when a Fourier-transformed image is obtained by performing two-dimensional fast Fourier transform processing on a concavity and convexity analysis image obtained by analyzing a shape of the concavities and convexities formed on the surface of the cured resin layer by use of an atomic force microscope, the Fourier-transformed image shows a circular or annular pattern substantially centered at an origin at which an absolute value of wavenumber is 0 $\mu m^{-1}$, and the circular or annular pattern is present within a region where an absolute value of wavenumber is within a range of 10 $\mu m^{-1}$ or less.

2. The diffraction grating according to claim 1, wherein the pattern is an annular pattern, and
   the annular pattern is present within a region where the absolute value of wavenumber is within a range from 1.25 to 5 $\mu m^{-1}$.

3. The diffraction grating according to claim 1, wherein an average height of the concavities and convexities formed on the surface of the cured resin layer is within a range from 20 to 200 nm.

4. The diffraction grating according to claim 1, wherein an average pitch of the concavities and convexities formed on the surface of the cured resin layer is within a range from 100 to 600 nm.

5. The diffraction grating according to claim 1, wherein an average value and a median of a depth distribution of the concavities and convexities formed on the surface of the cured resin layer satisfy a condition represented by the following inequality (1):

$$0.95 \times Y \leq M \leq 1.05 \times Y \quad (1)$$

wherein in the inequality (1), Y represents a value obtained by calculation according to a formula: Y=1.062 m−2.2533 (in the formula, m represents the average value of the depth distribution of the concavities and convexities), and M represents the median of the depth distribution of the concavities and convexities.

6. The diffraction grating according to claim 1, wherein a kurtosis of the concavities and convexities formed on the surface of the cured resin layer has a value of −1.2 or greater.

7. The diffraction grating according to claim 1, wherein a kurtosis of the concavities and convexities formed on the surface of the cured resin layer has a value within a range from −1.2 to 1.2.

8. A method for manufacturing a diffraction grating, comprising:
   a step of applying a curable resin onto a transparent supporting substrate, then curing the curable resin with a master block being pressed thereto, and thereafter detaching the master block, thereby stacking, on the transparent supporting substrate, a cured resin layer having concavities and convexities formed thereon, wherein the master block is obtained by any of the following methods (A) and (B) for manufacturing a master block:

(A) the method (A) for manufacturing a master block comprising the steps of:
applying a block copolymer solution comprising a block copolymer and a solvent onto a base member, the block copolymer having a first polymer segment made of a first homopolymer and a second polymer segment made of a second homopolymer having a solubility parameter which is higher than a solubility parameter of the first homopolymer by 0.1 to 10 $(cal/cm^3)^{1/2}$, and satisfying all the following conditions (i) to (iii):
(i) a number average molecular weight is 500000 or more,
(ii) a molecular weight distribution (Mw/Mn) is 1.5 or less, and
(iii) a volume ratio between the first polymer segment and the second polymer segment (the first polymer segment:the second polymer segment) is 3:7 to 7:3; and
forming a micro phase separation structure of the block copolymer by drying a coating film on the base member, thereby obtaining a first master block having concavities and convexities formed on a surface thereof; and
(B) the method (B) for manufacturing a master block comprising the steps of:
a method comprising the steps of:
forming a vapor-deposition film under a temperature condition of 70° C. or above on a surface of a polymer film made of a polymer whose volume changes by heat, and then cooling the polymer film and the vapor-deposition film, thereby forming concavities and convexities of wrinkles on a surface of the vapor-deposition film; and
attaching a master block material onto the vapor-deposition film, then curing the master block material, and thereafter detaching the cured master block material from the vapor-deposition film, thereby obtaining a master block.

9. The method for manufacturing a diffraction grating according to claim 8, wherein
in the step of obtaining the first master block in the method (A) for manufacturing a master block, the dried coating film is heated at a temperature higher than a glass transition temperature of the block copolymer.

10. The method for manufacturing a diffraction grating according to claim 8, wherein
in the step of obtaining the first master block in the method (A) for manufacturing a master block, the dried coating film is subjected to an etching treatment.

11. The method for manufacturing a diffraction grating according to claim 8, wherein
the method (A) for manufacturing a master block further comprises a step of attaching a transfer material onto the first master block, then curing the transfer material, and thereafter detaching the transfer material from the first master block, thereby obtaining a second master block having concavities and convexities formed on a surface thereof.

12. The method for manufacturing a diffraction grating according to claim 8, wherein
a combination of the first homopolymer and the second homopolymer in the block copolymer used in the method (A) for manufacturing a master block is any of a combination of a styrene-based polymer and a polyalkyl methacrylate, a combination of a styrene-based polymer and polyethylene oxide, a combination of a styrene-based polymer and polyisoprene, and a combination of a styrene-based polymer and polybutadiene.

13. The method for manufacturing a diffraction grating according to claim 8, wherein
the block copolymer solution used in the method (A) for manufacturing a master block further comprises a different homopolymer from the first homopolymer and the second homopolymer in the block copolymer.

14. The method for manufacturing a diffraction grating according to claim 13, wherein
a combination of the first homopolymer and the second homopolymer in the block copolymer is a combination of polystyrene and polymethyl methacrylate, and
the different homopolymer is a polyalkylene oxide.

15. The method for manufacturing a diffraction grating according to claim 8, wherein
the polymer whose volume changes by heat used in the method (B) for manufacturing a master block is a silicone-based polymer.

16. The method for manufacturing a diffraction grating according to claim 8, wherein
an average pitch of the concavities and convexities formed on the surface of the cured resin layer is within a range from 100 to 600 nm.

17. An organic EL element comprising:
a transparent supporting substrate;
a cured resin layer which is stacked on the transparent supporting substrate and which has concavities and convexities formed on a surface thereof; and
a transparent electrode, an organic layer, and a metal electrode, which are stacked in this order on the cured resin layer and formed into such shapes that a shape of the concavities and convexities formed on the surface of the cured resin layer is maintained, wherein
a constituent portion formed by the transparent supporting substrate and the cured resin layer in the organic EL element comprises the diffraction grating according to claim 1.

18. A method for manufacturing an organic EL element, the organic EL element comprising a transparent supporting substrate, a transparent electrode, an organic layer, and a metal electrode,
the method comprising:
a diffraction grating formation step comprising a step of applying a curable resin onto a transparent supporting substrate, then curing the curable resin with a master block being pressed thereto, and thereafter detaching the master block, thereby stacking, on the transparent supporting substrate, a cured resin layer having concavities and convexities formed thereon; and
a step of stacking, on the cured resin layer, each of the transparent electrode, the organic layer, and the metal electrode formed into such a shape that a shape of the concavities and convexities formed on the surface of the cured resin layer is maintained, thereby obtaining an organic EL element, wherein
the diffraction grating formation step is the method for manufacturing a diffraction grating according to claim 8.

* * * * *

UNITED STATES PATENT AND TRADEMARK OFFICE
CERTIFICATE OF CORRECTION

PATENT NO. : 8,541,778 B2  
APPLICATION NO. : 13/384551  
DATED : September 24, 2013  
INVENTOR(S) : Takashi Seki et al.

Page 1 of 1

It is certified that error appears in the above-identified patent and that said Letters Patent is hereby corrected as shown below:

On the title page item [73] one of the assignees has been omitted from the original Letters Patent, please add: Tokyo Institute of Technology Tokyo (JP)

Signed and Sealed this  
Sixteenth Day of June, 2015

Michelle K. Lee  
*Director of the United States Patent and Trademark Office*